(12) United States Patent
Han et al.

(10) Patent No.: US 12,367,815 B2
(45) Date of Patent: Jul. 22, 2025

(54) DISPLAY SUBSTRATE AND DISPLAY DEVICE

(71) Applicant: BOE TECHNOLOGY GROUP CO., LTD., Beijing (CN)

(72) Inventors: Ying Han, Beijing (CN); Pan Xu, Beijing (CN); Xing Zhang, Beijing (CN); Chengyuan Luo, Beijing (CN); Guangshuang Lv, Beijing (CN); Donghui Zhao, Beijing (CN); Cheng Xu, Beijing (CN)

(73) Assignee: BOE TECHNOLOGY GROUP CO., LTD., Bejing (CN)

( * ) Notice: Subject to any disclaimer, the term of this patent is extended or adjusted under 35 U.S.C. 154(b) by 0 days.

(21) Appl. No.: 18/576,548

(22) PCT Filed: Dec. 23, 2022

(86) PCT No.: PCT/CN2022/141496
§ 371 (c)(1),
(2) Date: Jan. 4, 2024

(87) PCT Pub. No.: WO2024/130708
PCT Pub. Date: Jun. 27, 2024

(65) Prior Publication Data
US 2025/0095547 A1 Mar. 20, 2025

(51) Int. Cl.
*G09G 3/32* (2016.01)
*G09G 3/3233* (2016.01)

(52) U.S. Cl.
CPC ............. *G09G 3/32* (2013.01); *G09G 3/3233* (2013.01); *G09G 2310/08* (2013.01); *G09G 2320/0233* (2013.01)

(58) Field of Classification Search
CPC .... G09G 3/32; G09G 3/3233; G09G 2310/08; G09G 2320/0233
See application file for complete search history.

(56) References Cited

U.S. PATENT DOCUMENTS 9,881,983 B2 1/2018 Her et al.
10,861,916 B2 * 12/2020 Liu ...................... H10K 59/121
(Continued)

FOREIGN PATENT DOCUMENTS

CN 104078001 A 10/2014
CN 109004012 A 12/2018
(Continued)

OTHER PUBLICATIONS

International Search Report in PCT/CN2022/141496 in Chinese dated Aug. 18, 2023.
(Continued)

*Primary Examiner* — Vinh T Lam
(74) *Attorney, Agent, or Firm* — Collard & Roe, P.C.

(57) ABSTRACT

Provided are a display substrate and a display device. The display substrate includes a base substrate and a plurality of sub-pixels, the sub-pixel includes a pixel circuit and a light-emitting element, the pixel circuit is configured to drive the light-emitting element, and the light-emitting element includes a first electrode, a second electrode, and a light-emitting functional layer located therebetween; the pixel circuit includes a driving transistor, and the first electrode of the light-emitting element is electrically connected to a first electrode of the driving transistor; the plurality of sub-pixels include a first sub-pixel and a second sub-pixel, the first sub-pixel is adjacent to the second sub-pixel, and an orthographic projection of the first electrode of the light-emitting element of the first sub-pixel on the base substrate does not overlap an orthographic projection of the pixel circuit of the second sub-pixel on the base substrate.

20 Claims, 38 Drawing Sheets

(56) References Cited

U.S. PATENT DOCUMENTS

| | | | |
|---|---|---|---|
| 10,930,726 B2* | 2/2021 | Wang | H10K 59/125 |
| 11,250,788 B2* | 2/2022 | Wang | H10D 86/60 |
| 11,270,646 B2* | 3/2022 | Zhang | G09G 3/3208 |
| 11,322,087 B1 | 5/2022 | Beard et al. | |
| 11,362,155 B2* | 6/2022 | Cui | H10K 59/131 |
| 11,367,396 B2* | 6/2022 | Li | G09G 3/3258 |
| 11,380,259 B2* | 7/2022 | Gai | G09G 3/3266 |
| 11,437,440 B2* | 9/2022 | Yuan | H10K 59/126 |
| 11,563,073 B2* | 1/2023 | Li | H01L 21/77 |
| 11,574,595 B2* | 2/2023 | Zhang | G09G 3/3258 |
| 11,620,942 B2 | 4/2023 | Yang et al. | |
| 11,844,253 B2* | 12/2023 | Feng | H10K 59/8794 |
| 11,875,752 B2* | 1/2024 | Yang | H10D 86/481 |
| 11,886,084 B2* | 1/2024 | Zhang | G02F 1/136218 |
| 11,900,875 B2* | 2/2024 | Chen | G09G 3/3677 |
| 11,908,410 B2* | 2/2024 | Liu | H10K 59/123 |
| 11,961,471 B2* | 4/2024 | Du | G09G 3/3241 |
| 11,974,462 B2* | 4/2024 | Wang | H10K 59/1213 |
| 11,997,892 B2* | 5/2024 | Wang | G09G 3/3233 |
| 12,166,045 B2* | 12/2024 | Wang | H10D 86/441 |
| 12,190,801 B2* | 1/2025 | Cheng | H10K 71/621 |
| 12,193,297 B2* | 1/2025 | Wu | H10K 59/131 |
| 12,211,438 B2* | 1/2025 | Li | H10K 59/131 |
| 12,217,672 B2* | 2/2025 | Huang | G09G 3/3233 |
| 2007/0152920 A1 | 7/2007 | Yamashita et al. | |
| 2008/0074363 A1 | 3/2008 | Yamashita et al. | |
| 2014/0284570 A1 | 9/2014 | Jinta et al. | |
| 2016/0351119 A1 | 12/2016 | Ono | |
| 2019/0172895 A1 | 6/2019 | Liu | |
| 2021/0043707 A1 | 2/2021 | Park et al. | |
| 2021/0056894 A1* | 2/2021 | Yang | G09G 3/2014 |
| 2021/0193049 A1 | 6/2021 | Lin et al. | |
| 2022/0006062 A1* | 1/2022 | Li | H10K 59/8792 |
| 2022/0013610 A1* | 1/2022 | Li | H10K 59/1216 |
| 2022/0019123 A1 | 1/2022 | Falek et al. | |
| 2022/0173200 A1 | 6/2022 | Ueno | |
| 2022/0320214 A1* | 10/2022 | Qu | H10K 59/1216 |
| 2023/0122296 A1 | 4/2023 | Song et al. | |
| 2023/0200144 A1* | 6/2023 | Wang | H10K 59/122 257/71 |
| 2023/0337465 A1 | 10/2023 | Huang et al. | |
| 2024/0107829 A1* | 3/2024 | Du | H10K 59/131 |
| 2024/0119897 A1* | 4/2024 | Zhang | H10K 59/131 |
| 2024/0144873 A1 | 5/2024 | Huang | H10K 59/131 |
| 2024/0147792 A1* | 5/2024 | Liao | H10K 59/131 |
| 2024/0215344 A1* | 6/2024 | Feng | H10K 59/131 |
| 2024/0215366 A1* | 6/2024 | Liu | G09G 3/3233 |
| 2024/0251602 A1* | 7/2024 | Xu | H10K 59/122 |
| 2024/0276768 A1* | 8/2024 | Liu | H10K 59/1201 |
| 2024/0349550 A1* | 10/2024 | Fang | H10K 50/81 |
| 2024/0365587 A1* | 10/2024 | Cao | G09G 3/3233 |

FOREIGN PATENT DOCUMENTS

| | | |
|---|---|---|
| CN | 109147665 A | 1/2019 |
| CN | 110010072 A | 7/2019 |
| CN | 112117320 A | 12/2020 |
| CN | 112349247 A | 2/2021 |
| CN | 113362750 A | 9/2021 |
| CN | 113838421 A | 12/2021 |
| CN | 114843329 A | 8/2022 |
| CN | 114974120 A | 8/2022 |
| JP | 2004287345 A | 10/2004 |
| WO | 2022174420 A | 8/2022 |

OTHER PUBLICATIONS

Written Opinion of the International Searching Authority in PCT/CN2022/141496 in Chinese dated Aug. 18, 2023.

U.S. Office Action in U.S. Appl. No. 18/576,254 dated Jan. 15, 2025.

Extended European Search Report in European Application No. 22968994.8 dated Apr. 24, 2025.

* cited by examiner

DISPLAY SUBSTRATE AND DISPLAY DEVICE

CROSS REFERENCE TO RELATED APPLICATIONS

This application is the National Stage of PCT/CN2022/141496 filed on Dec. 23, 2022, the disclosure of which is incorporated by reference.

TECHNICAL FIELD

Embodiments of the present disclosure relate to a display substrate and a display device.

BACKGROUND

At present, in medium-sized and large-sized organic light-emitting diode (OLED) display products, N-metal-oxide-semiconductor (N-MOS) internal compensation circuits are more and more extensively used, and internal compensation has advantages such as a low driving system cost and high integration compared with external compensation; however, internal compensation pixel circuits are more complicated than external compensation, and it is difficult to achieve high pixels per inch (PPI).

SUMMARY

Embodiments of the present disclosure provide a display substrate and a display device.

On the one hand, embodiments of the present disclosure provide a display substrate, including a base substrate and a plurality of sub-pixels located on the base substrate, the sub-pixel includes a pixel circuit and a light-emitting element, the light-emitting element is electrically connected to the pixel circuit, the pixel circuit is configured to drive the light-emitting element, and the light-emitting element includes a first electrode, a second electrode, and a light-emitting functional layer located between the first electrode and the second electrode; the pixel circuit includes a driving transistor, and the first electrode of the light-emitting element is electrically connected to a first electrode of the driving transistor; the plurality of sub-pixels include a first sub-pixel and a second sub-pixel, the first sub-pixel is adjacent to the second sub-pixel, and an orthographic projection of the first electrode of the light-emitting element of the first sub-pixel on the base substrate does not overlap an orthographic projection of the pixel circuit of the second sub-pixel on the base substrate.

For example, the orthographic projection of the first electrode of the light-emitting element on the base substrate only covers an orthographic projection of the pixel circuit of its own sub-pixel on the base substrate.

For example, the display substrate further includes a data line, the data line is configured to provide a data signal to the pixel circuit, and the first sub-pixel and the second sub-pixel are arranged along an extending direction of the data line, an orthographic projection of the data line on the base substrate does not overlap the orthographic projection of the first electrode of the light-emitting element on the base substrate.

For example, the plurality of sub-pixels further include a third sub-pixel, the third sub-pixel is adjacent to the first sub-pixel, and the third sub-pixel, the first sub-pixel, and the second sub-pixel are arranged along the extending direction of the data line.

For example, the orthographic projection of the first electrode of the light-emitting element of the first sub-pixel on the base substrate does not overlap an orthographic projection of the pixel circuit of the third sub-pixel on the base substrate.

For example, the pixel circuit further includes a first capacitor, the first capacitor has a first electrode plate and a second electrode plate, the first electrode plate of the first capacitor is electrically connected to a gate electrode of the driving transistor, the second electrode plate of the first capacitor includes a first electrode plate part, the first electrode plate part is electrically connected to the first electrode of the driving transistor and connected to the first electrode of the light-emitting element, and the first electrode of the light-emitting element is electrically connected to the first electrode plate part of the first capacitor in the pixel circuit through a connection via hole.

For example, the display substrate further includes a passivation layer and a planarization layer, the connection via hole includes a first through hole located in the passivation layer and a second through hole located in the planarization layer, and an orthographic projection of the first through hole on the base substrate overlaps an orthographic projection of the second through hole on the base substrate.

For example, the orthographic projection of the first through hole on the base substrate falls within the orthographic projection of the second through hole on the base substrate.

For example, the driving transistor includes an active part, the gate electrode of the driving transistor extends in a first direction, the active part of the driving transistor extends in a second direction, the first direction intersects with the second direction, and a size of the first electrode plate part in the first direction at the connection via hole is less than a size of the second through hole in the first direction.

For example, a size of the first electrode plate part in the second direction at the connection via hole is greater than a size of the second through hole in the second direction.

For example, the display substrate further includes an initialization line, the pixel circuit further includes a first reset transistor, the first reset transistor is configured to reset the first electrode of the light-emitting element, a first electrode of the first reset transistor is connected to the initialization line, and the first electrode plate part of the first capacitor is connected to a second electrode of the first reset transistor through a first via hole.

For example, a size of the second through hole in the second direction is greater than a size of the first via hole in the second direction.

For example, the orthographic projection of the second through hole on the base substrate at least partially overlaps an orthographic projection of the first via hole on the base substrate.

For example, the orthographic projection of the second through hole on the base substrate covers the orthographic projection of the first via hole on the base substrate.

For example, the second electrode plate of the first capacitor further includes a second electrode plate part, the second electrode plate part is located on a side of the first electrode plate of the first capacitor close to the base substrate, the first electrode plate part is located on a side of the first electrode plate of the first capacitor away from the base substrate, the first electrode plate part of the second electrode plate is connected to the second electrode plate part and the first electrode of the driving transistor through the same composite via hole, respectively.

For example, the first electrode of the light-emitting element has first recesses at two opposite sides in the first direction at the connection via hole, respectively.

For example, a gate electrode of the first reset transistor is connected to a gate line, and a portion of the first electrode of the light-emitting element between the first via hole and the gate line has a second recess.

For example, the pixel circuit further includes a data writing transistor, a second reset transistor, and a light-emitting control transistor, the data writing transistor is configured to write a data signal into a gate electrode of the driving transistor in response to a first scan signal, the second reset transistor is configured to reset the gate electrode of the driving transistor, and the light-emitting control transistor is configured to transmit a first power supply voltage to a second electrode of the driving transistor in response to a light-emitting control signal.

For example, the display substrate further includes: an initialization line, a reference voltage line, a first power supply line, and a pixel-defining layer, the initialization line is configured to provide an initialization voltage to the sub-pixel, the reference voltage line is configured to provide a reference voltage to the sub-pixel, and the first power supply line is configured to provide a first power supply voltage to the sub-pixel, the initialization line includes an initialization signal line and an initialization connection line, the reference voltage line includes a reference voltage signal line and a reference voltage connection line, and the first power supply line includes a first power supply signal line and a first power supply connection line, the initialization connection line is connected to the initialization signal line, the reference voltage connection line is connected to the reference voltage signal line, and the first power supply connection line is connected to the first power supply signal line; the first power supply connection line, the reference voltage connection line, and the initialization connection line are arranged in a first direction, and each of the initialization connection line, the reference voltage connection line, and the first power supply connection line extends in a second direction; the pixel-defining layer has a plurality of openings, each of the plurality of openings is configured to expose at least a portion of the first electrode of the light-emitting element, the plurality of openings include a first opening, a second opening, and a third opening, an orthographic projection of the first opening on the base substrate overlaps an orthographic projection of the first power supply connection line on the base substrate, an orthographic projection of the second opening on the base substrate overlaps an orthographic projection of the reference voltage connection line on the base substrate, and an orthographic projection of the third opening on the base substrate overlaps an orthographic projection of the initialization connection line on the base substrate; and an area of the first opening is greater than an area of the third opening, the area of the third opening is greater than an area of the second opening, a width of the first power supply connection line is greater than a width of the initialization connection line, and the width of the initialization connection line is greater than a width of the reference voltage connection line.

Embodiments of the present disclosure further provide a display device, including any one of the display substrate as described above.

On the other hand, embodiments of the present disclosure provide a display substrate, including a plurality of sub-pixels, each of the sub-pixels includes a pixel circuit and a light-emitting element, the light-emitting element is electrically connected to the pixel circuit, the pixel circuit is configured to drive the light-emitting element, and the pixel circuit includes: a driving circuit, including a control terminal, a first terminal and a second terminal, the first terminal of the driving circuit being electrically connected to a first electrode of the light-emitting element; a light-emitting control circuit, electrically connected to the second terminal of the driving circuit and configured to transmit a first power supply voltage to the second terminal of the driving circuit in response to a light-emitting control signal; a data writing circuit, electrically connected to the control terminal of the driving circuit and configured to write a data signal into the control terminal of the driving circuit in response to a first scan signal; a first reset circuit, electrically connected to the control terminal of the driving circuit and configured to transmit a reference voltage to the control terminal of the driving circuit in response to a second scan signal; a second reset circuit, electrically connected to the first electrode of the light-emitting element and configured to transmit an initialization voltage to the first electrode of the light-emitting element in response to a third scan signal; a first storage circuit, a first terminal of the first storage circuit being electrically connected to the control terminal of the driving circuit, a second terminal of the first storage circuit being electrically connected to the first terminal of the driving circuit, and the first storage circuit being configured to store the data signal; and a second storage circuit, a first terminal of the second storage circuit being electrically connected to the first electrode of the light-emitting element and a second terminal of the second storage circuit being electrically connected to a second electrode of the light-emitting element.

For example, the display substrate further includes: an initialization line, a reference voltage line, and a first power supply line, the initialization line is configured to provide the initialization voltage, the reference voltage line is configured to provide the reference voltage, and the first power supply line is configured to provide the first power supply voltage, the initialization line includes an initialization signal line, the reference voltage line includes a reference voltage signal line, and the first power supply line includes a first power supply signal line, each of the initialization signal line, the reference voltage signal line, and the first power supply signal line extends in a first direction, and the initialization signal line, the reference voltage signal line, and the first power supply signal line are arranged in a second direction, the first direction intersects with the second direction.

For example, the initialization line further includes an initialization connection line, the reference voltage line further includes a reference voltage connection line, and the first power supply line further includes a first power supply connection line, the initialization connection line is connected to the initialization signal line, the reference voltage connection line is connected to the reference voltage signal line, and the first power supply connection line is connected to the first power supply signal line.

For example, each of the initialization connection line, the reference voltage connection line, and the first power supply connection line extends in the second direction, and the first power supply connection line, the reference voltage connection line, and the initialization connection line are arranged in the first direction.

For example, the display substrate further includes a pixel-defining layer, the pixel-defining layer includes a plurality of openings, each of the plurality of openings is configured to expose at least a portion of the first electrode, the plurality of openings include a first opening, a second opening, and a third opening, an orthographic projection of the first opening on the base substrate overlaps an orthographic projection of the first power supply connection line on the base substrate, an orthographic projection of the second opening on the base substrate overlaps an orthographic projection of the reference voltage connection line on the base substrate, and an orthographic projection of the third opening on the base substrate overlaps an orthographic projection of the initialization connection line on the base substrate.

For example, an area of the first opening is greater than an area of the third opening, the area of the third opening is greater than an area of the second opening, a width of the first power supply connection line is greater than a width of the initialization connection line, and the width of the initialization connection line is greater than a width of the reference voltage connection line.

For example, the display substrate further includes a data line, the data line is configured to provide a data signal to the pixel circuit, the plurality of sub-pixels include a first sub-pixel, a second sub-pixel and a third sub-pixel, the first sub-pixel has the first opening, the second sub-pixel has the second opening, the third sub-pixel has the third opening, the first power supply connection line, the data line of the first sub-pixel, the reference voltage connection line, the data line of the second sub-pixel, the initialization connection line, and the data line of the third sub-pixel are arranged sequentially in the first direction.

For example, the first sub-pixel, the second sub-pixel, and the third sub-pixel constitute a repeat unit, and the initialization signal line, the reference voltage signal line, and the first power supply signal line are shared by a plurality of repeat units.

Embodiments of the present disclosure further provide a display substrate, including a plurality of sub-pixels, each of the sub-pixels includes a pixel circuit and a light-emitting element, the light-emitting element is electrically connected to the pixel circuit, the pixel circuit is configured to drive the light-emitting element, and the pixel circuit includes: a driving circuit, a light-emitting control circuit, a data writing circuit, a first reset circuit, a second reset circuit, a first storage circuit, and a second storage circuit, the driving circuit includes a driving transistor, the light-emitting control circuit includes a light-emitting control transistor, the data writing circuit includes a data writing transistor, the first reset circuit includes a first reset transistor, the second reset circuit includes a second reset transistor, the first storage circuit includes a first capacitor, and the second storage circuit includes a second capacitor, a first electrode of the driving transistor is electrically connected to a first electrode of the light-emitting element; the light-emitting control transistor is electrically connected to a second electrode of the driving transistor and configured to transmit a first power supply voltage to the second electrode of the driving transistor in response to a light-emitting control signal; the data writing transistor is electrically connected to a gate electrode of the driving transistor and configured to write a data signal into the gate electrode of the driving transistor in response to a first scan signal; the first reset transistor is electrically connected to the gate electrode of the driving transistor and configured to transmit a reference voltage to the gate electrode of the driving transistor in response to a second scan signal; the second reset transistor is electrically connected to the first electrode of the light-emitting element and configured to transmit an initialization voltage to the first electrode of the light-emitting element in response to a third scan signal; a first electrode plate of the first capacitor is electrically connected to the gate electrode of the driving transistor, a second electrode plate of the first capacitor is electrically connected to the first electrode of the driving transistor, and the first capacitor is configured to store the data signal; and a first electrode plate of the second capacitor is electrically connected to the first electrode of the light-emitting element, and a second electrode plate of the second capacitor is electrically connected to a second electrode of the light-emitting element.

According to the display substrate provided by the embodiments of the present disclosure, the display substrate further includes a first conductive pattern layer, the first conductive pattern layer includes an initialization signal line, a reference voltage signal line, and a first power supply signal line, each of the initialization signal line, the reference voltage signal line, and the first power supply signal line extends in a first direction, and the initialization signal line, the reference voltage signal line, and the first power supply signal line are arranged in a second direction, the first direction intersects with the second direction.

According to the display substrate provided by the embodiments of the present disclosure, the display substrate further includes a second conductive pattern layer, the second conductive pattern layer includes a first gate line, a second gate line, a third gate line, the gate electrode of the driving transistor, and a light-emitting control line, and the third gate line, the second gate line, the gate electrode of the driving transistor, the first gate line, and the light-emitting control line are arranged in the second direction, and each of the third gate line, the second gate line, the gate electrode of the driving transistor, the first gate line, and the light-emitting control line extends in the first direction.

According to the display substrate provided by the embodiments of the present disclosure, the display substrate further includes a third conductive pattern layer, the third conductive pattern layer includes an initialization connection line, a reference voltage connection line, and a first power supply connection line, the initialization connection line is connected to the initialization signal line, the reference voltage connection line is connected to the reference voltage signal line, and the first power supply connection line is connected to the first power supply signal line, each of the initialization connection line, the reference voltage connection line, and the first power supply connection line extends in the second direction, and the first power supply connection line, the reference voltage connection line, and the initialization connection line are arranged in the first direction.

According to the display substrate provided by the embodiments of the present disclosure, the display substrate further includes a fourth conductive pattern layer and a pixel-defining layer, the fourth conductive pattern layer includes a plurality of first electrodes, and the pixel-defining layer is located on the fourth conductive pattern layer and includes a plurality of openings, each of the plurality of openings is configured to expose at least a portion of the first electrode, each of the plurality of openings includes a first opening, a second opening, and a third opening, an orthographic projection of the first opening on the base substrate overlaps an orthographic projection of the first power supply connection line on the base substrate, an orthographic projection of the second opening on the base substrate overlaps an orthographic projection of the reference voltage connection line on the base substrate, and an orthographic projection of the third opening on the base substrate overlaps an orthographic projection of the initialization connection line on the base substrate.

According to the display substrate provided by the embodiments of the present disclosure, an area of the first opening is greater than an area of the third opening, the area of the third opening is greater than an area of the second opening, a width of the first power supply connection line is greater than a width of the initialization connection line, and the width of the initialization connection line is greater than a width of the reference voltage connection line.

According to the display substrate provided by the embodiments of the present disclosure, the plurality of sub-pixels include a first sub-pixel, a second sub-pixel, and a third sub-pixel, an orthographic projection of the first electrode of the first sub-pixel on the base substrate overlaps the orthographic projection of the first power supply connection line on the base substrate, an orthographic projection of the first electrode of the second sub-pixel on the base substrate overlaps the orthographic projection of the reference voltage connection line on the base substrate, and an orthographic projection of the first electrode of the third sub-pixel on the base substrate overlaps the orthographic projection of the initialization connection line on the base substrate.

According to the display substrate provided by the embodiments of the present disclosure, an area of the first electrode of the first sub-pixel is greater than an area of the first electrode of the third sub-pixel, the area of the first electrode of the third sub-pixel is greater than an area of the first electrode of the second sub-pixel, a width of the first power supply connection line is greater than a width of the initialization connection line, and the width of the initialization connection line is greater than a width of the reference voltage connection line.

According to the display substrate provided by the embodiments of the present disclosure, the third conductive pattern layer includes a data line, and an orthographic projection of the data line on the base substrate does not overlap an orthographic projection of the first electrode on the base substrate.

According to the display substrate provided by the embodiments of the present disclosure, an active layer includes a first active part, a second active part, a third active part, a fourth active part, and a fifth active part, an orthographic projection of the first active part on the base substrate overlaps an orthographic projection of the first gate line on the base substrate, an orthographic projection of the second active part on the base substrate overlaps an orthographic projection of the second gate line on the base substrate, an orthographic projection of the third active part on the base substrate overlaps an orthographic projection of the third gate line on the base substrate, an orthographic projection of the fourth active part on the base substrate overlaps an orthographic projection of the light-emitting control line on the base substrate, and an orthographic projection of the fifth active part on the base substrate overlaps an orthographic projection of the gate electrode of the driving transistor on the base substrate, each of the first active part, the second active part, the third active part, the fourth active part, and the fifth active part extends in the second direction, and each of the first active part, the second active part, the third active part, the fourth active part, and the fifth active part includes a channel and a first electrode and a second electrode located on both sides of the channel.

According to the display substrate provided by the embodiments of the present disclosure, the active layer further includes a first electrode plate of the first capacitor, the gate electrode of the driving transistor is connected to the first electrode plate of the first capacitor, the first conductive pattern layer includes a second electrode plate part, the third conductive pattern layer includes a first electrode plate part, the first electrode plate part is connected to the second electrode plate part and the first electrode of the fifth active part through a first composite via hole, respectively, the first electrode plate part is connected to the second electrode of the third active part through a first via hole, and the first electrode plate part and the second electrode plate part constitute a second electrode plate of the first capacitor.

According to the display substrate provided by the embodiments of the present disclosure, the fourth conductive pattern layer further includes a first connection electrode, the first connection electrode is connected to the first electrode of the third active part and the initialization signal line through a second composite via hole, respectively, and the initialization connection line is connected to the first connection electrode.

According to the display substrate provided by the embodiments of the present disclosure, the fourth conductive pattern layer further includes a second connection electrode, the second connection electrode is connected to the first electrode of the second active part and the reference voltage signal line through a third composite via hole, respectively, and the reference voltage connection line is connected to the second connection electrode.

According to the display substrate provided by the embodiments of the present disclosure, the fourth conductive pattern layer further includes a third connection electrode, and the third connection electrode is connected to the gate electrode of the driving transistor, the second electrode of the first active part, the second electrode of the second active part, and the first electrode plate of the first capacitor through a second via hole, respectively.

According to the display substrate provided by the embodiments of the present disclosure, the fourth conductive pattern layer further includes a fourth connection electrode, the fourth connection electrode is connected to the first power supply signal line and the second electrode of the fourth active part through a fourth composite via hole, respectively, and the first power supply connection line is connected to the fourth connection electrode.

According to the display substrate provided by the embodiments of the present disclosure, the fourth conductive pattern layer further includes a fifth connection electrode, one end of the fifth connection electrode is connected to the second electrode of the fifth active part through a third via hole, and the other end of the fifth connection electrode is connected to the first electrode of the fourth active part through a fourth via hole.

According to the display substrate provided by the embodiments of the present disclosure, the third conductive pattern layer includes a data line, and the data line is connected to the first active part through a fifth via hole.

Embodiments of the present disclosure further provide a driving method of any one of the display substrates as described above, within a display time period of one frame, the driving method includes: a reset phase, a compensation phase, a data writing phase, and a light-emitting phase, in the reset phase, inputting the second scan signal to turn on the first reset circuit, and transmitting the reference voltage to the control terminal of the driving circuit through the first reset circuit so as to reset the control terminal of the driving circuit, and inputting the third scan signal to turn on the second reset circuit, and transmitting the initialization voltage to the first electrode of the light-emitting element through the second reset circuit so as to reset the first electrode of the light-emitting element; in the compensation phase, inputting the second scan signal and the light-emitting control signal, keeping the first reset circuit turned on, turning on the light-emitting control circuit and the driving circuit, and charging the first electrode plate of the second capacitor by the first power supply voltage so as to compensate the driving circuit; in the data writing phase, inputting the first scan signal to turn on the data writing circuit, and writing the data signal into the control terminal of the driving circuit; and in the light-emitting phase, inputting the light-emitting control signal to turn on the light-emitting control circuit and the driving circuit so as to generate a driving current, thereby driving the light-emitting element to emit light.

According to the driving method of the display substrate provided by the embodiments of the present disclosure, in the reset phase, the light-emitting control circuit is turned off.

According to the driving method of the display substrate provided by the embodiments of the present disclosure, in the compensation phase, the reference voltage is greater than a sum of a threshold voltage of the driving circuit and the initialization voltage.

According to the driving method of the display substrate provided by the embodiments of the present disclosure, the reference voltage is less than a turn-on voltage of the light-emitting element.

According to the driving method of the display substrate provided by the embodiments of the present disclosure, in the data writing phase, further inputting the light-emitting control signal to turn on the light-emitting control circuit so as to compensate the driving circuit.

According to the driving method of the display substrate provided by the embodiments of the present disclosure, in the light-emitting phase, the light-emitting control signal is greater than a sum of the first power supply voltage and a threshold voltage of the light-emitting control circuit.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not construed as any limitation to the present disclosure.

DETAILED DESCRIPTION

In order to make objectives, technical details and advantages of the embodiments of the present disclosure more clear, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected" and the like are not limited to a physical or mechanical connection, but further include an electrical connection, either directly or indirectly.

Figure 1:
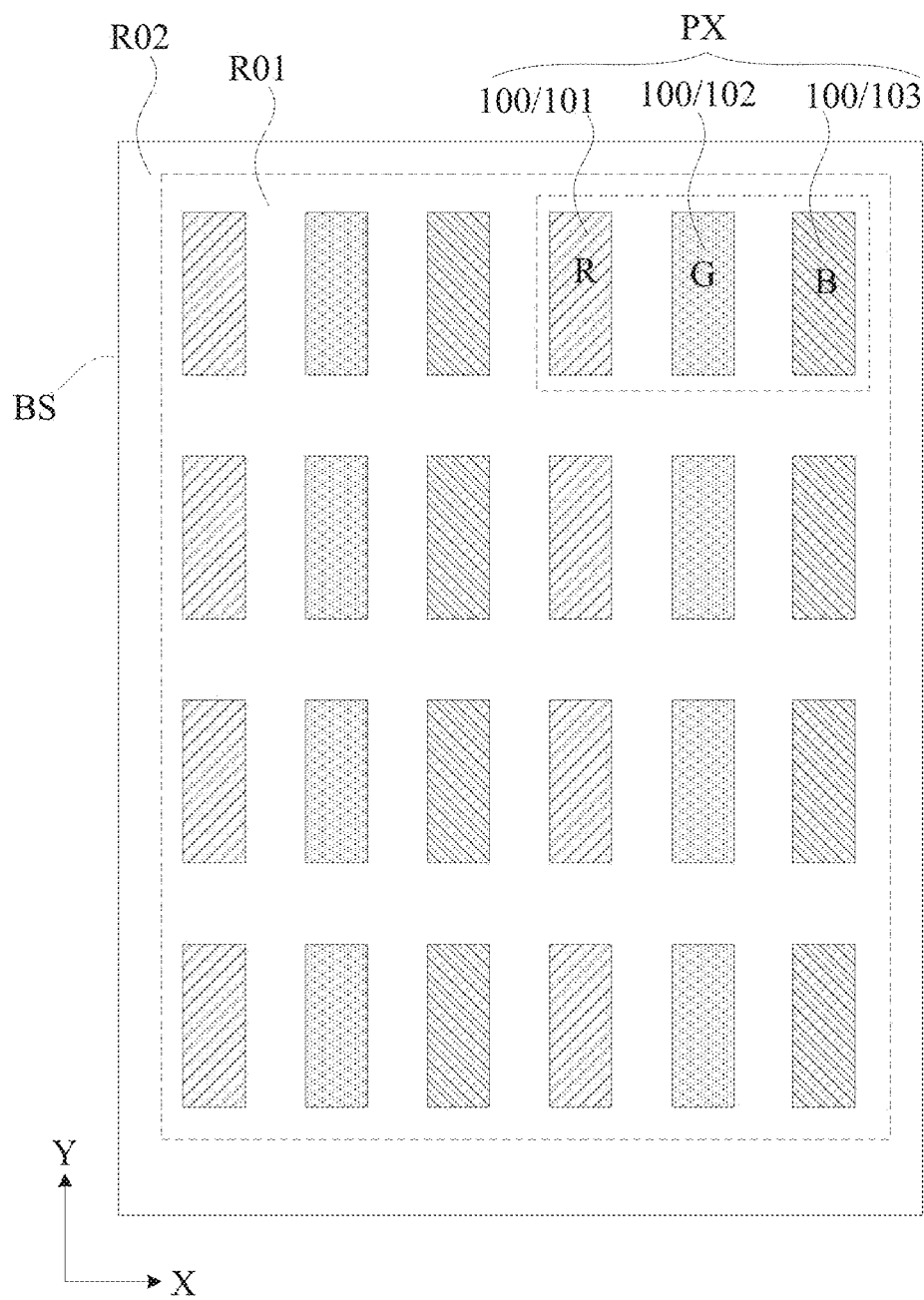
FIG. 1 is a schematic diagram of pixel arrangement of a display substrate.

FIG. 1 is a schematic diagram of pixel arrangement of a display substrate. As illustrated in FIG. 1, the display substrate includes a plurality of sub-pixels 100 located on a base substrate, and the plurality of sub-pixels 100 are arranged in an array. As illustrated in FIG. 1, the plurality of sub-pixels 100 are arranged in an array in a first direction X and a second direction Y. Embodiments of the present disclosure are described by taking as an example the plurality of sub-pixels 100 arranged in an array as illustrated in FIG. 1. However, the arrangement of the plurality of sub-pixels 100 is not limited to that illustrated in FIG. 1, and can be determined as required.

As illustrated in FIG. 1, the display substrate includes a plurality of pixels PX, and each pixel PX includes a plurality of sub-pixels 100. As illustrated in FIG. 1, the plurality of sub-pixels 100 include first sub-pixels 101, second sub-pixels 102, and third sub-pixels 103. As illustrated in FIG. 1, each pixel PX includes a first sub-pixel 101, a second sub-pixel 102, and a third sub-pixel 103. For example, the light-emitting colors of the first sub-pixel 101, the second sub-pixel 102, and the third sub-pixel 103 are different from each other. For example, as illustrated in FIG. 1, the sub-pixels in the same column are sub-pixels that emit light of the same color, and in the same row of sub-pixels, a plurality of pixels PX are arranged in sequence. Embodiments of the present disclosure are described by taking as an example that the first direction X is the row direction and the second direction Y is the column direction. In other embodiments, the first direction X may be a column direction, and the second direction Y may be a row direction.

Embodiments of the present disclosure are described by taking as an example that the first sub-pixel 101 is a red sub-pixel (R), the second sub-pixel 102 is a green sub-pixel (G), and the third sub-pixel 103 is a blue sub-pixel (B).

As illustrated in FIG. 1, the base substrate BS includes a display region R01 and a peripheral region R02 located on at least one side of the display region R01. FIG. 1 is illustrated by taking the peripheral region R02 surrounding the display region R01 as an example.

Figure 2:
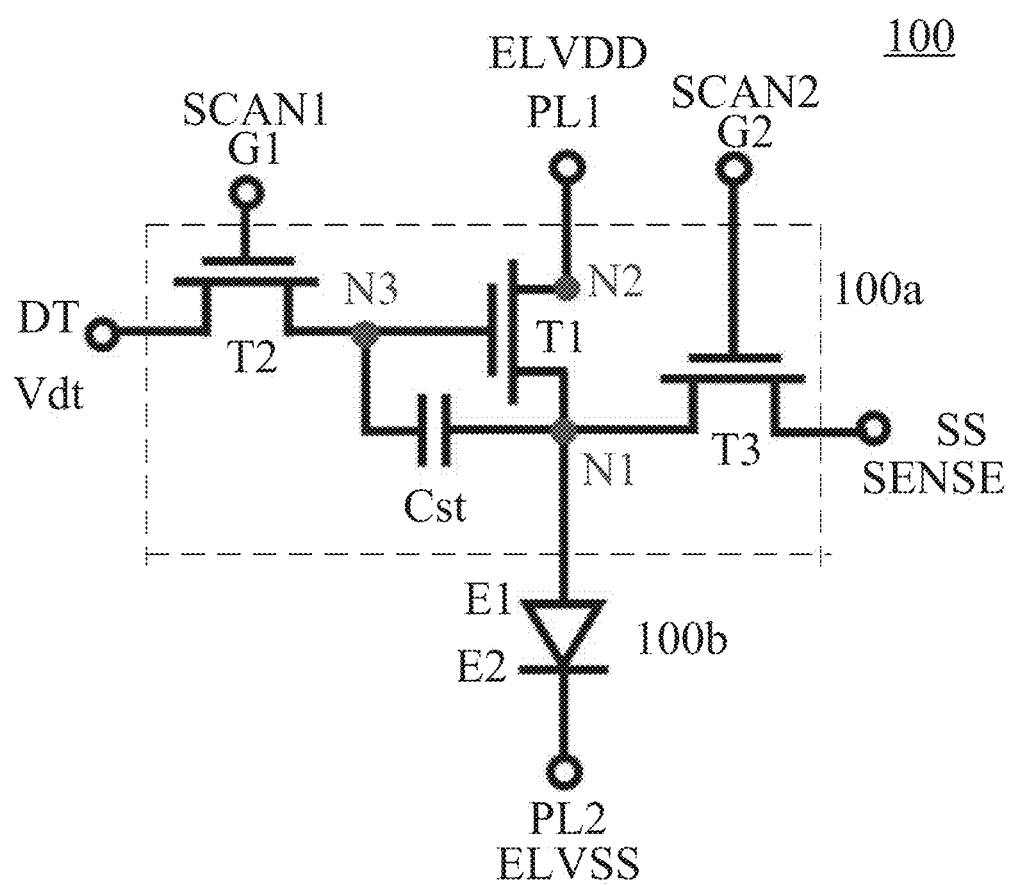
FIG. 2 is a schematic diagram of a 3T1C external compensation pixel circuit.

FIG. 2 is a schematic diagram of a 3T1C external compensation pixel circuit. As illustrated in FIG. 2, the sub-pixel 100 includes a pixel circuit 100a and a light-emitting element 100b, and the pixel circuit 100a includes a transistor T1, a transistor T2, a transistor T3, and a storage capacitor Cst.

As illustrated in FIG. 2, the gate electrode of the transistor T1 is connected to the node N3, the first electrode of the transistor T1 is connected to the node N1, and the second electrode of the transistor T1 is connected to the node N2. The first power supply line PL1 is connected to the node N2.

As illustrated in FIG. 2, the gate electrode of the transistor T2 is connected to the gate line G1, the first electrode of the transistor T2 is connected to the data line DT, and the second electrode of the transistor T2 is connected to the node N3.

As illustrated in FIG. 2, the light-emitting element 100b includes a first electrode E1 and a second electrode E2, the first electrode E1 is connected to the node N1, and the second electrode E2 is connected to the second power supply line PL2. For example, one of the first electrode E1 and the second electrode E2 is an anode, and the other of the first electrode E1 and the second electrode E2 is a cathode.

As illustrated in FIG. 2, one electrode plate of the storage capacitor Cst is connected to the node N3, and the other electrode plate of the storage capacitor Cst is connected to the node N1.

As illustrated in FIG. 2, the gate electrode of the transistor T3 is connected to the gate line G2, the first electrode of the transistor T3 is connected to the sensing line SS, and the second electrode of the transistor T3 is connected to the node N1.

As illustrated in FIG. 2, the data line DT is configured to provide the data signal (data voltage) Vdt to the pixel circuit 100a, the gate line G1 is configured to provide the scan signal SCAN1 to the pixel circuit 100a, the gate line G2 is configured to provide the scan signal SCAN2 to the pixel circuit 100a, the sensing line SS is configured to provide the sensing signal SENSE to the pixel circuit 100a, the first power supply line PL1 is configured to provide the first power supply voltage ELVDD to the pixel circuit 100a, and the second power supply line PL2 is configured to provide the second power supply voltage ELVSS to the pixel circuit 100a.

For the 3T1C external compensation pixel circuit illustrated in FIG. 2, the sensing line SS can be shared by several sub-pixels such as one red sub-pixel (R), one green sub-pixel (G), and one blue sub-pixel (B), or can be shared by two pixels such as six sub-pixels of RGBRGB. The same also applies to the first power supply line PL1 and the second power supply line PL2. That is, several sub-pixels share one first power supply line PL1 and/or several sub-pixels share one second power supply line PL2. Besides, the signal lines between sub-pixels may be slightly different. In the pixel circuit of 3T1C, except that the node N3 of the transistor T1 has a floating state, neither the node N1 nor the node N2 has a floating state, and thus noise only has a very small impact; moreover, the node N3 is isolated from other signals by an electrode plate of a capacitor, and thus is essentially not affected.

Embodiments of the present disclosure provide a display substrate and a driving method thereof, so as to avoid display defect and improve display effect.

Figure 3:
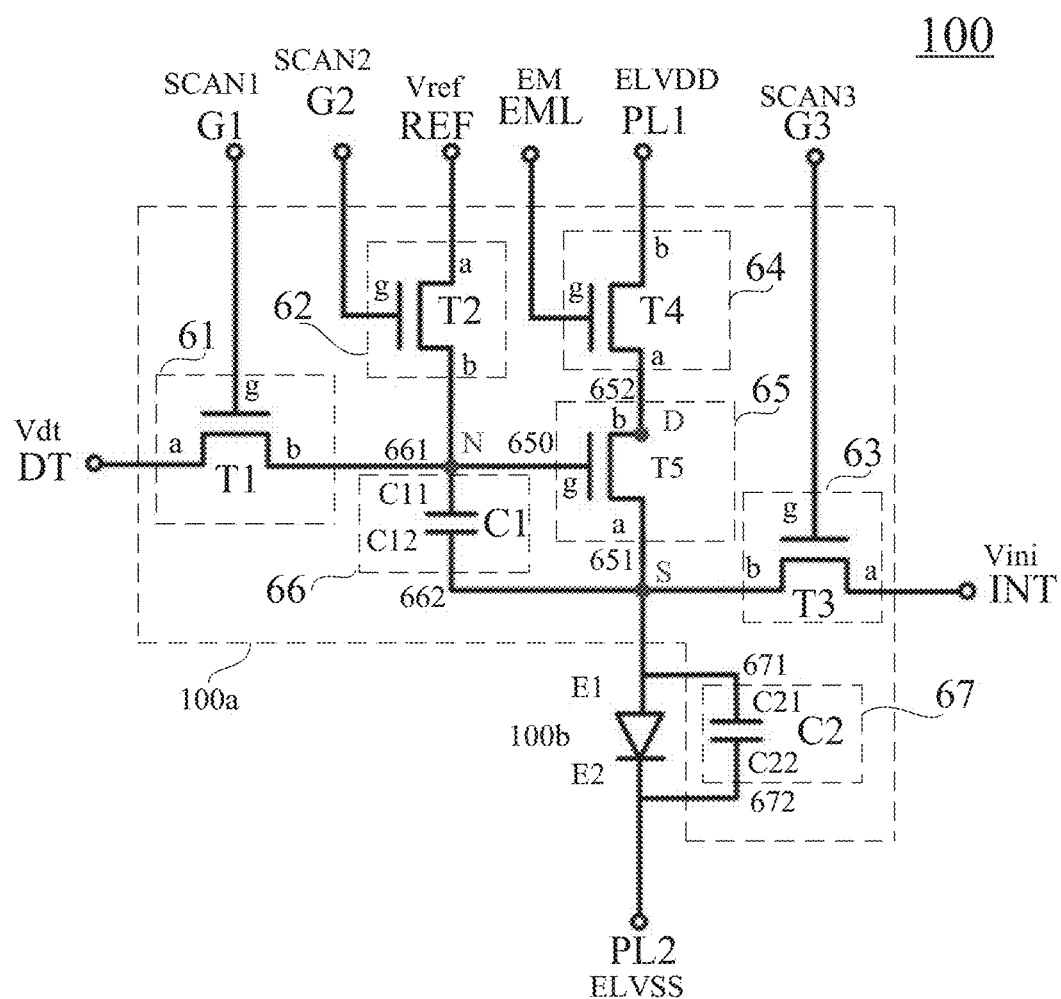
FIG. 3 is a circuit diagram of a sub-pixel in a display substrate provided by an embodiment of the present disclosure.

FIG. 3 is a circuit diagram of a sub-pixel in a display substrate provided by an embodiment of the present disclosure. The display substrate includes a plurality of sub-pixels 100. FIG. 3 illustrates a circuit diagram of a sub-pixel. As illustrated in FIG. 3, the sub-pixel 100 includes a pixel circuit 100a and a light-emitting element 100b, the light-emitting element 100b is electrically connected to the pixel circuit 100a, and the pixel circuit 100a is configured to drive the light-emitting element 100b. For example, the pixel arrangement illustrated in FIG. 1 refers to the arrangement position of the light-emitting region of the light-emitting element 100b in the sub-pixel 100. The light-emitting region of the light-emitting element 100b is an effective light-emitting region, for example, it may correspond to the opening region of the pixel-defining layer.

As illustrated in FIG. 3, the pixel circuit 100a includes: a driving circuit 65, a light-emitting control circuit 64, a data writing circuit 61, a first reset circuit 62, a second reset circuit 63, a first storage circuit 66, and a second storage circuit 67.

As illustrated in FIG. 3, the driving circuit 65 includes a control terminal 650, a first terminal 651, and a second terminal 652, and the first terminal 651 of the driving circuit 65 is electrically connected to the first electrode E1 of the light-emitting element 100b.

As illustrated in FIG. 3, the light-emitting control circuit 64 is electrically connected to the second terminal 652 of the driving circuit 65 and configured to transmit the first power supply voltage ELVDD to the second terminal 652 of the driving circuit 65 in response to the light-emitting control signal.

As illustrated in FIG. 3, the data writing circuit 61 is electrically connected to the control terminal 650 of the driving circuit 65 and configured to write the data signal Vdt into the control terminal 650 of the driving circuit 65 in response to the first scan signal SCAN1.

As illustrated in FIG. 3, the first reset circuit 62 is electrically connected to the control terminal 650 of the driving circuit 65 and configured to transmit the reference voltage Vref to the control terminal 650 of the driving circuit 65 in response to the second scan signal SCAN2.

As illustrated in FIG. 3, the second reset circuit 63 is electrically connected to the first electrode E1 of the light-emitting element 100b and configured to transmit the initialization voltage Vini to the first electrode E1 of the light-emitting element 100b in response to the third scan signal SCAN3.

As illustrated in FIG. 3, the first storage circuit 66 has a first terminal 661 and a second terminal 662, the first terminal 661 of the first storage circuit 66 is electrically connected to the control terminal 650 of the driving circuit 65, the second terminal 662 of the first storage circuit 66 is electrically connected to the first terminal 651 of the driving circuit 65, and the first storage circuit 66 is configured to store the data signal Vdt.

As illustrated in FIG. 3, the second storage circuit 67 has a first terminal 671 and a second terminal 672, the first terminal 671 of the second storage circuit 67 is electrically connected to the first electrode E1 of the light-emitting element 100b, and the second terminal 672 of the second storage circuit 67 is electrically connected to the second electrode E2 of the light-emitting element 100b.

For example, as illustrated in FIG. 3, the display substrate further includes: an initialization line INT, a reference voltage line REF, and a first power supply line PL1. The initialization line INT is configured to provide the initialization voltage Vini to the pixel circuit 100a, the reference voltage line REF is configured to provide the reference voltage Vref to the pixel circuit 100a, and the first power supply line PL1 is configured to provide the first power supply voltage ELVDD to the pixel circuit 100a.

For example, as illustrated in FIG. 3, the display substrate further includes a second power supply line PL2 configured to provide the second power supply voltage ELVSS to the sub-pixel 100.

For example, the first power supply voltage ELVDD is a fixed voltage, that is, a direct current (DC) signal.

For example, the second power supply voltage ELVSS is a fixed voltage, that is, a DC signal.

For example, the initialization voltage Vini is between the first power supply voltage ELVDD and the second power supply voltage ELVSS, but not limited thereto. For example, the initialization voltage Vini is a fixed voltage. That is, the initialization voltage Vini is a DC signal.

For example, the reference voltage Vref is between the first power supply voltage ELVDD and the second power supply voltage ELVSS, but not limited thereto. For example, the reference voltage Vref is a fixed voltage. That is, the reference voltage Vref is a DC signal.

For example, in some embodiments, the first power supply voltage ELVDD is about 10V, the second power supply voltage ELVSS can be ground voltage, the second power supply voltage ELVSS is about 0V, the reference voltage Vref is about 2V, and the initialization voltage Vini can be between −4V and −5V. Of course, the above numerical values are examples and can be determined as required.

Referring to FIG. 1 and FIG. 3, embodiments of the present disclosure provide a display substrate, including a plurality of sub-pixels 100, each of the sub-pixels 100 includes a pixel circuit 100a and a light-emitting element 100b, the light-emitting element 100b is electrically connected to the pixel circuit 100a, and the pixel circuit 100a is configured to drive the light-emitting element 100b.

As illustrated in FIG. 3, the pixel circuit 100a includes: a driving transistor T5, a light-emitting control transistor T4, a data writing transistor T1, a reset transistor T2, a reset transistor T3, a first capacitor C1, and a second capacitor C2.

As illustrated in FIG. 3, the first electrode of the driving transistor T5 is electrically connected to the first electrode E1 of the light-emitting element 100b.

As illustrated in FIG. 3, the light-emitting control transistor T4 is electrically connected to the second electrode of the driving transistor T5 and configured to transmit the first power supply voltage ELVDD to the second electrode of the driving transistor T5 in response to the light-emitting control signal.

As illustrated in FIG. 3, the data writing transistor T1 is electrically connected to the gate electrode of the driving transistor T5 and configured to write the data signal Vdt into the gate electrode of the driving transistor T5 in response to the first scan signal SCAN1.

As illustrated in FIG. 3, the reset transistor T2 is electrically connected to the gate electrode of the driving transistor T5 and configured to transmit the reference voltage Vref to the gate electrode of the driving transistor T5 in response to the second scan signal SCAN2.

As illustrated in FIG. 3, the reset transistor T3 is electrically connected to the first electrode E1 of the light-emitting element 100b and configured to transmit the initialization voltage Vini to the first electrode E1 of the light-emitting element 100b in response to the third scan signal SCAN3.

As illustrated in FIG. 3, the first electrode plate C11 of the first capacitor C1 is electrically connected to the gate electrode of the driving transistor T5, the second electrode plate C12 of the first capacitor C1 is electrically connected to the first electrode of the driving transistor T5, and the first capacitor C1 is configured to store the data signal Vdt.

As illustrated in FIG. 3, the first electrode plate C21 of the second capacitor C2 is electrically connected to the first electrode E1 of the light-emitting element 100b, and the second electrode plate C22 of the second capacitor C2 is electrically connected to the second electrode E2 of the light-emitting element 100b. For example, the first electrode E1 of the light-emitting element 100b can be used as the first electrode plate C21, and the second electrode E2 of the light-emitting element 100b can be used as the second electrode plate C22.

As illustrated in FIG. 3, the second power supply line PL2 is connected to the second electrode E2 of the light-emitting element 100b.

As illustrated in FIG. 3, the display substrate further includes a first gate line G1, a second gate line G2, and a third gate line G3. The first gate line G1 is configured to provide the first scan signal SCAN1 to the pixel circuit 100a, the second gate line G2 is configured to provide the second scan signal SCAN2 to the pixel circuit 100a, and the third gate line G3 is configured to provide the third scan signal SCAN3 to the pixel circuit 100a.

As illustrated in FIG. 3, the display substrate further includes a light-emitting control line EML configured to provide the light-emitting control signal EM to the pixel circuit 100a.

As illustrated in FIG. 3, the display substrate further includes a data line DT configured to provide the data signal Vdt to the pixel circuit 100a. For example, sub-pixels can display different gray scales according to different data signals.

As illustrated in FIG. 3, the driving transistor T5 is electrically connected to the light-emitting element 100b, and outputs a driving current under the control of the first scan signal SCAN1, the second scan signal SCAN2, the third scan signal SCAN3, the light-emitting control signal EM, the data signal Vdt, the first power supply voltage ELVDD, the second power supply voltage ELVSS and other signals so as to drive the light-emitting element 100b to emit light.

For example, the light-emitting element 100b includes an organic light-emitting diode (OLED), but is not limited thereto. For example, the light-emitting element 100b emits red light, green light, blue light, or white light under the driving of the corresponding pixel circuit 100a.

As illustrated in FIG. 3, the gate electrode of the driving transistor T5, the first electrode plate C11 of the first capacitor C1, the second electrode of the data writing transistor T1, and the second electrode of the reset transistor T2 are all connected to each other, that is, connected to the node N.

As illustrated in FIG. 3, the second electrode of the driving transistor T5 and the first electrode of the light-emitting control transistor T4 are connected to each other, that is, both are connected to the node D.

As illustrated in FIG. 3, the first electrode of the driving transistor TS, the second electrode plate C12 of the first capacitor C1, the second electrode of the reset transistor T3, the first electrode E1 of the light-emitting element 100b, and the first electrode plate C21 of the second capacitor C2 are all connected to each other, that is, connected to the node S. There are many components connected to the node S, and current leakage may be easily caused, thus making the voltage of the node S unstable. Providing the second capacitor C2 can stabilize the voltage of the node S and make the driving current more accurate.

As illustrated in FIG. 3, the first electrode of the data writing transistor T1 is connected to the data line DT, and the gate electrode of the data writing transistor T1 is connected to the first gate line G1.

As illustrated in FIG. 3, the first electrode of the reset transistor T2 is connected to the reference voltage line REF, and the gate electrode of the reset transistor T2 is connected to the second gate line G2.

As illustrated in FIG. 3, the first electrode of the reset transistor T3 is connected to the initialization line INT, and the gate electrode of the reset transistor T3 is connected to the third gate line G3.

As illustrated in FIG. 3, the second electrode of the light-emitting control transistor T4 is connected to the first power supply line PL1, and the gate electrode of the light-emitting control transistor T4 is connected to the light-emitting control line EML.

As illustrated in FIG. 3, the second electrode plate C22 of the second capacitor C2 is connected to the second power supply line PL2.

As illustrated in FIG. 3, the second electrode E2 of the light-emitting element 100b is connected to the second power supply line PL2.

As illustrated in FIG. 3, the driving circuit 65 includes a driving transistor TS, the gate electrode of the driving transistor T5 may correspond to the control terminal of the driving circuit 65, and the first electrode and the second electrode of the driving transistor T5 may correspond to the first terminal and the second terminal of the driving circuit 65, respectively.

As illustrated in FIG. 3, the light-emitting control circuit 64 includes a light-emitting control transistor T4, the gate electrode of the light-emitting control transistor T4 may correspond to the control terminal of the light-emitting control circuit 64, and the first electrode and the second electrode of the light-emitting control transistor T4 may correspond to the first terminal and the second terminal of the light-emitting control circuit 64, respectively.

As illustrated in FIG. 3, the data writing circuit 61 includes a data writing transistor T1, the gate electrode of the data writing transistor T1 may correspond to the control terminal of the data writing circuit 61, and the first electrode and the second electrode of the data writing transistor T1 may correspond to the first terminal and the second terminal of the data writing circuit 61, respectively.

As illustrated in FIG. 3, the first reset circuit 62 includes a reset transistor T2, the gate electrode of the reset transistor T2 may correspond to the control terminal of the first reset circuit 62, and the first electrode and the second electrode of the reset transistor T2 may correspond to the first terminal and the second terminal of the first reset circuit 62, respectively.

As illustrated in FIG. 3, the second reset circuit 63 includes a reset transistor T3, the gate electrode of the reset transistor T3 may correspond to the control terminal of the second reset circuit 63, and the first electrode and the second electrode of the reset transistor T3 may correspond to the first terminal and the second terminal of the second reset circuit 63, respectively.

As illustrated in FIG. 3, the first terminal 661 and the second terminal 662 of the first storage circuit 66 may correspond to the first electrode plate C11 and the second electrode plate C12 of the first capacitor C1, respectively.

As illustrated in FIG. 3, the first terminal 671 and the second terminal 672 of the second storage circuit 67 may correspond to the first electrode plate C21 and the second electrode plate C22 of the second capacitor C2, respectively.

For each transistor, in FIG. 3, "g" represents the gate electrode of the transistor, "a" represents the first electrode of the transistor, and "b" represents the second electrode of the transistor.

It should be noted that the transistors used in one embodiment of the present disclosure may all be thin film transistors or field effect transistors or other switching devices having the same characteristics. The source electrode and the drain electrode of the transistor used here may be symmetrical in structure. Thus, there may be no difference in structure between the source electrode and the drain electrode. In one embodiment of the present disclosure, in order to distinguish the two electrodes other than the gate electrode of the transistor, it is directly described that one electrode is a first electrode and the other electrode is a second electrode. Thus, the first electrodes and the second electrodes of all or some of the transistors in the embodiments of the present disclosure are interchangeable as required. For example, the first electrode of the transistor described in the embodiments of the present disclosure may be a source electrode, and the second electrode may be a drain electrode; or the first electrode of the transistor may be a drain electrode, and the second electrode may be a source electrode.

In addition, transistors can be divided into N-type and P-type transistors according to their different characteristics. Embodiments of the present disclosure are described by taking as an example that N-type transistors (N-MOS) are used as transistors. Based on the description and teaching of this implementation in the present disclosure, those skilled in the art can, without creative work, easily think of using P-type transistors for at least some of the transistors in the pixel circuit structure of the embodiments of the present disclosure, that is, implementation by using P-type transistors, or combinations of N-type transistors and P-type transistors. Therefore, these implementations are also within the protection scope of the present disclosure.

Embodiments of the present disclosure are described by taking as an example that the transistor are N-type transistors.

The pixel circuit in the display substrate illustrated in FIG. 3 is an internal compensation circuit of 5T2C. The gate electrode (node N), second electrode (node D), and first electrode (node S) of the driving transistor T5 all have floating time. Thus, it is necessary to prevent noise from affecting at least one of the node N, the node D, and the node S so as to avoid display defect (for example, Mura), thereby improving the display effect. The embodiments of the present disclosure are described by taking the pixel circuit of 5T2C as an example, but the embodiments of the present disclosure are not limited thereto, and the structure of the pixel circuit can be determined as required. For example, in some embodiments, the light-emitting control transistor T4 may not be provided.

Figure 4:
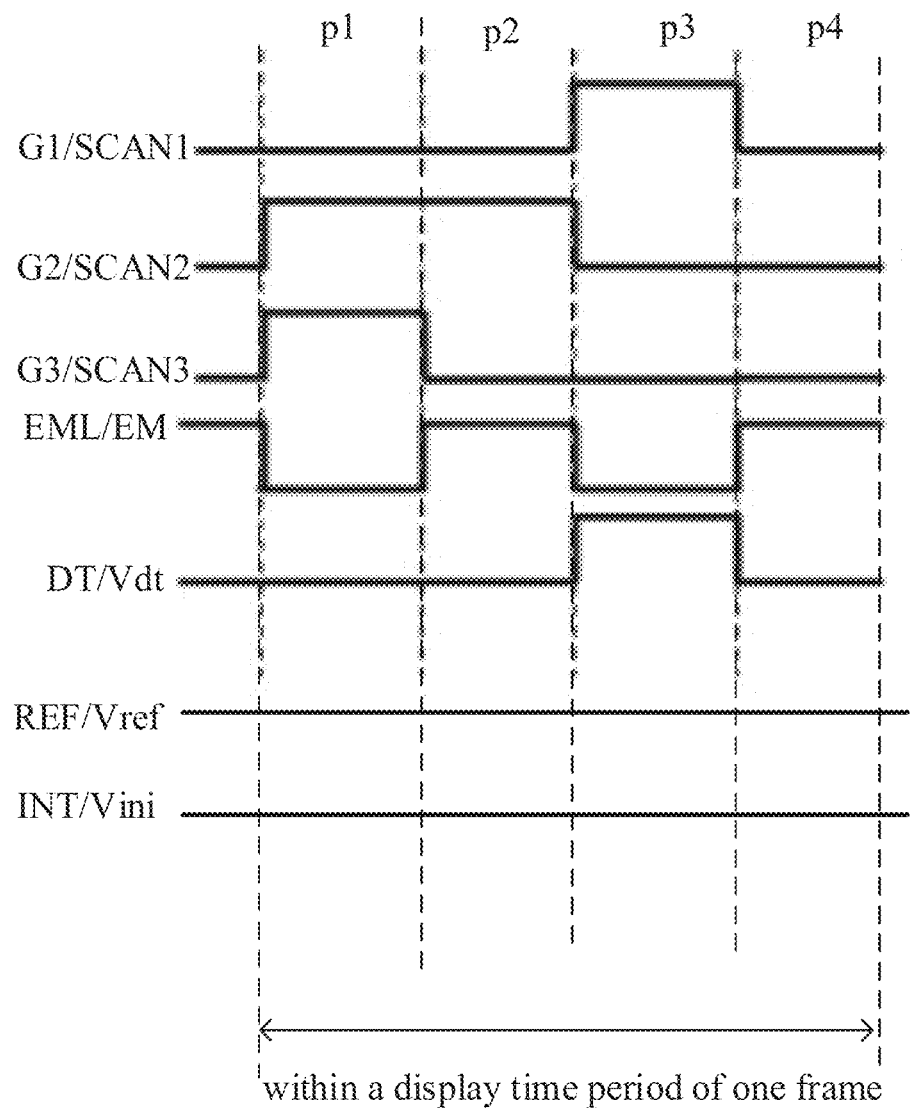
FIG. 4 is a timing signal diagram of a sub-pixel of a display substrate provided by an embodiment of the present disclosure.
Figure 5:
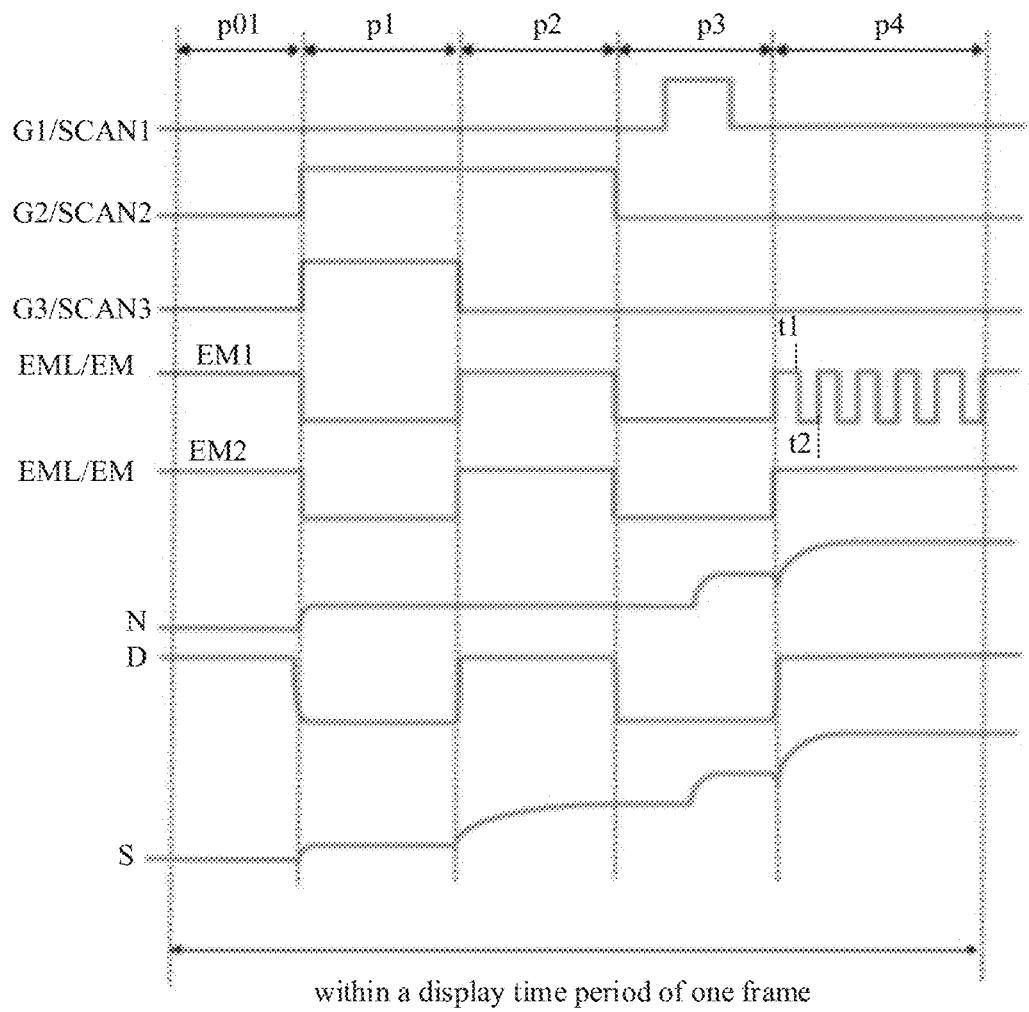
FIG. 5 is a timing signal diagram of a sub-pixel of a display substrate provided by an embodiment of the present disclosure.
Figure 6:
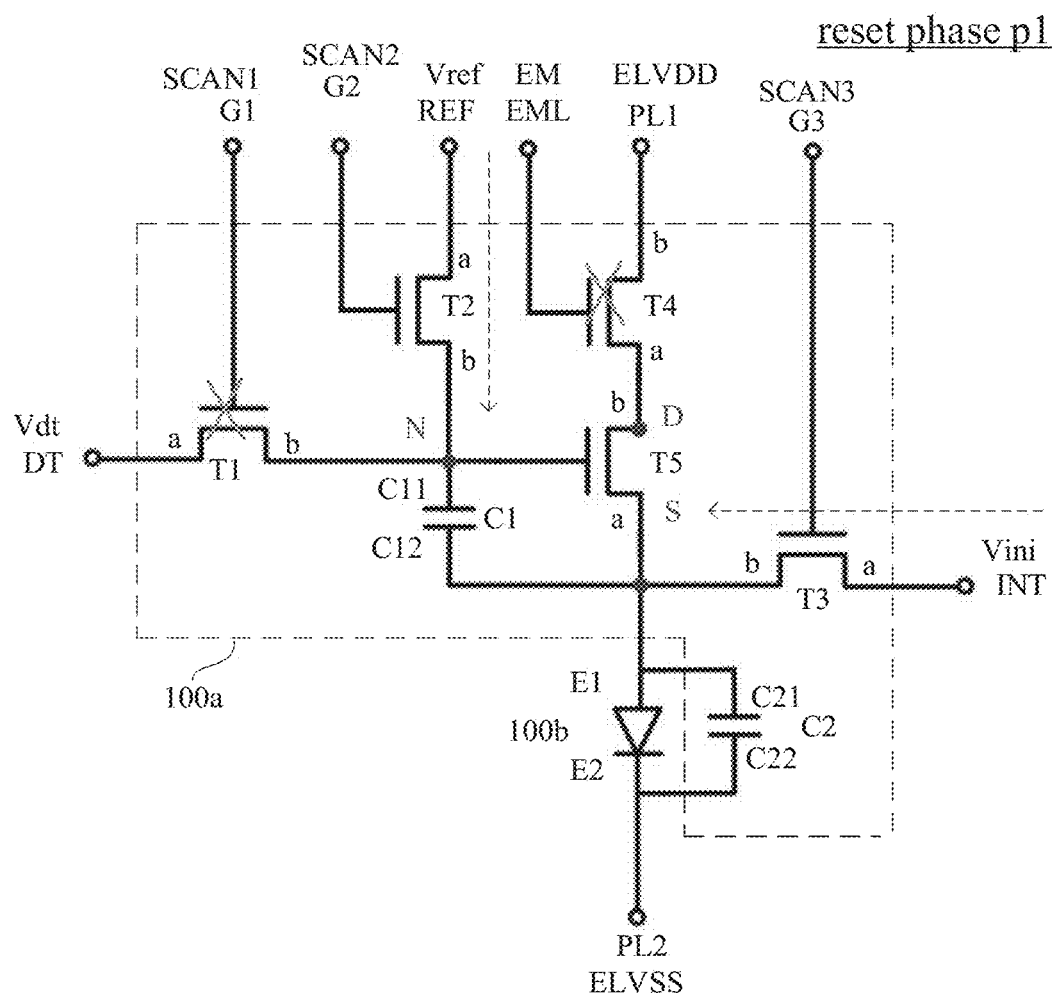
FIG. 6 is a schematic diagram showing on and off of transistors of a display substrate in a reset phase provided by an embodiment of the present disclosure.
Figure 7:
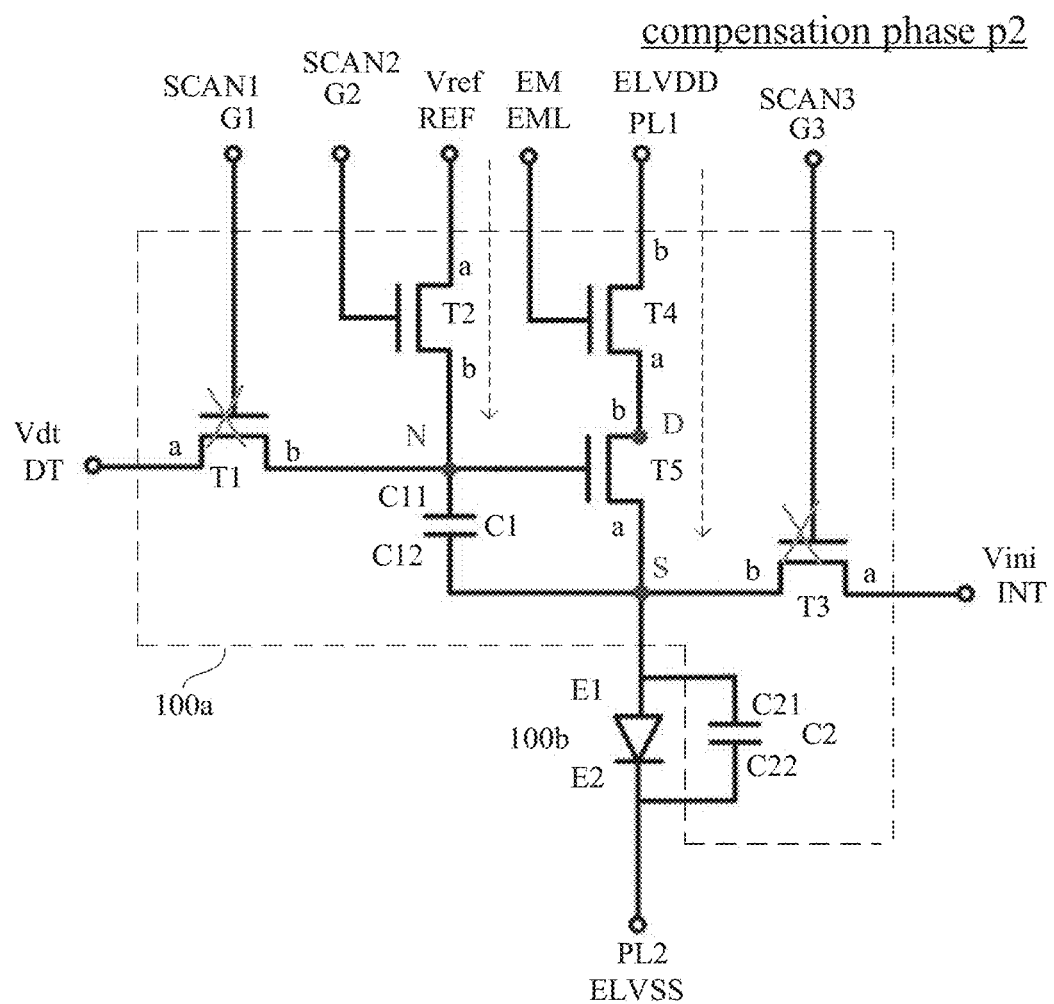
FIG. 7 is a schematic diagram showing on and off of transistors of a display substrate in a compensation phase provided by an embodiment of the present disclosure.
Figure 8:
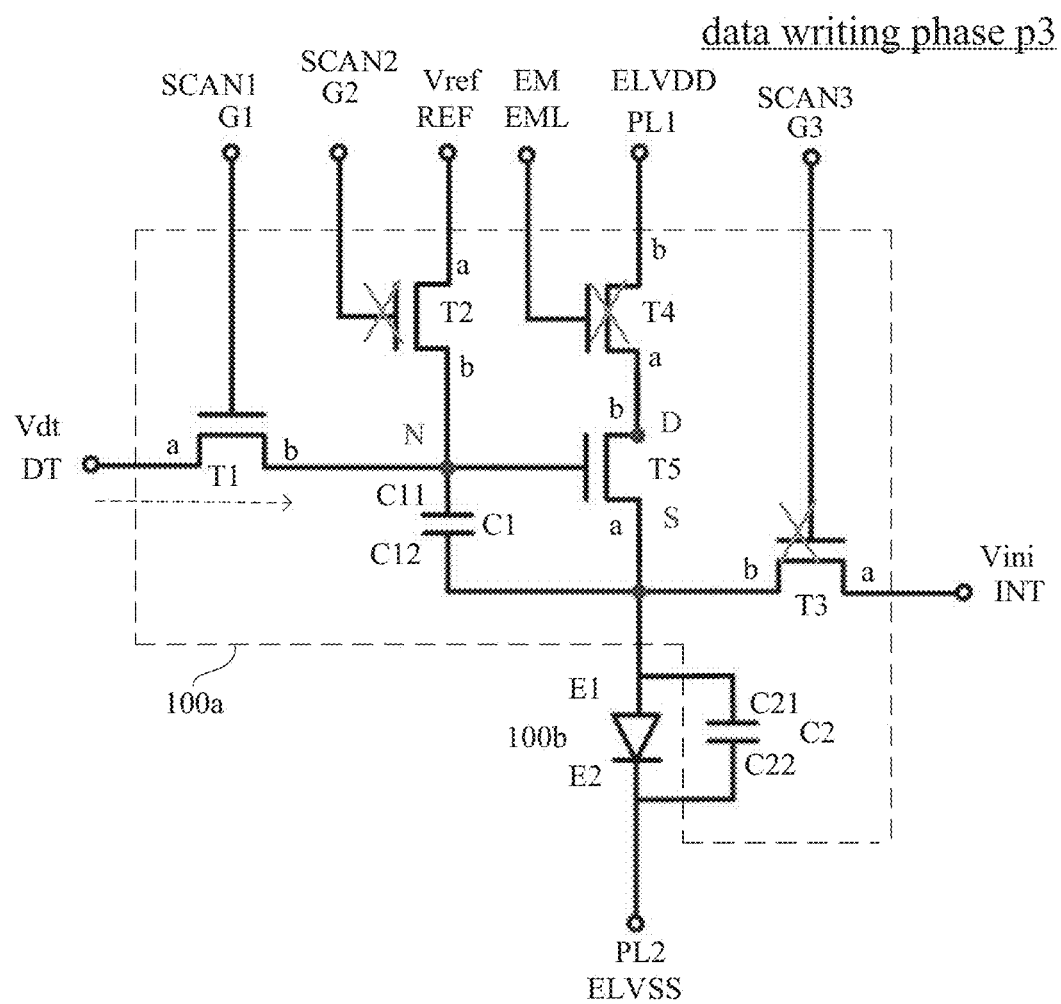
FIG. 8 is a schematic diagram showing on and off of transistors of a display substrate in a data writing phase provided by an embodiment of the present disclosure.
Figure 9:
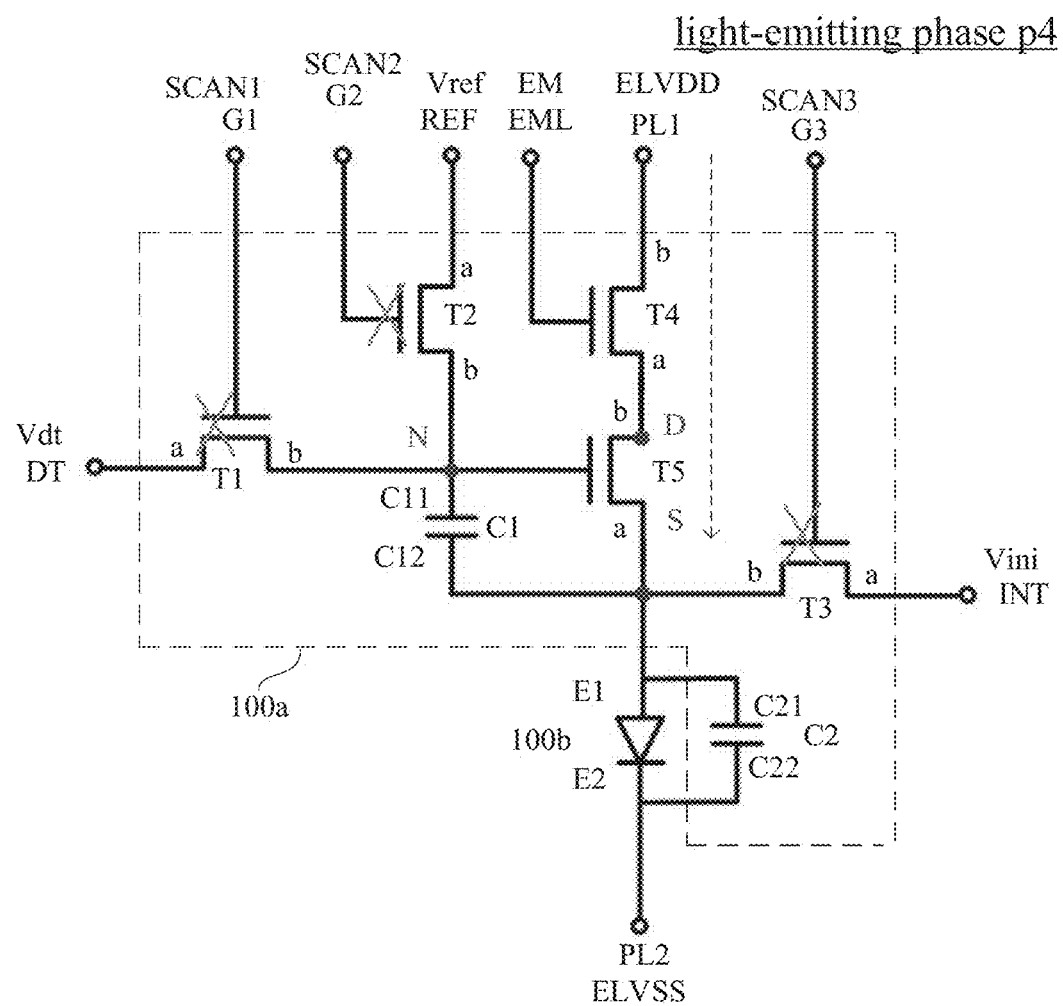
FIG. 9 is a schematic diagram showing on and off of transistors of a display substrate in a light-emitting phase provided by an embodiment of the present disclosure.

FIG. 4 is a timing signal diagram of a sub-pixel of a display substrate provided by an embodiment of the present disclosure. FIG. 5 is a timing signal diagram of a sub-pixel of a display substrate provided by an embodiment of the present disclosure. FIG. 6 is a schematic diagram showing on and off of transistors of a display substrate in a reset phase provided by an embodiment of the present disclosure. FIG. 7 is a schematic diagram showing on and off of transistors of a display substrate in a compensation phase provided by an embodiment of the present disclosure. FIG. 8 is a schematic diagram showing on and off of transistors in a data writing phase provided by an embodiment of the present disclosure. FIG. 9 is a schematic diagram showing on and off of transistors of a display substrate in a light-emitting phase provided by an embodiment of the present disclosure.

As illustrated in FIG. 4 to FIG. 9, embodiments of the present disclosure further provides a driving method of a display substrate. During a display time period within one frame, the driving method includes: a reset phase p1, a compensation phase p2, a data writing phase p3, and a light-emitting phase p4.

As illustrated in FIG. 4 and FIG. 5, the first scan signal SCAN1 is at a high level in the data writing phase p3, and is at a low level in the reset phase p1, the compensation phase p2, and the light-emitting phase p4.

As illustrated in FIG. 4 and FIG. 5, the second scan signal SCAN2 is at a high level in the reset phase p1 and the compensation phase p2, and is at a low level in the data writing phase p3 and the light-emitting phase p4.

As illustrated in FIG. 4 and FIG. 5, the third scan signal SCAN3 is at a high level in the reset phase p1, and is at a low level in the compensation phase p2, the data writing phase p3, and the light-emitting phase p4.

As illustrated in FIG. 4, the light-emitting control signal EM is at a high level during the compensation phase p2 and the light-emitting phase p4, and is at a low level in the reset phase p1 and the data writing phase p3. As illustrated in FIG. 4, FIG. 5 and FIG. 6, in the reset phase p1, the second scan signal SCAN2 is inputted, the first reset circuit 62 (reset transistor T2) is turned on, and the reference voltage Vref is transmitted to the control terminal 650 of the driving circuit 65 (driving transistor T5) through the first reset circuit 62 so as to reset the control terminal 650 of the driving circuit 65; and the third scan signal SCAN3 is inputted, the second reset circuit 63 (reset transistor T3) is turned on, and the initialization voltage Vini is transmitted to the first electrode E1 of the light-emitting element 100b through the second reset circuit 63 so as to rese the first electrode E1 of the light-emitting element 100b.

As illustrated in FIG. 6, the reset transistor T2 and the reset transistor T3 are turned on, the data writing transistor T1 and the light-emitting control transistor T4 are turned off, and the gate electrode (node N) of the driving transistor T5 and the first electrode E1 (node S) of the light-emitting element 100b are reset to the reference voltage Vref and the initialization voltage Vini, respectively. At this time, the voltage $V_N$ of the node N is the reference voltage Vref, and the voltage $V_S$ of the node S is the initialization voltage Vini.

For example, in the driving method of the display substrate, in the reset phase p1, the light-emitting control circuit 64 (light-emitting control transistor T4) is turned off so that the node S is fully reset.

As illustrated in FIG. 6, in the reset phase p1, the light-emitting control transistor T4 is turned off so that the node S is fully reset. For example, the voltage drop on the initialization line INT is small.

As illustrated in FIG. 4, FIG. 5 and FIG. 7, in the compensation phase p2, the second scan signal SCAN2 and the light-emitting control signal EM are inputted, the first reset circuit 62 (reset transistor T2) is kept turned on, the light-emitting control circuit 64 (light-emitting control transistor T4) and the driving circuit 65 (driving transistor T5) are turned on, and the first electrode plate C21 (node S) of the second capacitor C2 is charged through the first power supply voltage ELVDD so as to compensate the driving circuit 65.

As illustrated in FIG. 7, in the compensation phase p2, the reset transistor T2 and the light-emitting control transistor T4 are turned on, the data writing transistor T1 is turned off, and the reset transistor T3 is turned off.

As illustrated in FIG. 4, FIG. 5 and FIG. 7, because the reset transistor T2 is continuously in the on state, the voltage $V_N$ of the node N is maintained at the reference voltage Vref. At the same time, because the light-emitting control transistor T4 is turned on, the first power supply voltage ELVDD charges the node S through the driving transistor T5, and when the gate-source voltage difference Vgs of the driving transistor T5 is equal to the threshold voltage Vth of the driving transistor T5, the driving transistor T5 is turned off and charging ends. At this time, the voltage of the node S is Vref-Vth.

For example, the voltage of the node N is $V_N$, the voltage of the node S is $V_S$, the gate-source voltage difference of the driving transistor TS is Vgs, and the threshold voltage of the driving transistor T5 is Vth; in the compensation phase p2, $V_N$=Vref, the first power supply voltage ELVDD on the first power supply line PL1 charges the second capacitor C2 until $V_S$=Vref–Vth. At this time, the gate-source voltage difference of the driving transistor TS is: Vgs=$V_N$–$V_S$=Vref–(Vref–Vth)=Vth, Vref is set as: Vref>Vth+Vini, thus enabling the driving transistor TS to be turned on to complete compensation charging.

For example, in the driving method of the display substrate, in the compensation phase p2, the reference voltage Vref is greater than the sum of the threshold voltage of the driving circuit 65 (threshold voltage Vth of the driving transistor T5) and the initialization voltage Vini, so as to turn on the driving transistor T5 and complete compensation charging.

For example, the compensation time equals to the turn-on time of the reset transistor T2 minus the turn-on time of the reset transistor T3. The pulse width can be used to debug the gate electrode driving circuit to be turned on for a long time so as to complete long-term compensation.

For example, when setting the reference voltage Vref, it is ensured that $V_S$<V0 according to the specification of the threshold voltage Vth of the driving transistor T5, V0 being the turn-on voltage of the light-emitting element 100b. That is, it is feasible when Vref–Vth<V0, Vref<V0+Vth, and Vref<V0.

For example, in the driving method of the display substrate, the reference voltage Vref is less than the turn-on voltage V0 of the light-emitting element 100b.

As illustrated in FIG. 4, FIG. 5 and FIG. 8, in the data writing phase p3, the first scan signal SCAN1 is inputted, the data writing circuit 61 (data writing transistor T1) is turned on, and the data signal Vdt is written into the control terminal 650 of the driving circuit 65.

As illustrated in FIG. 8, in the data writing phase p3, the data writing transistor T1 is turned on, other transistors are turned off (the light-emitting control transistor T4 can also be turned on to compensate for mobility), and the data signal Vdt is written into node N, that is, a voltage on the node N jumps from the reference voltage Vref to the data signal Vdt; the voltage of the first electrode plate C11 of the first capacitor C1 involves a jump of Vdt-Vref, and the voltage of the second electrode plate C12 of the first capacitor C1 generates a corresponding jump under the action of bootstrapping.

That is, the node S is coupled through capacitance, and the voltage on the node S becomes: $V_S$=α(Vdt−Vref)+Vref−Vth. For example, in the above formula, α is a coefficient, for example, α=C1/(C1+C2), in the formula, C1 is the capacitance value of the first capacitor C1, and C2 is the capacitance value of the second capacitor C2. After the data writing phase p3 ends, the voltage of the node N is Vdt, and the voltage of the node S is a (Vdt−Vref)+Vref−Vth.

For example, in the driving method of the display substrate, in the data writing phase p3, the light-emitting control signal EM is also inputted, and the light-emitting control circuit 64 is turned on to compensate the driving circuit 65 so as to compensate for mobility.

As illustrated in FIG. 4, FIG. 5 and FIG. 9, in the light-emitting phase p4, the light-emitting control signal EM is inputted, and the light-emitting control circuit 64 (light-emitting control transistor T4) and the driving circuit 65 are turned on so as to generate a driving current, thereby driving the light-emitting element 100b to emit light. The light-emitting control transistor T4 is turned on to provide the first power supply voltage ELVDD to the driving transistor T5.

As illustrated in FIG. 9, in the light-emitting phase p4, the light-emitting control transistor T4 is turned on, and the data writing transistor T1, the reset transistor T2, and the reset transistor T3 are turned off. At this time, the driving current I is:

$$I = K*[(1-\alpha)*(Vdt-Vref)]^2.$$

It can be seen from the above formula that the driving current is related to the data signal Vdt and the reference voltage Vref, and the influence of the threshold voltage Vth of the driving transistor T5 on the driving current is successfully eliminated. Therefore, the driving current can be prevented from being affected by the non-uniformity and drift of the threshold voltage, and the uniformity of the driving current is effectively improved. In addition, because the driving current is not associated with the first power supply voltage ELVDD and not associated with the second power supply voltage ELVSS, the influence of the voltage drop of the first power supply line PL1 and the second power supply line PL2 on the driving current can be effectively avoided.

According to α=C1/(C1+C2), it can be seen that the greater the capacitance value of the second capacitor C2 is, the smaller α is, and the more energy is saved.

For example, the voltage drop of the light-emitting control transistor T4 affects the first power supply voltage ELVDD and the linear region of the light-emitting control transistor T4. The following setting is made: EM>ELVDD+Vth_em, Vth_em being the threshold voltage of the light-emitting control transistor T4.

For example, in the driving method of the display substrate, in the light-emitting phase p4, the light-emitting control signal EM is greater than the sum of the first power supply voltage ELVDD and the threshold voltage Vth_em of the light-emitting control circuit 64.

For example, the cross-voltage of the light-emitting element 100b is large and the first power supply voltage ELVDD is required to be large, resulting in a high voltage of the light-emitting control signal EM.

The driving method of the display substrate provided by the embodiments of the present disclosure helps improve the display effect.

FIG. 5 also illustrates the reset phase p01 of a gate driver on array (GOA). As illustrated in FIG. 5, the reset phase p01 is prior to the reset phase p1.

FIG. 5 illustrates the light-emitting control signal EM. FIG. 5 illustrates two kinds of light-emitting control signals EM: the light-emitting control signal EM1 and the light-emitting control signal EM2. The light-emitting control signal EM1 or the light-emitting control signal EM2 can be selected.

As illustrated in FIG. 5, the difference between the light-emitting control signal EM1 and the light-emitting control signal EM2 is that: in the light-emitting phage p4, the voltage value of the light-emitting control signal EM1 changes periodically, while the voltage value of the light-emitting control signal EM2 remains unchanged.

As illustrated in FIG. 5, the light-emitting control signal EM1 realizes dimming, which can be referred to as pulse width modulation (PWM) dimming, by rapidly turning on and turning off the light-emitting control transistor T4. The brightness of the screen is regulated and controlled by turning on and off, that is, the brightness of the sub-pixel is constant, and only the lighting time of the sub-pixel changes.

As illustrated in FIG. 5, in one period of the light-emitting control signal EM1, the ratio of the turn-on time t1 to the period t2 is a duty ratio.

FIG. 4 illustrates the voltage waveform of the data signal Vdt. FIG. 4 and FIG. 5 illustrate the voltage waveform of the first scan signal SCNA1, the voltage waveform of the second scan signal SCNA2, the voltage waveform of the third scan signal SCNA3, and the voltage waveform of the light-emitting signal EM.

FIG. 5 also illustrates the voltage waveform of the node N in various phases, the voltage waveform of the node D in various phases, and the voltage waveform of the node S in various phases.

Figure 27:
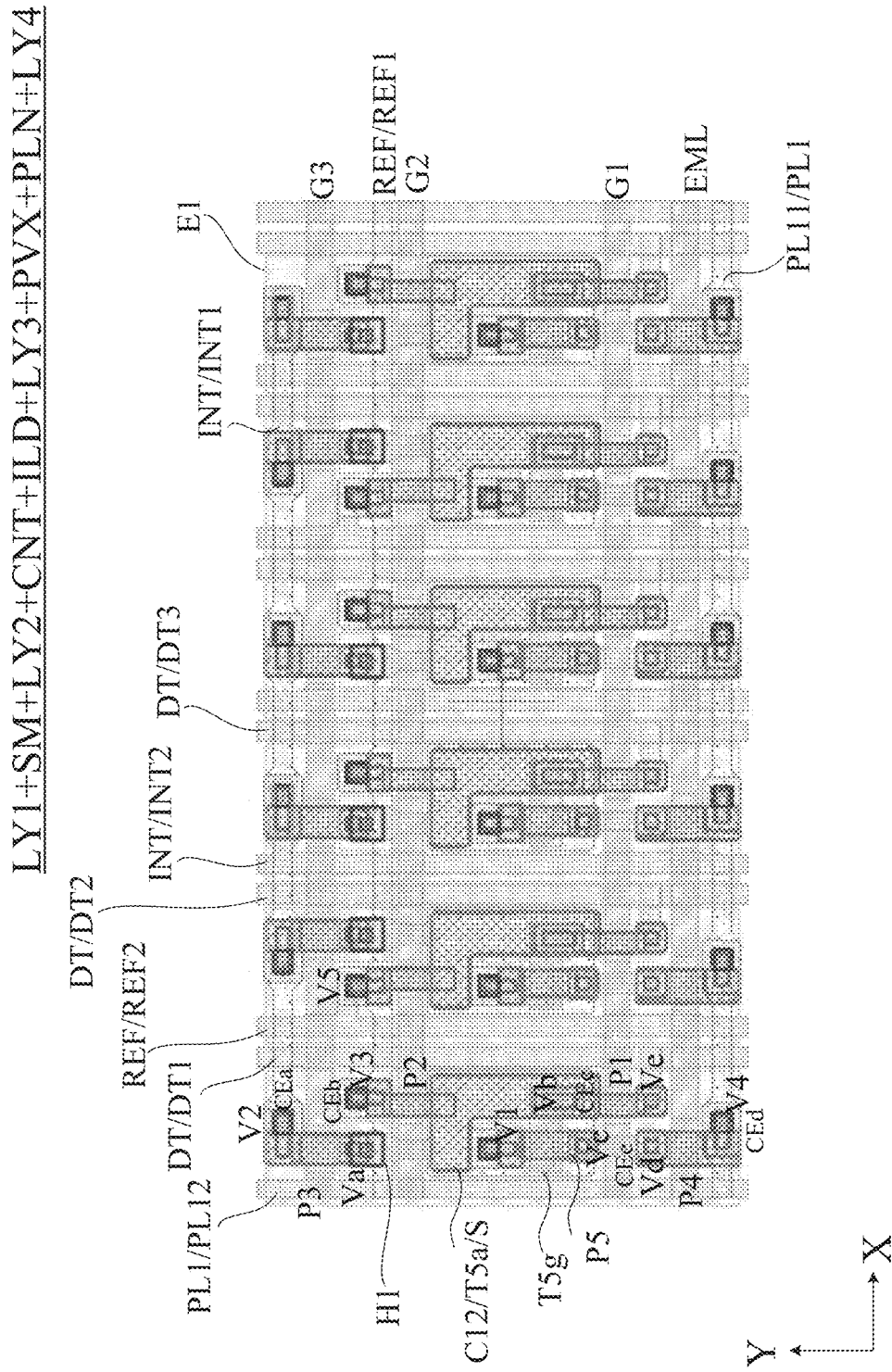
Figure 28:
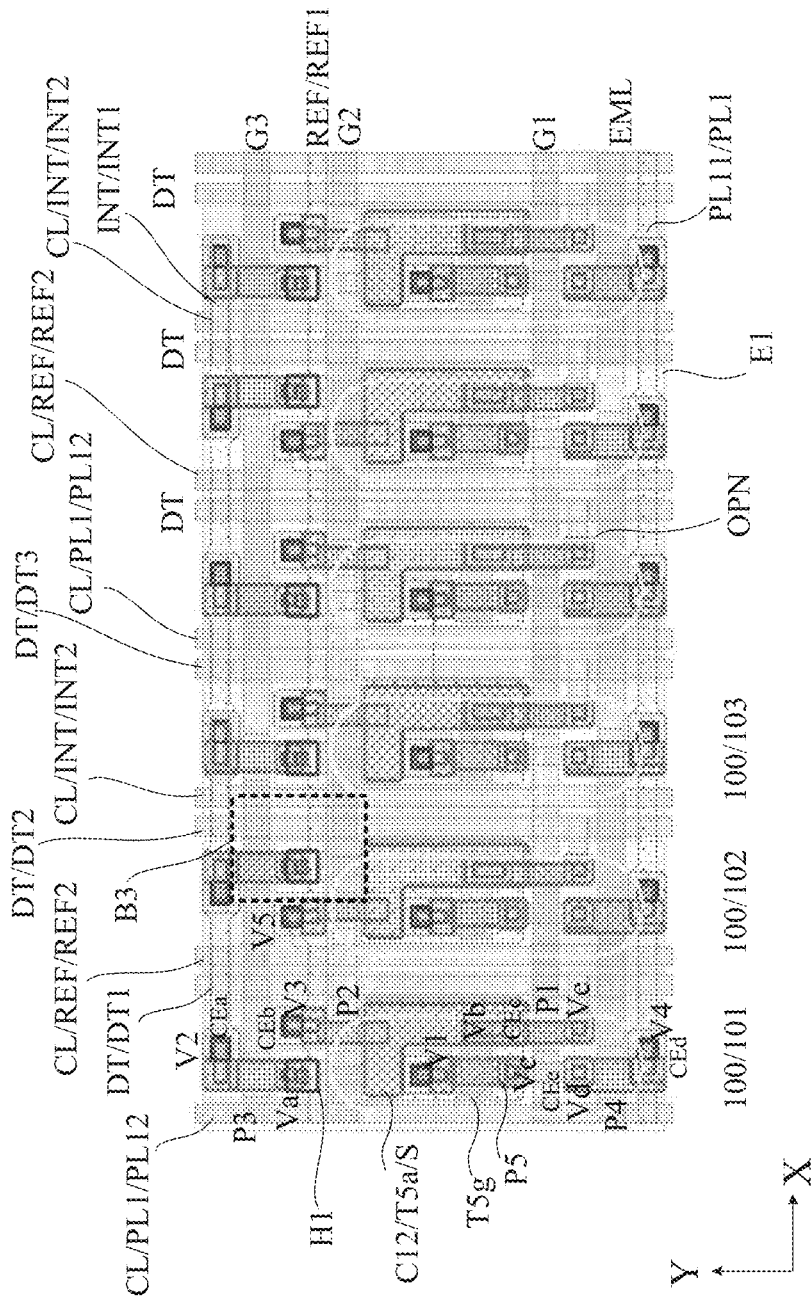
Figure 29:
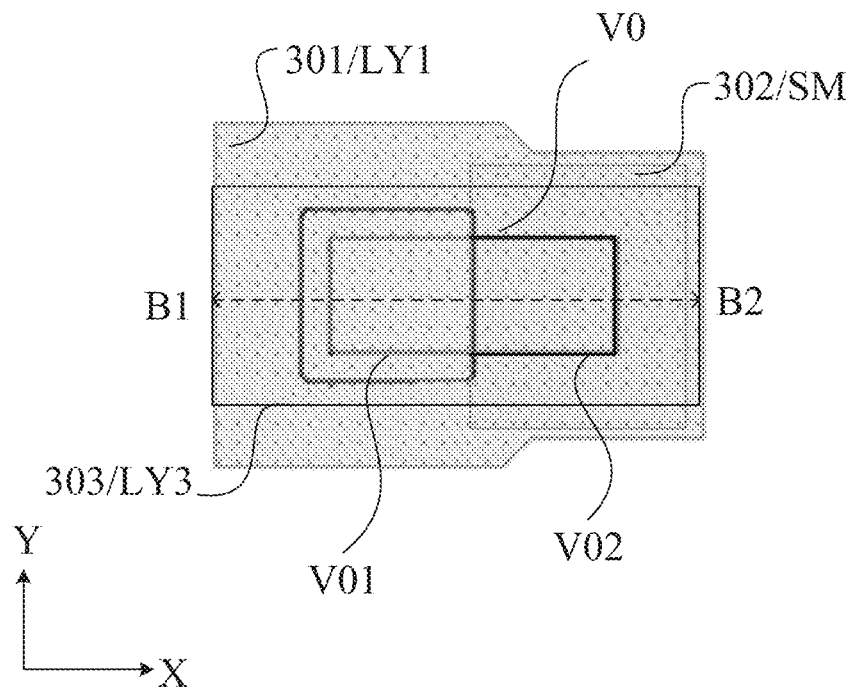
FIG. 29 is a plan view of a composite via hole in a display substrate provided by an embodiment of the present disclosure.
Figure 30:
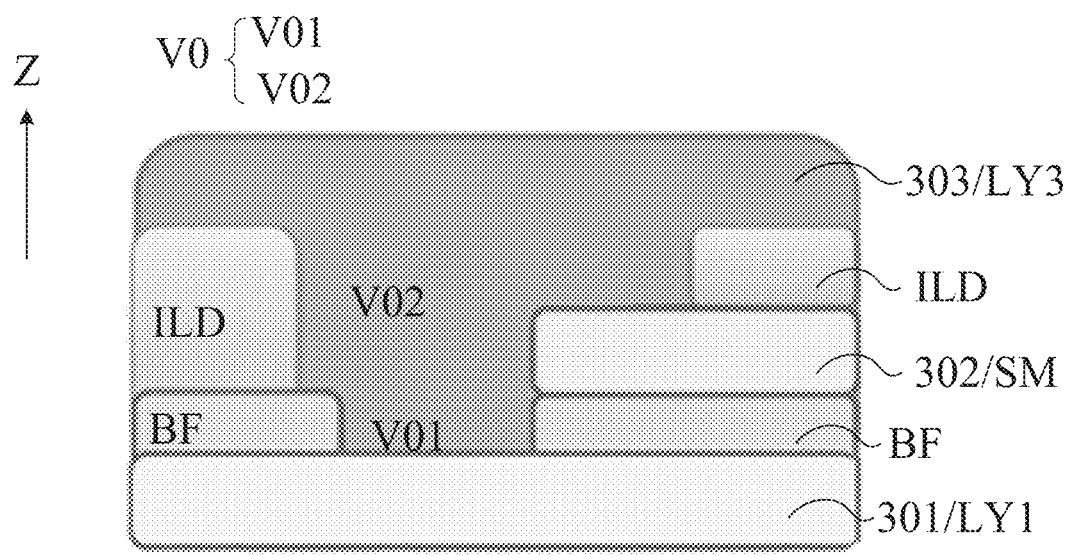
FIG. 30 is a cross-sectional view of a composite via hole in a display substrate provided by an embodiment of the present disclosure.
Figure 31:
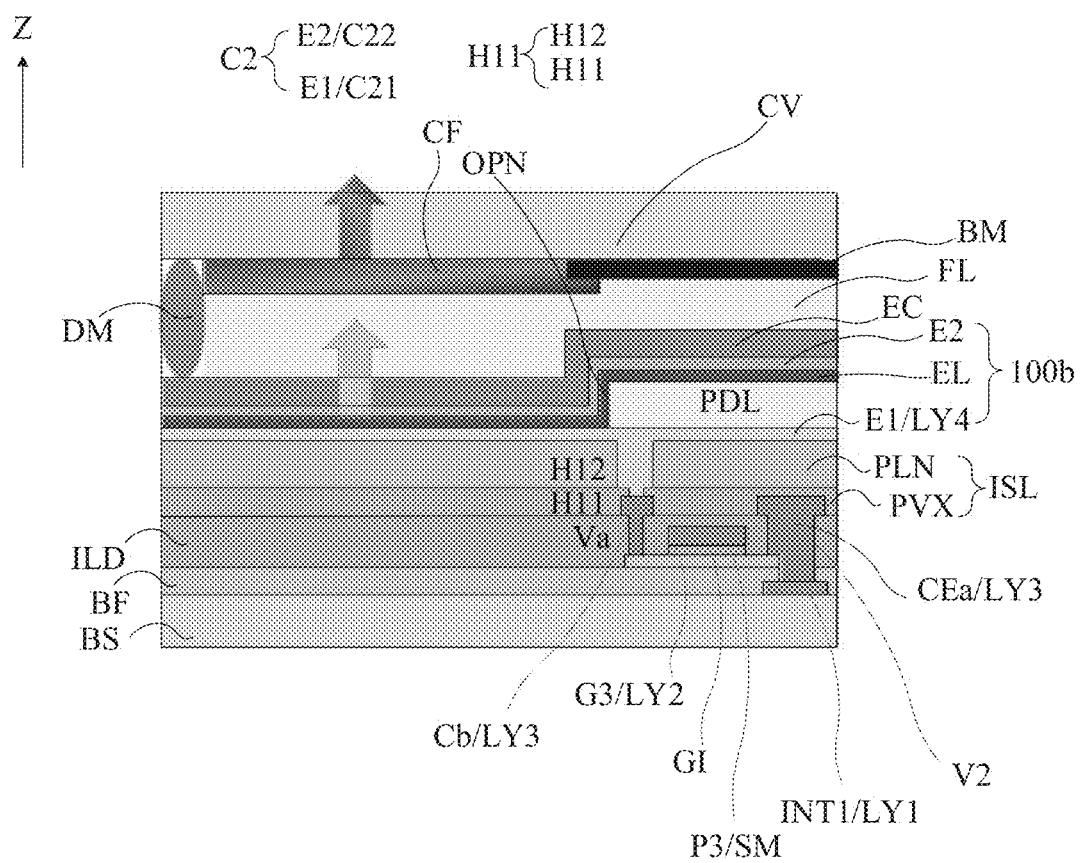
FIG. 31 is a cross-sectional view of a display substrate provided by an embodiment of the present disclosure.
Figure 32:
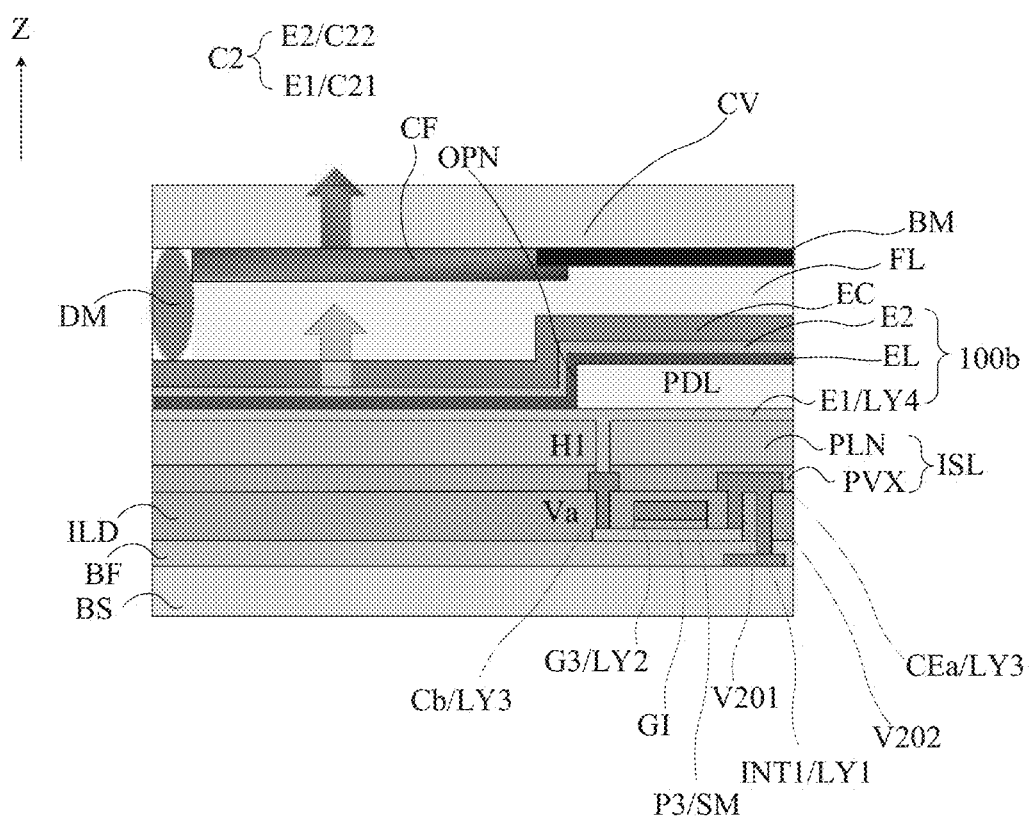
FIG. 32 is a cross-sectional view of a display substrate.
Figure 33:
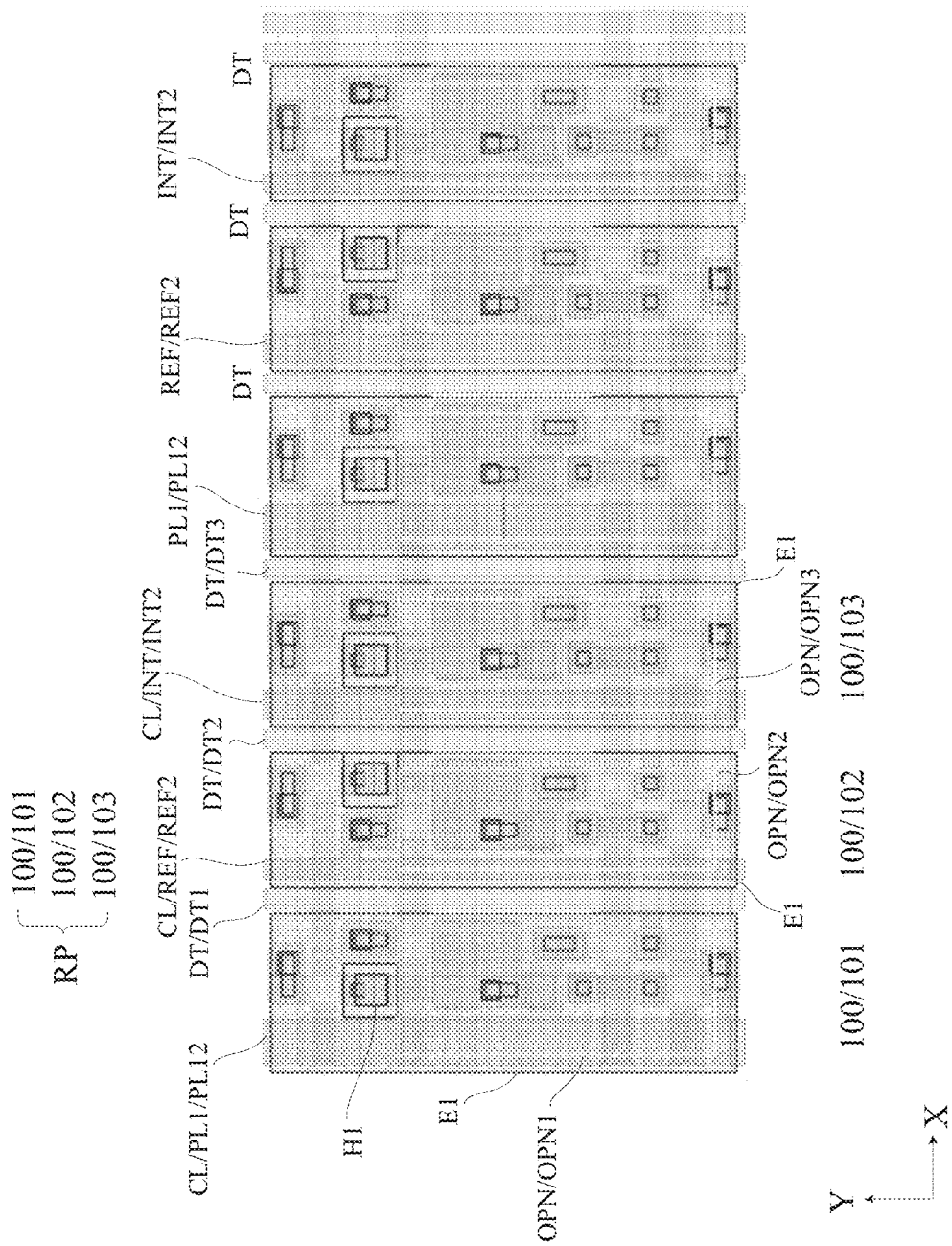
FIG. 33 is a stacked-layer diagram of a display substrate provided by an embodiment of the present disclosure.

FIG. 10 to FIG. 19 are single-layer diagrams of a display substrate provided by an embodiment of the present disclosure, and FIG. 20 to FIG. 28 are stacked-layer diagrams of a display substrate provided by an embodiment of the present disclosure. FIG. 29 is a plan view of a composite via hole in a display substrate provided by an embodiment of the present disclosure. FIG. 30 is a cross-sectional view of a composite via hole in a display substrate provided by an embodiment of the present disclosure. FIG. 31 is a cross-sectional view of a display substrate provided by an embodiment of the present disclosure. FIG. 32 is a cross-sectional view of a display substrate. FIG. 33 is a stacked-layer diagram of a display substrate provided by an embodiment of the present disclosure. The single layer or stacked layer illustrated in the figures is labeled in the upper right corner of the plan view. Some of the plan views also illustrate a cross indicating an intermediate position. FIG. 30 may be a cross-sectional view along the line B1-B2 in FIG. 29.

Figure 10:
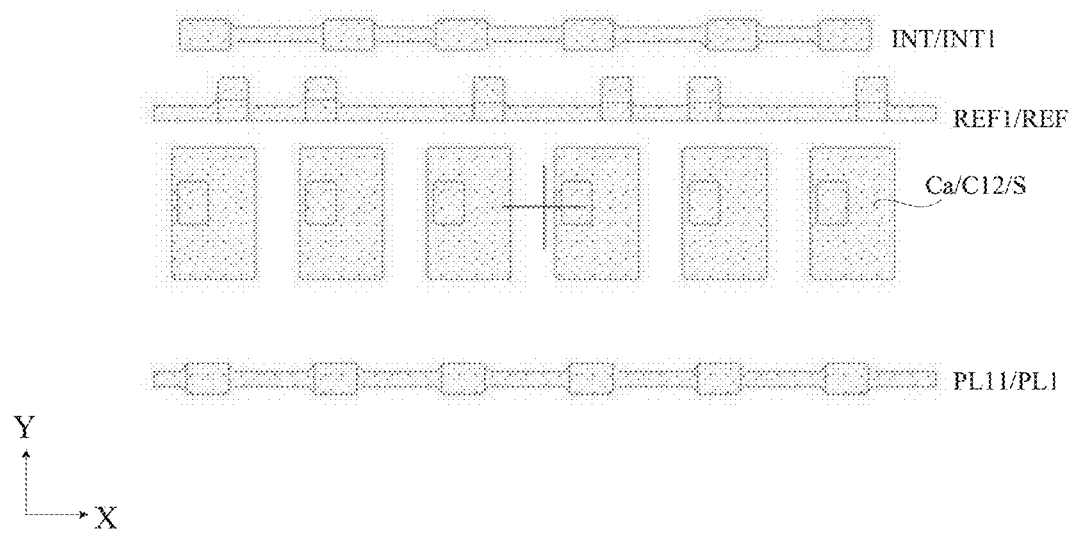
FIG. 10 to FIG. 19 are diagrams of a single layer in a display substrate provided by an embodiment of the present disclosure.

For example, as illustrated in FIG. 10, the display substrate includes a first conductive pattern layer LY1. The first conductive pattern layer LY1 includes an initialization signal line INT1, a reference voltage signal line REF1, and a first power supply signal line PL11. Each of the initialization signal line INT1, the reference voltage signal line REF1, and the first power supply signal line PL11 extends in the first direction X, and the initialization signal line INT1, the reference voltage signal line REF1, and the first power supply signal line PL11 are arranged in the second direction Y, the first direction X intersects with the second direction Y. The arrangement positions of the reference voltage signal line REF1, the initialization signal line INT1, and the first power supply signal line PL11 determine the arrangement positions of the reset transistor T2, the reset transistor T3, and the light-emitting control transistor T4 in the layout diagram.

In some figures of the embodiments of the present disclosure, the plan views illustrate the first direction X and the second direction Y, and cross-sectional views illustrate the third direction Z. Both the first direction X and the second direction Y are directions parallel to the main surface of the base substrate BS. The third direction Z is the direction perpendicular to the main surface of the base substrate BS. For example, the first direction X intersects with the second direction Y, and the third direction Z is perpendicular to the first direction X and perpendicular to the second direction Y. The embodiments of the present disclosure are described by taking as an example that the first direction X and the second direction Y are perpendicular to each other. As illustrated in FIG. 31, the main surface of the base substrate BS is the surface of the base substrate BS used for manufacturing various components. As illustrated in FIG. 31, the upper surface of the base substrate BS is the main surface of the base substrate BS.

Figure 11:
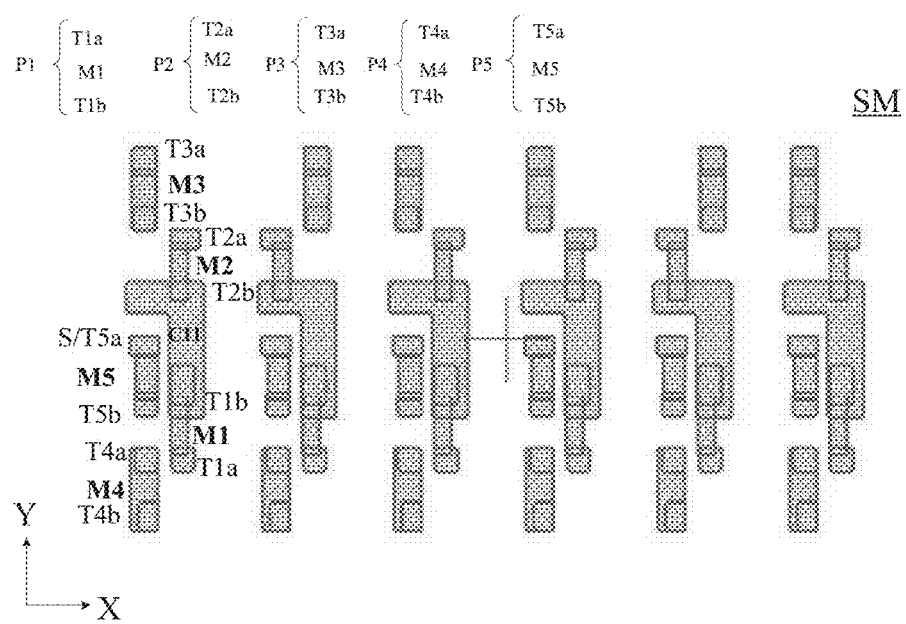

For example, as illustrated in FIG. 11, the display substrate further includes an active layer SM, and the active layer SM includes a first active part P1, a second active part P2, a third active part P3, a fourth active part P4, and the fifth active part P5. As illustrated in FIG. 11, each of the first active part P1, the second active part P2, the third active part P3, the fourth active part P4, and the fifth active part P5 includes a channel and a first electrode and a second electrode located on both sides of the channel. As illustrated in FIG. 11, the first active part P1 includes the channel M1, the first electrode T1$a$, and the second electrode T1$b$ of the data writing transistor T1; the second active part P2 includes the channel M2, the first electrode T2$a$, and the second electrode T2$b$ of the reset transistor T2; the third active part P3 includes the channel M3, the first electrode T3$a$, and the second electrode T3$b$ of the reset transistor T3; the fourth active part P4 includes the channel M4, the first electrode T4$a$, and the second electrode T4$b$ of the light-emitting control transistor T4; and the fifth active part P5 includes the channel M5, the first electrode T5$a$, and the second electrode T5$b$ of the driving transistor T5. The arrangement positions of the first active part P1, the second active part P2, the third active part P3, the fourth active part P4, and the fifth active part P5 determine the arrangement positions of the respective transistors.

Figure 21:
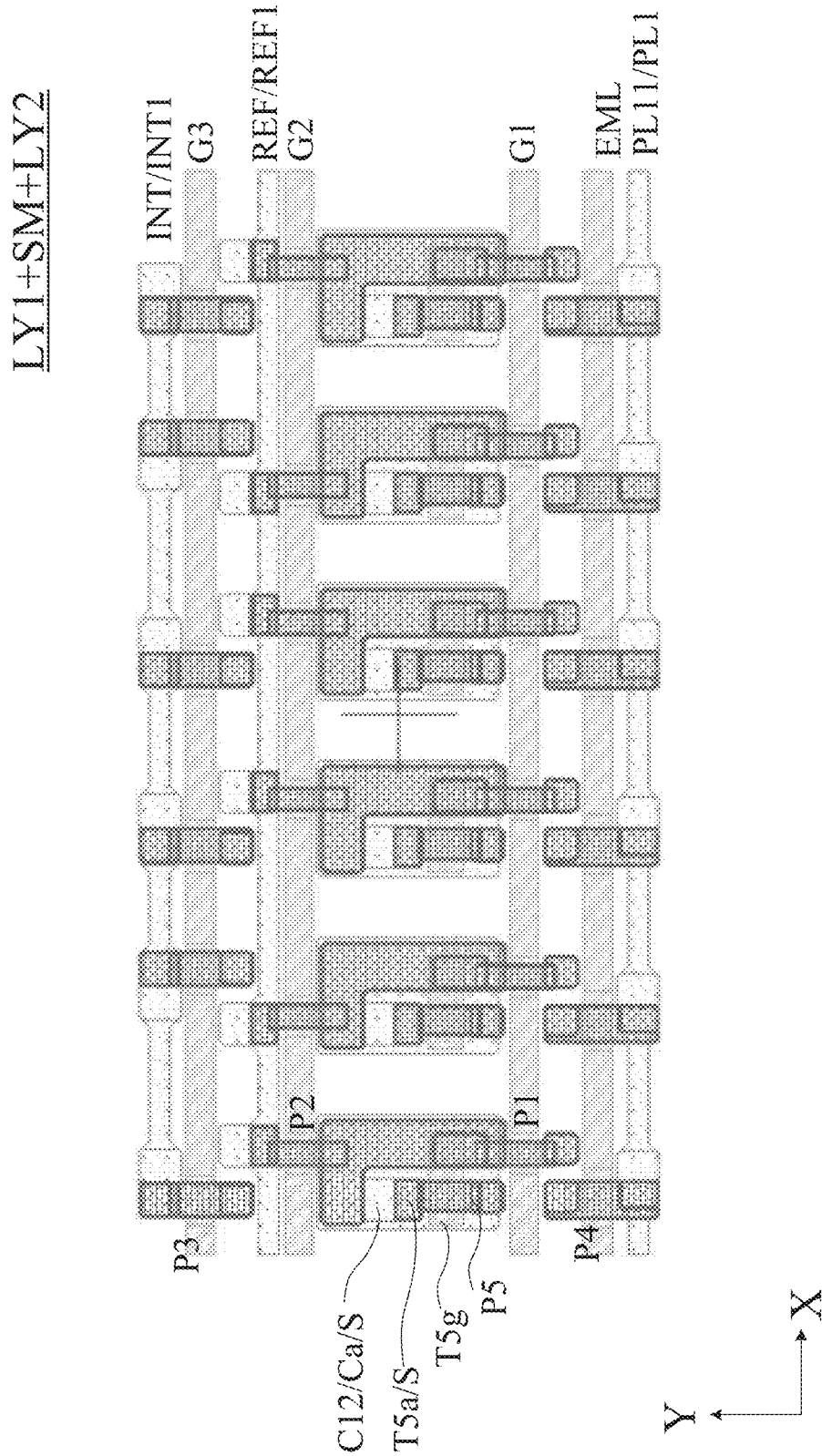
Figure 22:
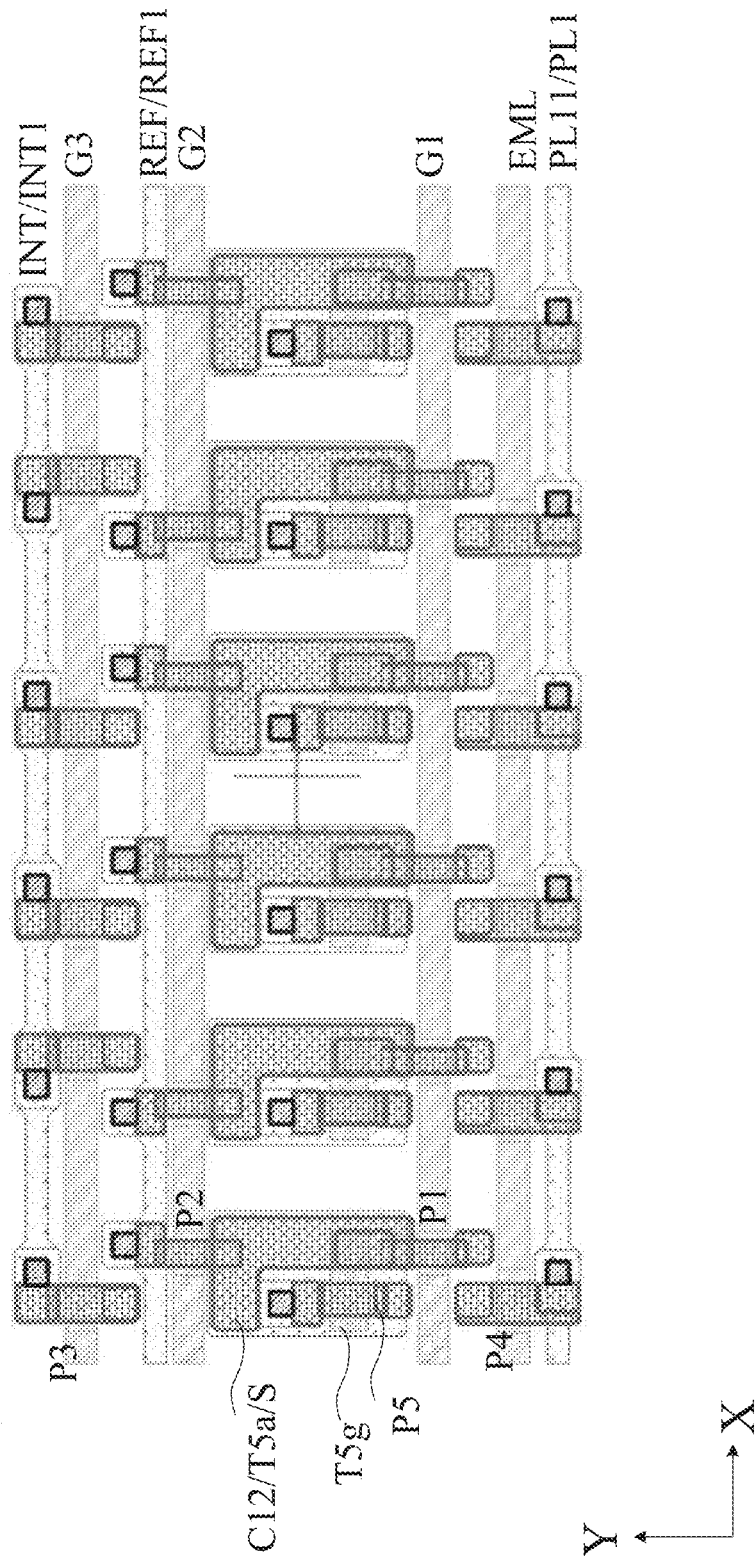
Figure 23:
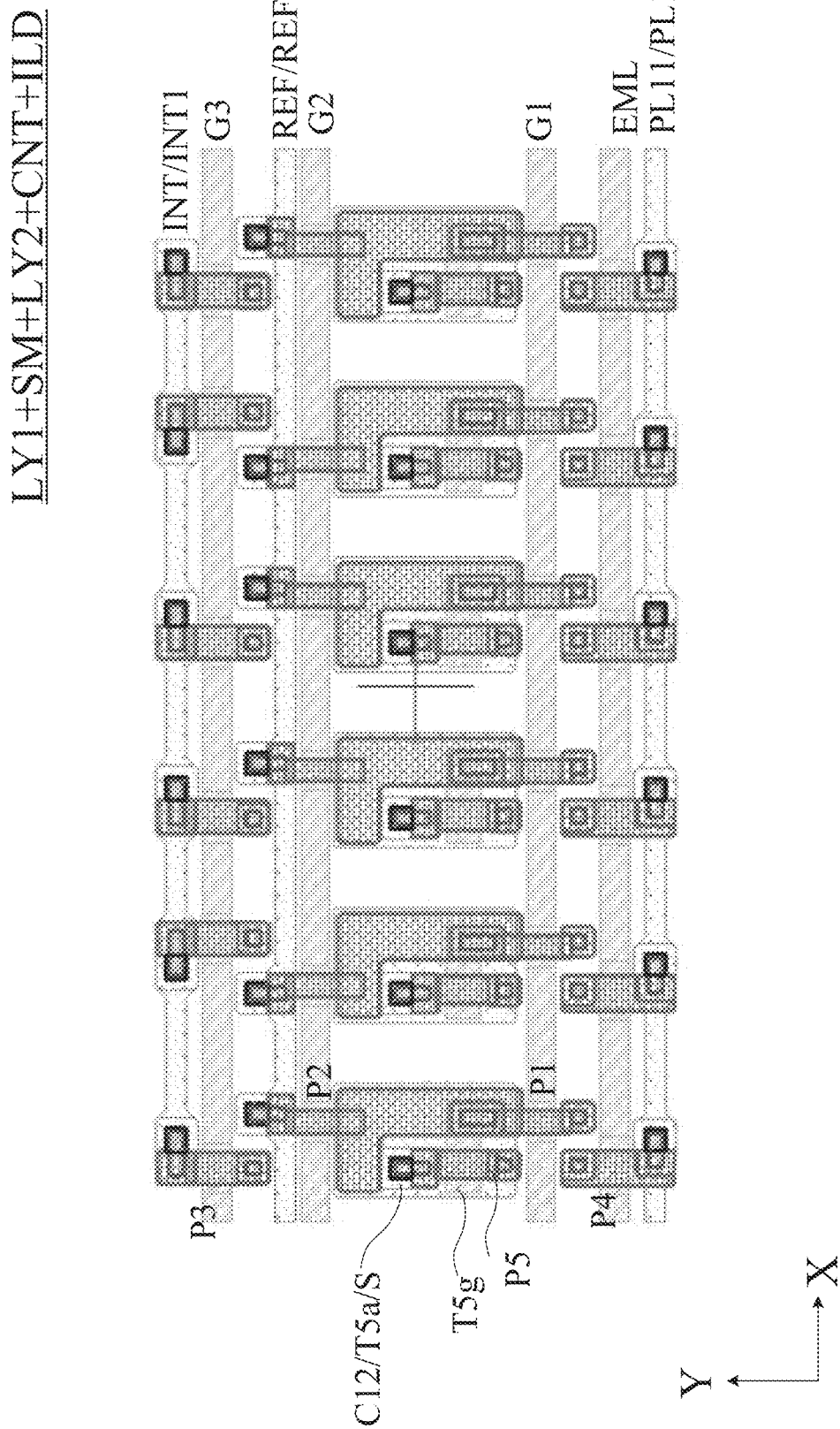

As illustrated in FIG. 11 and FIG. 21, the first active part P1 and the second active part P2 are of an integral structure, that is, the second electrode T1$b$ of the data writing transistor T1 and the second electrode T2$b$ of the reset transistor T2 are of an integral structure.

Figure 12:
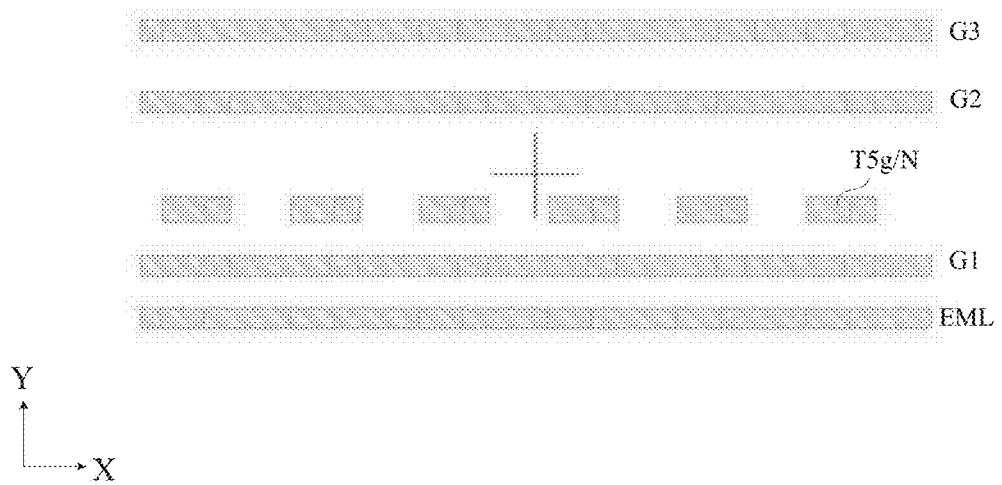

For example, as illustrated in FIG. 12, the display substrate further includes a second conductive pattern layer LY2, and the second conductive pattern layer LY2 includes a first gate line G1, a second gate line G2, a third gate line G3, a gate electrode T5$g$ of the driving transistor T5, and a light-emitting control line EML. As illustrated in FIG. 12, the third gate line G3, the second gate line G2, the gate electrode T5$g$ of the driving transistor T5, the first gate line G1, and the light-emitting control line EML are arranged in the second direction Y, and each of them extends in the first direction X. In the embodiments of the present disclosure, the component extends along the length direction thereof. The dimension of a component along the length thereof is greater than any dimension of the component in any other direction. The arrangement of the first gate line G1, the second gate line G2, the third gate line G3, the gate electrode T5$g$ of the driving transistor T5, and the light-emitting control line EML determines the arrangement position of respective transistors.

For example, as illustrated in FIG. 21, the orthographic projection of the first active part P1 on the base substrate BS overlaps the orthographic projection of the first gate line G1 on the base substrate BS, the orthographic projection of the second active part P2 overlaps the orthographic projection of the second gate line G2 on the base substrate BS, the orthographic projection of the third active part P3 on the base substrate BS overlaps the orthographic projection of the third gate line G3 on the base substrate BS, the orthographic projection of the fourth active part P4 on the base substrate BS overlaps the orthographic projection of the light-emitting control line EML on the base substrate BS, and the orthographic projection of the fifth active part P5 on the base substrate BS overlaps the orthographic projection of the gate electrode T5g of the driving transistor T5 on the base substrate BS, each of the first active part P1, the second active part P2, the third active part P3, the fourth active part P4, and the fifth active part P5 extends in the second direction Y. Each of the active parts extends in the second direction Y, facilitating the arrangement of respective transistors and the layout design. The base substrate BS is not illustrated in some plan views, and the plane on which the paper surface is located can be regarded as the main surface of the base substrate BS.

As illustrated in FIG. 11, FIG. 12 and FIG. 21, the portion of the active layer SM covered by the second conductive pattern layer LY2 is a semiconductor region, forming the channels of various transistors, that is, the channel M1 to the channel M5. The portion of the active layer SM not covered by the second conductive pattern layer LY2 is a conductor region, forming the first electrode and the second electrode of each transistor, and the first electrode plate C11 of the first capacitor C1. The second conductive pattern layer LY2 may be used as a mask for doping to convert the semiconductor material into a conductor so as to form an active layer SM including various active parts. As illustrated in FIG. 11, the second electrode T2b of the reset transistor T2, the second electrode T1b of the data writing transistor T1, and the first electrode plate C11 of the first capacitor C1 are of an integral structure.

Figure 15:
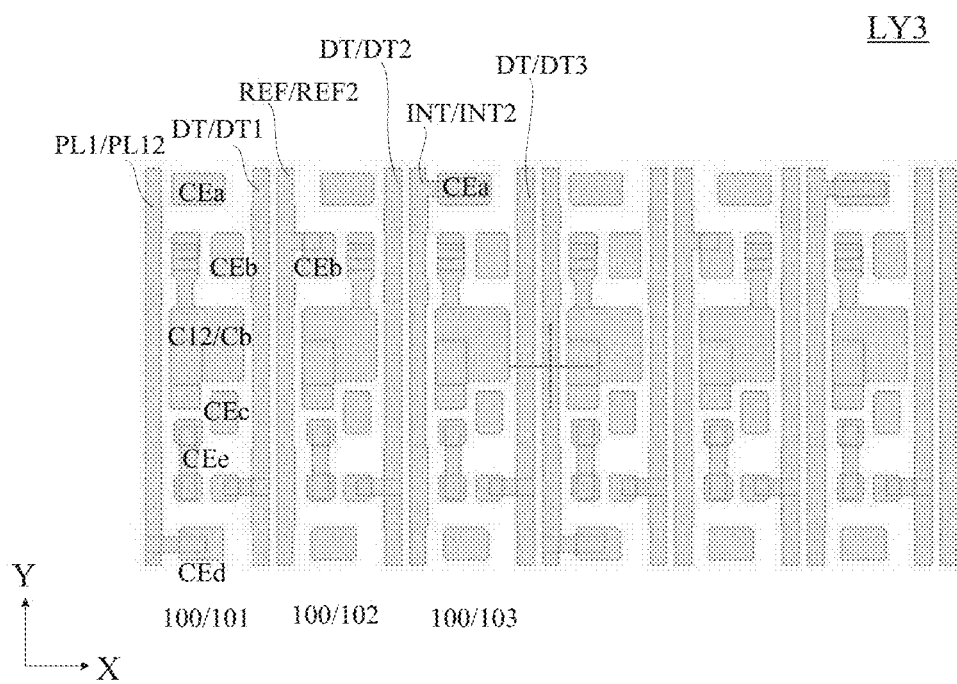

For example, as illustrated in FIG. 15, the display substrate further includes a third conductive pattern layer LY3, and the third conductive pattern layer LY3 includes an initialization connection line INT2, a reference voltage connection line REF2, and a first power supply connection line PL12.

Figure 24:
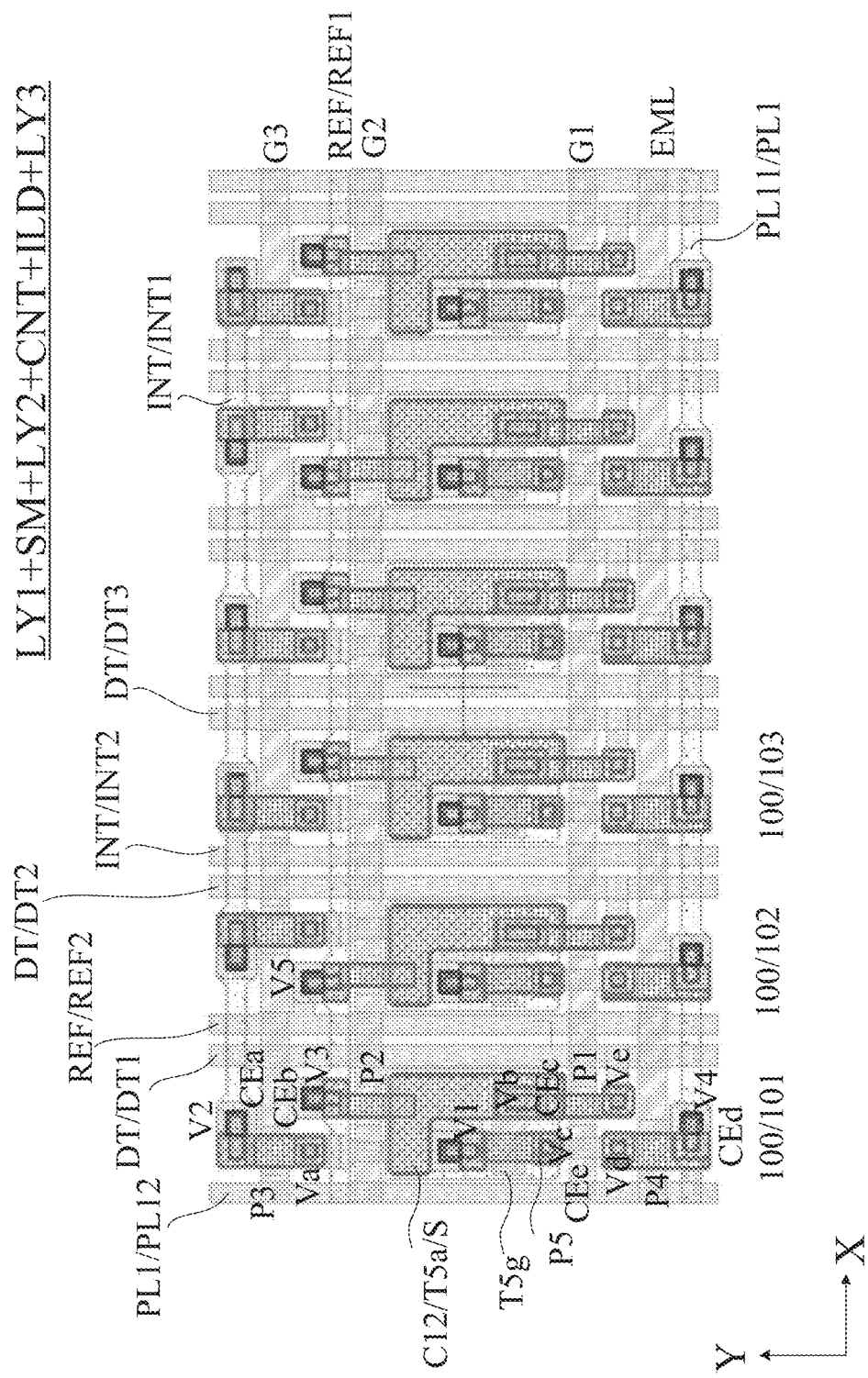
Figure 25:
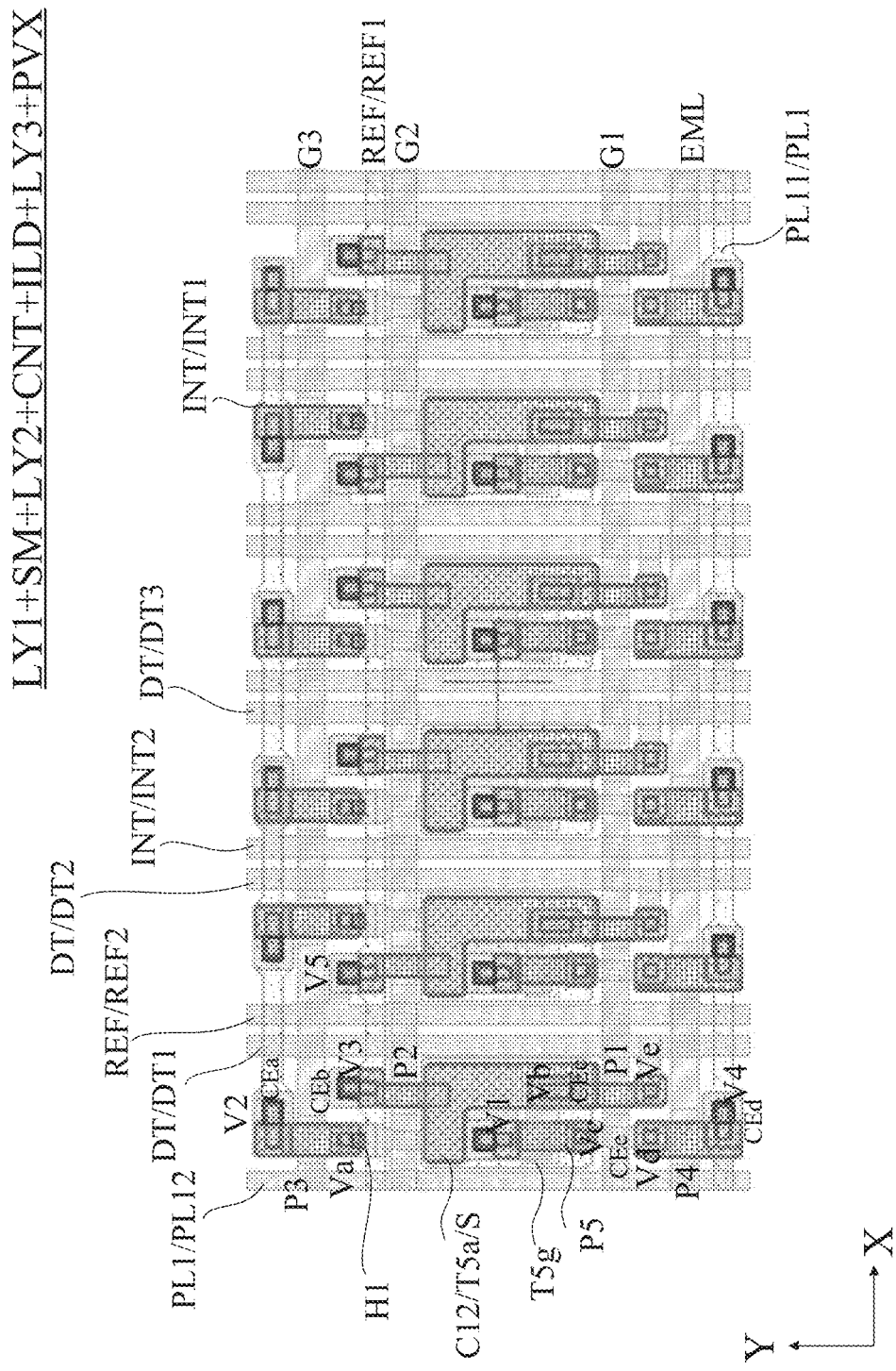
Figure 26:
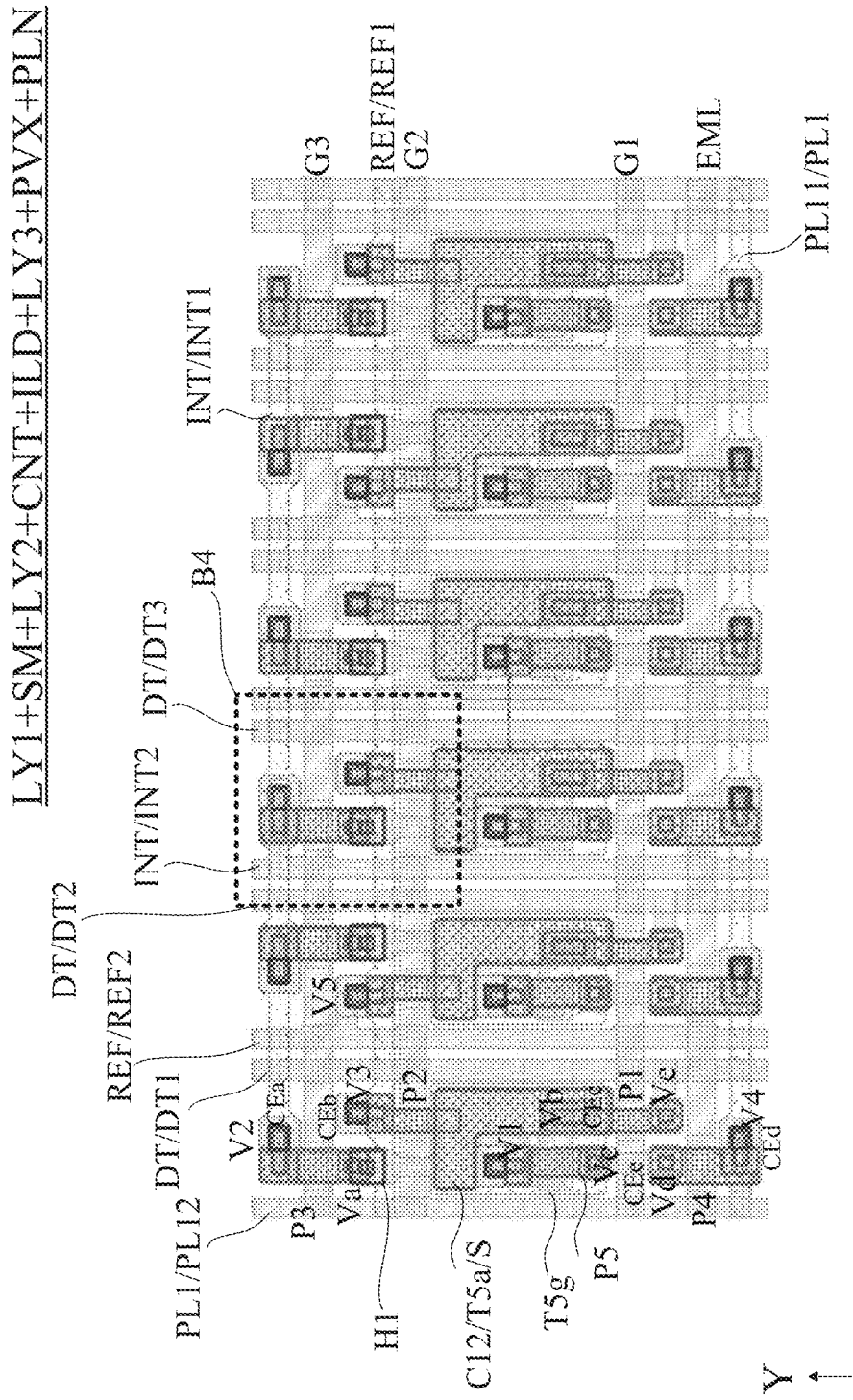

As illustrated in FIG. 24, the initialization connection line INT2 is connected to the initialization signal line INT1, the reference voltage connection line REF2 is connected to the reference voltage signal line REF1, and the first power supply connection line PL12 is connected to the first power supply signal line PL11.

For example, as illustrated in FIG. 15, each of the initialization connection line INT2, the reference voltage connection line REF2, and the first power supply connection line PL12 extends in the second direction Y, and the first power supply connection line PL12, the reference voltage connection line REF2, and the initialization connection line INT2 are arranged in the first direction X.

Figure 18:
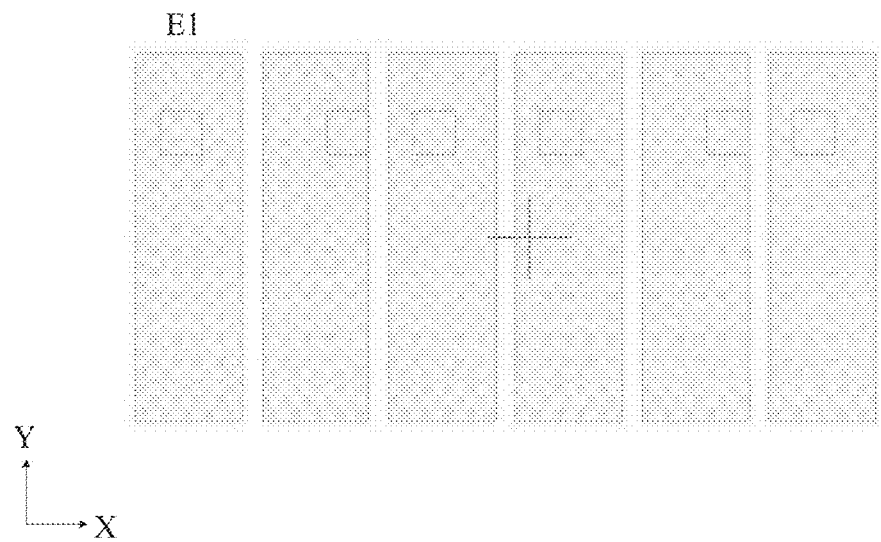
Figure 19:
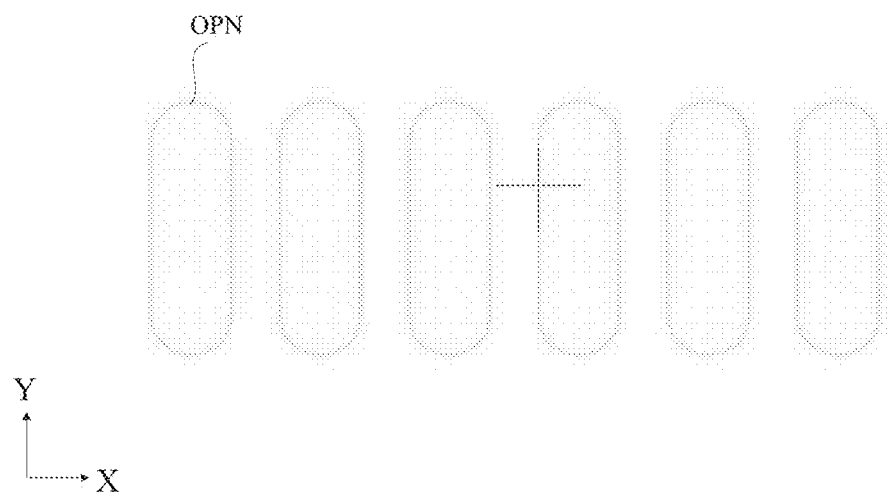
Figure 20:
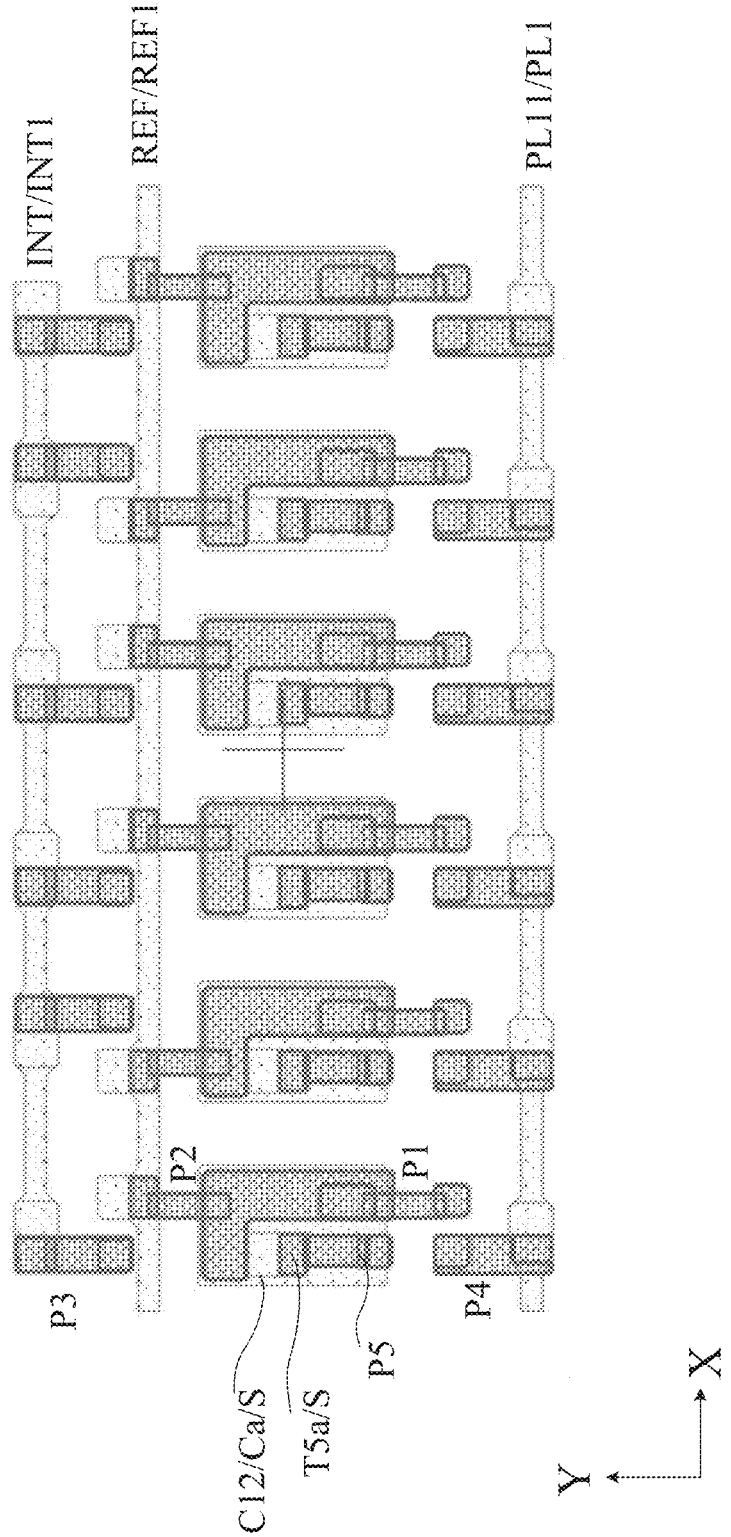
FIG. 20 to FIG. 28 are stacked-layer diagrams of a display substrate provided by an embodiment of the present disclosure.

For example, as illustrated in FIG. 18 and FIG. 19, the display substrate further includes a fourth conductive pattern layer LY4 and a pixel-defining layer PDL, the fourth conductive pattern layer LY4 includes a plurality of first electrodes E1, the plurality of first electrodes E1 are independent from each other and adjacent first electrodes E1 are spaced apart from each other, and the pixel-defining layer PDL is located on the fourth conductive pattern layer LY4 and includes a plurality of openings OPN. As illustrated in FIG. 28 and FIG. 31, the opening OPN is configured to expose at least a portion of the first electrode E1.

As illustrated in FIG. 33, the plurality of openings OPN include a first opening OPN1, a second opening OPN2, and a third opening OPN3. The orthographic projection of the first opening OPN1 on the base substrate BS overlaps the orthographic projection of the first power supply connection line PL12 on the base substrate BS, the orthographic projection of the second opening OPN2 on the base substrate BS overlaps the orthographic projection of the reference voltage connection line REF2 on the base substrate BS, and the orthographic projection of the third opening OPN3 on the base substrate BS overlaps the orthographic projection of the initialization connection line INT2 on the base substrate BS. For example, as illustrated in FIG. 33, the area of the first opening OPN1 is greater than the area of the third opening OPN3, the area of the third opening OPN3 is greater than the area of the second opening OPN2, the width of the first power supply connection line PL12 is greater than the width of the initialization connection line INT2, and the width of the initialization connection line INT2 is greater than the width of the reference voltage connection line REF2. The greater the opening, the greater the width of the direct current (DC) signal line (the connection line extending in the second direction Y) used for signal isolation. The connection line extending in the second direction Y includes at least one of the first power supply connection line PL12, the initialization connection line INT2, and the reference voltage connection line REF2. The first power supply connection line PL12, the initialization connection line INT2, and the reference voltage connection line REF2 are all DC signal lines, and voltages on the first power supply connection line PL12, the initialization connection line INT2, and the reference voltage connection line REF2 can be three different fixed voltages.

For example, as illustrated in FIG. 28 and FIG. 33, for a sub-pixel 100, a DC signal line CL and a data line DT are arranged on both sides of the pixel circuit of the sub-pixel 100, respectively. For example, as illustrated in FIG. 28 and FIG. 33, for the first sub-pixel 101, a DC signal line CL (first power supply connection line PL12) and a data line DT (data line DT1) are arranged on both sides of the pixel circuit of the first sub-pixel 101, respectively. For example, as illustrated in FIG. 28 and FIG. 33, for the second sub-pixel 102, a DC signal line CL (reference voltage connection line REF2) and a data line DT (data line DT2) are arranged on both sides of the pixel circuit of the second sub-pixel 102, respectively. For example, as illustrated in FIG. 28 and FIG. 33, for the third sub-pixel 103, a DC signal line CL (initialization connection line INT2) and a data line DT (data line DT3) are arranged on both sides of the pixel circuit of the third sub-pixel 103, respectively.

As illustrated in FIG. 28 and FIG. 33, the left and right sides of the sub-pixel 100 are a data line DT and a DC signal line (the first power supply connection line PL12, the initialization connection line INT2, or the reference voltage connection line REF2), respectively, thus reducing mutual interference between sub-pixels.

FIG. 28 and FIG. 33 illustrate the data line DT1 of the first sub-pixel 100, the data line DT2 of the second sub-pixel 100, and the data line DT3 of the third sub-pixel 100.

As illustrated in FIG. 28 and FIG. 33, the first power supply connection line PL12, the data line DT1, the reference voltage connection line REF2, the data line DT2, the initialization connection line INT2, and the data line DT3 are sequentially arranged in the first direction X.

For example, as illustrated in FIG. 33, the orthographic projection of the first electrode E1 of the first sub-pixel 101 on the base substrate BS overlaps the orthographic projection of the first power supply connection line PL12 on the base substrate BS, the orthographic projection of the first electrode E1 of the second sub-pixel 102 on the base substrate BS overlaps the orthographic projection of the reference voltage connection line REF2 on the base substrate BS, and the orthographic projection of the first electrode E1 of the third sub-pixel 103 on the base substrate BS overlaps the orthographic projection of the initialization connection line INT2 on the base substrate BS, so as to reduce mutual interference between sub-pixels.

For example, as illustrated in FIG. 33, the area of the first electrode E1 of the first sub-pixel 101 is greater than the area of the first electrode E1 of the third sub-pixel 103, the area of the first electrode E1 of the third sub-pixel 103 is greater than the area of the first electrode E1 of the second sub-pixel 102, the width of the first power supply connection line PL12 is greater than the width of the initialization connection line INT2, and the width of the initialization connection line INT2 is greater than the width of the reference voltage connection line REF2. Generally, if the size of the first electrode E1 is large, then the size of the corresponding opening thereof is also large. Therefore, the larger the area of the first electrode E1, the larger the width of the DC signal line (the connecting line extending in the second direction Y) used for signal isolation.

In the embodiments of the present disclosure, the width of a component refers to the dimension perpendicular to the extension direction thereof. As illustrated in FIG. 28 and FIG. 33, the width of the first power supply connection line PL12, the width of the initialization connection line INT2, and the width of the reference voltage connection line REF2 all refer to the dimension of the corresponding component in the first direction X. The width of the first power supply connection line PL12, the width of the initialization connection line INT2, and the width of the reference voltage connection line REF2 may refer to the minimum width.

For example, as illustrated in FIG. 15, the third conductive pattern layer LY3 includes a data line DT. As illustrated in FIG. 27, the orthographic projection of the data line DT on the base substrate BS does not overlap the orthographic projection of the first electrode E1 on the base substrate BS. The first electrode E1 does not overlap the high-frequency data signal Vdt on the data line DT, thereby avoiding the influence of the high-frequency data signal Vdt on the first electrode E1 (node S). In this case, the display substrate may be a top-emitting structure.

For example, as illustrated in FIG. 3, FIG. 11, FIG. 12 and FIG. 24, the active layer SM includes the first electrode plate C11 of the first capacitor C1. The gate electrode T5g of the driving transistor T5 is connected to the first electrode plate C11 of the first capacitor C1. As illustrated in FIG. 10, the first conductive pattern layer LY1 includes a second electrode plate part Ca. As illustrated in FIG. 15, the third conductive pattern layer LY3 includes a first electrode plate part Cb. As illustrated in FIG. 11, FIG. 15 and FIG. 24, the first electrode plate part Cb is connected to the second electrode plate part Ca and the first electrode Ta of the fifth active part P5 through the first composite via hole V1, respectively, the first electrode plate part Cb is connected to the second electrode T3b of the third active part P3 through the first via hole Va, and the first electrode plate part Cb and the second electrode plate part Ca constitute the second electrode plate C12 of the first capacitor C1. That is, the second electrode plate C12 of the first capacitor C1 includes a first electrode plate part Cb and a second electrode plate part Ca. The embodiments of the present disclosure are described by taking as an example that the second electrode plate C12 of the first capacitor C1 includes a first electrode plate part Cb and a second electrode plate part Ca. The arrangement of the first electrode plate part Cb and the second electrode plate part Ca helps increase the capacitance of the first capacitor C1. In other embodiments, the second electrode plate C12 of the first capacitor C1 only includes one of the first electrode plate part Cb and the second electrode plate part Ca.

For example, as illustrated in FIG. 15, the third conductive pattern layer LY3 further includes a first connection electrode CEa. As illustrated in FIG. 11, FIG. 15 and FIG. 24, the first connection electrode CEa is connected to the first electrode T3a of the third active part P3 and the initialization signal line INT1 through the second composite via hole V2, respectively. For example, as illustrated in FIG. 15 and FIG. 24, the initialization connection line INT2 is connected to the first connection electrode CEa. As illustrated in FIG. 15 and FIG. 24, in the third sub-pixel 103, the initialization connection line INT2 and the first connection electrode CEa are of an integral structure.

For example, as illustrated in FIG. 15, the third conductive pattern layer LY3 further includes a second connection electrode CEb. As illustrated in FIG. 24, the second connection electrode CEb is connected to the first electrode of the second active part P2 and the reference voltage signal line REF1 through the third composite via hole V3, respectively. As illustrated in FIG. 15 and FIG. 24, the reference voltage connection line REF2 is connected to the second connection electrode CEb. As illustrated in FIG. 15 and FIG. 24, in the second sub-pixel 102, the reference voltage connection line REF2 and the second connection electrode CEb are of an integral structure.

For example, as illustrated in FIG. 15, the third conductive pattern layer LY3 further includes a third connection electrode CEc. As illustrated in FIG. 11, FIG. 12, FIG. 15 and FIG. 24, the third connection electrode CEc is connected to the gate electrode T5g of the driving transistor T5, the second electrode T1b of the first active part P1, the second electrode T2b of the second active part P1, and the first electrode plate C11 of the first capacitor C1 through the second via hole Vb, respectively.

For example, as illustrated in FIG. 15, the third conductive pattern layer LY3 further includes a fourth connection electrode CEd. As illustrated in FIG. 10, FIG. 11, FIG. 15 and FIG. 24, the fourth connection electrode CEd is connected to the first power supply signal line PL11 and the second electrode T4b of the fourth active part P4 through the fourth composite via hole V4, respectively. As illustrated in FIG. 15 and FIG. 24, the first power supply connection line PL12 is connected to the fourth connection electrode CEd. As illustrated in FIG. 15 and FIG. 24, in the first sub-pixel 101, the first power supply connection line PL12 and the fourth connection electrode CEd are of an integral structure.

For example, as illustrated in FIG. 15, the third conductive pattern layer LY3 further includes a fifth connection electrode CEe. As illustrated in FIG. 11, FIG. 15 and FIG. 24, one end of the fifth connection electrode CEe is connected to the second electrode T5b of the fifth active part P5 through the third via hole Vc, and the other end of the fifth connection electrode CEe is connected to the first electrode T4a of the fourth active part P4 through the fourth via hole Vd.

For example, as illustrated in FIG. 15, the third conductive pattern layer LY3 includes the data line DT. As illustrated in FIG. 24, the data line DT is connected to the first electrode T1a of the first active part P1 through the fifth via hole Ve.

For example, as illustrated in FIG. 10, FIG. 15 and FIG. 24, the initialization line INT includes the initialization signal line INT1, the reference voltage line REF includes the reference voltage signal line REF1, the first power supply line PL1 includes the first power supply signal line PL11, and each of the initialization signal line INT1, the reference voltage signal line REF1, and the first power supply signal line PL11 extends in the first direction X, and the initialization signal line INT1, the reference voltage signal line REF1, and the first power supply signal line PL11 are arranged in the second direction Y, the first direction X intersects with the second direction Y.

For example, as illustrated in FIG. 10, FIG. 15 and FIG. 24, the initialization line INT further includes an initialization connection line INT2, the reference voltage line REF further includes a reference voltage connection line REF2, the first power supply line PL1 further includes a first power supply connection line PL12, the initialization connection line INT2 is connected to the initialization signal line INT1, the reference voltage connection line REF2 is connected to the reference voltage signal line REF1, and the first power supply connection line PL12 is connected to the first power supply signal line PL11.

In the embodiments of the present disclosure, each of the initialization line INT, the reference voltage line REF, and the first power supply line PL1 is arranged by connecting horizontal wiring and vertical wiring, thus reducing resistance and voltage drop.

As illustrated in FIG. 28 and FIG. 33, the initialization line INT is shared by the first sub-pixel 101, the second sub-pixel 102, and the third sub-pixel 103.

As illustrated in FIG. 28 and FIG. 33, the reference voltage line REF is shared by the first sub-pixel 101, the second sub-pixel 102, and the third sub-pixel 103.

As illustrated in FIG. 28 and FIG. 33, the first power supply line PL1 is shared by the first sub-pixel 101, the second sub-pixel 102, and the third sub-pixel 103.

In the case where the first sub-pixel 101 is a red sub-pixel (R), the second sub-pixel 102 is a green sub-pixel (G), and the third sub-pixel 103 is a blue sub-pixel (B), the initialization line INT is shared by RGB, the reference voltage line REF is shared by RGB, and the first power supply line PL1 is shared by RGB.

As illustrated in FIG. 29 and FIG. 30, the component 301 is located in the first conductive pattern layer LY1, the component 302 is located in the active layer SM, and the component 303 is located in the third conductive pattern layer LY3. FIG. 30 also illustrates the buffer layer BF and the interlayer insulating layer ILD. The component 303 is connected to both the component 302 and the component 301 through the composite via hole V0. The composite via hole V0 helps improve connection stability and reliability. The composite via hole V0 can be any one of the first composite via hole V1, the second composite via hole V2, the third composite via hole V3, and the fourth composite via hole V4. Correspondingly, the component 301, the component 302, and the component 303 correspond to three corresponding components connected by the composite via hole.

As illustrated in FIG. 29 and FIG. 30, in the embodiments of the present disclosure, the component 303 located in the third conductive pattern layer LY3 realizes the connection of the component 301 located in the first conductive pattern layer LY1 and the component 302 located in the active layer SM through the composite via hole V0, or realizes the connection of the components located in the first conductive pattern layer LY1, or realizes the connection of the components in the active layer SM. The arrangement of the composite via hole V0 helps reduce the occupied area of the sub-pixel, facilitates the layout design, and improves the reliability of component connection. The composite via hole V0 may also be referred to as a nested hole or a composite nested hole. Of course, each composite via hole may also be directly referred to as a via hole.

FIG. 30 illustrates the buffer layer BF and the interlayer insulating layer ILD, and the composite via hole V0 includes a via hole V01 running through the buffer layer BF and a via hole V02 running through the interlayer insulating layer ILD. The size of the via hole V02 is greater than the size of the via hole V01. The orthographic projection of the via hole V01 on the base substrate falls within the orthographic projection of the via hole V02 on the base substrate.

For example, the via hole V02 may be formed prior to the via hole V01. That is, the interlayer insulating film is first etched so as to form the interlayer insulating layer ILD and the via hole V02 therein, and then the buffer film is etched so as to form the buffer layer BF and the via hole V01 therein.

As illustrated in FIG. 31, the display substrate includes a base substrate BS and an initialization signal line INT1 located on the base substrate BS. The initialization signal line INT1 is located on the first conductive pattern layer LY1, the buffer layer BF is located on the first conductive pattern layer LY1, the third active part P3 is located on the buffer layer BF, the third active part P3 is located in the active layer SM, a gate electrode insulating layer GI is located on the active layer SM, the third gate line G3 is located on the gate electrode insulating layer GI, the third gate line G3 is located in the second conductive pattern layer LY2, the interlayer insulating layer ILD is located on the second conductive pattern layer LY2, the first electrode plate part Cb and the first connection electrode CEa are located on the interlayer insulating layer ILD, the first electrode plate part Cb and the first connection electrode CEa are located in the third conductive pattern layer LY3, the passivation layer PVX is located on the third conductive pattern layer LY3, the planarization layer PLN is located on the passivation layer PVX, and the passivation layer PVX and the planarization layer PLN form an insulating layer ISL. The first electrode E1 is located on the insulating layer ISL and is connected to the first electrode plate part Cb through a via hole H1 running through the insulating layer ISL. The first electrode E1 is located in the fourth conductive pattern layer LY4. The pixel-defining layer PDL is located on the fourth conductive pattern layer LY4, and the pixel-defining layer PDL has an opening OPN. After forming the pixel-defining layer PDL, the light-emitting functional layer EL and the second electrode E2 are sequentially formed. The first electrode E1, the light-emitting functional layer EL, and the second electrode E2 constitute the light-emitting element 100b. One of the first electrode E1 and the second electrode E2 is an anode, and the other of the first electrode E1 and the second electrode E2 is a cathode. The encapsulation layer EC is configured to encapsulate the light-emitting element 100b. The filling layer FL is located on the encapsulation layer EC. As illustrated in FIG. 31, the display substrate further includes a black matrix BM and a color filter layer CF. As illustrated in FIG. 31, the display substrate further includes a cover plate CV.

As illustrated in FIG. 31, the pattern of the gate electrode insulating layer GI and the pattern of the second conductive pattern layer LY2 are the same, but are not limited thereto.

The embodiments of the present disclosure are described by taking as an example that the insulating layer ISL includes the passivation layer PVX and the planarization layer PLN, but are not limited thereto.

For example, the light-emitting functional layer EL includes a plurality of film layers, for example, including a light-emitting layer (light-emitting material layer), and the light-emitting functional layer may further include at least one of a hole injection layer, a hole transport layer, an electron transport layer, and an electron injection layer. The light-emitting functional layer can be selected as required.

Figure 13:
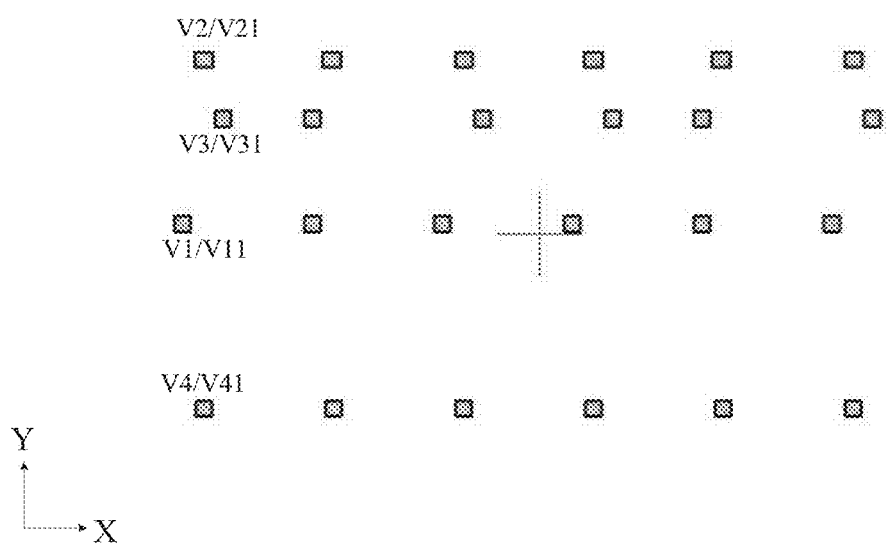

Referring to FIG. 13 and FIG. 31, the via hole CNT in FIG. 13 is a via hole running through the buffer layer BF. FIG. 13 illustrates the via hole V11 in the first composite via hole V1, the via hole V21 in the second composite via hole V2, the via hole V31 in the third composite via bole V3, and the via hole V41 in the fourth composite via hole V4.

Figure 14:
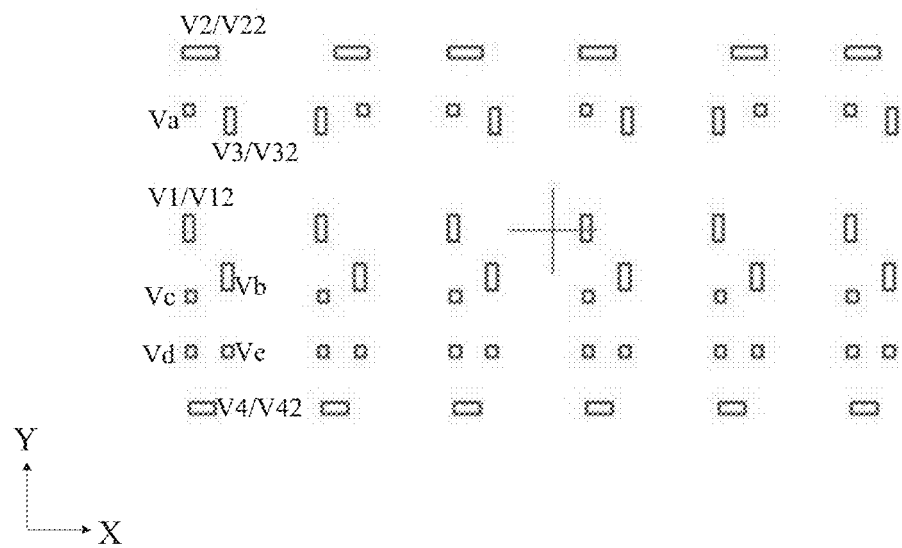

Referring to FIG. 14 and FIG. 31, the via holes in the interlayer insulating layer ILD are as illustrated in FIG. 14. FIG. 14 illustrates the first via hole Va, the second via hole Vb, the third via hole Vc, the fourth via hole Vd, the fifth via hole Vd, the via hole V12 in the first composite via hole V1, the via hole V22 in the second composite via hole V2, the via hole V32 in the third composite via hole V3, and the via hole V42 in the fourth composite via hole V4.

For the first composite via hole V1, the second composite via hole V2, the third composite via hole V3, and the fourth composite via hole V4, each of them is composed of the via hole running through the buffer layer BF in FIG. 13 and the via hole running through the interlayer insulating layer ILD at a corresponding position. FIG. 13 and FIG. 14 illustrate the first composite via hole V1, the second composite via hole V2, the third composite via hole V3, and the fourth composite via hole V4.

For example, composite via holes can be formed by multiple hole forming processes. Before forming the third conductive pattern layer LY3, the buffer layer BF and the interlayer insulating layer ILD are etched to form composite via boles, and the first via hole Va, the second via hole Vb, the third via hole Vc, the fourth via hole Vd, and the fifth via hole Vd are formed at the same time. For example, when forming a composite via hole, the interlayer insulating film can be etched first, and then the buffer film can be etched.

Figure 16:
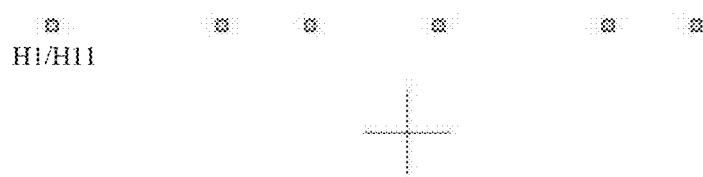
Figure 17:

Referring to FIG. 16 and FIG. 31, the via hole H11 runs through the passivation layer PVX. Referring to FIG. 17 and FIG. 31, the via hole H12 runs through the planarization layer PLN. The via hole H1 running through the insulating layer ISL (passivation layer PVX and planarization layer PLN) can be formed by multiple etching processes, but is not limited to this.

Referring to FIG. 16, FIG. 17 and FIG. 31, the via hole H1 includes a via hole H11 and a via hole H12. The orthographic projection of the via hole H11 on the base substrate overlaps the orthographic projection of the via hole H12 on the base substrate. The orthographic projection of the via hole H11 on the base substrate falls within the orthographic projection of the via hole H12 on the base substrate. The size of the via hole H12 is greater than the size of the via hole H11. The via hole H1 can also be referred to as a nested hole, a composite nested hole, or a composite via hole.

Referring to FIG. 16 and FIG. 17, the size of the via hole H11 in the passivation layer PVX is less than the size of the via hole H12 in the planarization layer PLN. The passivation layer PVX is made of an inorganic insulating material, and the planarization layer PLN is made of an organic insulating material.

FIG. 31 also illustrates the barrier dam DM. The barrier dam DM is located on the encapsulation layer EC.

For the display substrate in FIG. 32, no composite via hole is used, but the via hole V201 and the via hole V202 are used to connect the first connection electrode CEa, the third active part P3, and the initialization signal line INT1.

The node D, the node N, and the node S of the driving transistor T5 all have a floating state. Thus, the overlapping of the node D, the node N, and the node S of the sub-pixel with the AC signal are consistent or overlapping is avoided as much as possible, thus reducing the impact of noise. For example, at the node S of the third sub-pixel 101 (blue sub-pixel), the first electrode E1 does not overlap the data line DT.

As illustrated in FIG. 28 and FIG. 33, in the case where the PPI is high, the width of the vertical signal lines (initialization connection line INT2, reference voltage connection line REF2, and first power supply connection line PL12) located in the third conductive pattern layer LY3 is relatively small; upon realizing a mesh design, the horizontal portion is located in the first conductive pattern layer LY1, and can be connected to the via hole of the sub-pixel by directly using the components of the third conductive pattern layer LY3. Therefore, the via hole of the sub-pixel at this position needs to be close to the vertical signal line. For example, the reference voltage connection line REF2 is on the left side of the second sub-pixel (green sub-pixel) 102, and thus the via hole of the reset transistor T2 for connecting the reference voltage connection line REF2 is also on the left side. For the initialization connection line INT2 and the first power supply connection line PL12, a similar principle is also adopted for the connection via holes.

As illustrated in FIG. 28 and FIG. 33, the initialization line INT has a mesh structure, the reference voltage line REF has a mesh structure, and the first power supply line PL1 has a mesh structure.

Noise has a great impact on internal compensation circuits, and generally a relatively high consistency design of pixel circuits of sub-pixels is required. As illustrated in FIG. 28 and FIG. 33, one pixel PX (for example, including RGB) can be a repeat unit RP. The first sub-pixel 101, the second sub-pixel 102, and the third sub-pixel 103 constitute one pixel PX. That is, the repeat unit RP includes a first sub-pixel 101, a second sub-pixel 102, and a third sub-pixel 103. FIG. 28 and FIG. 33 illustrate two repeat units RP. As illustrated in FIG. 28 and FIG. 33, the initialization signal line INT1, the reference voltage signal line REF1, and the first power supply signal line PL11 are shared by a plurality of repeat units RP. As illustrated in FIG. 28 and FIG. 33, the initialization signal line INT1, the reference voltage signal line REF1, and the first power supply signal line PL11 may be shared by a plurality of repeat units RP in a row of sub-pixels 100.

As illustrated in FIG. 28, the edge of the opening OPN is racetrack-shaped, and as illustrated in FIG. 33, the edge of the opening OPN is rectangular. The shape of the opening OPN is not limited in the embodiments of the present disclosure, and can be determined as required.

For example, if the PPI is high and there are many signal lines which cannot be shared by multiple RGBs, the design of composite via holes can be used to realize connection of complex multi-signals.

It should be noted that the arrangement positions and arrangement methods of the initialization connection line INT2, the reference voltage connection line REF2, and the first power supply connection line PL12 are not limited to those illustrated in FIG. 28 and FIG. 33, and the positions can be adjusted as required.

Figure 34:
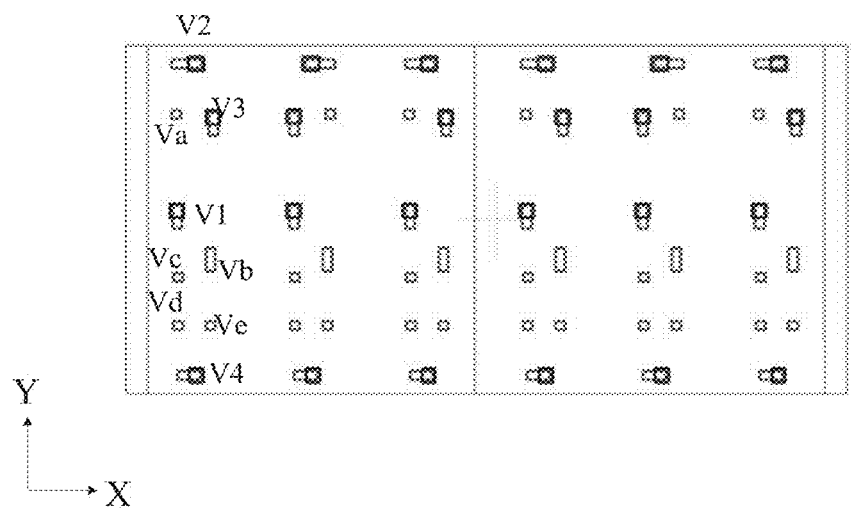
FIG. 34 is a plan view of via holes running through a buffer layer and a interlayer insulating layer of a display substrate provided by an embodiment of the present disclosure.

FIG. 34 is a plan view of via holes running through the buffer layer BF and the interlayer insulating layer ILD of a display substrate provided by an embodiment of the present disclosure. The via holes running through the buffer layer BF are represented by CNT. FIG. 34 illustrates the first via hole Va, the second via hole Vb, the third via hole Vc, the fourth via hole Vd, the fifth via hole Vd, the first composite via hole V1, the second composite via hole V2, the third composite via hole V3, and the fourth composite via hole V4.

Figure 35:
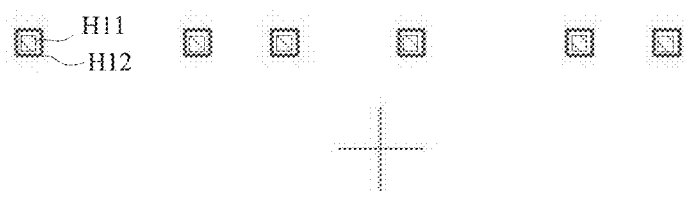
FIG. 35 is a plan view of via holes running through a passivation layer and a planarization layer of a display substrate provided by an embodiment of the present disclosure.

FIG. 35 is a plan view of a via hole running through the passivation layer PVX and the planarization layer PLN of a display substrate provided by an embodiment of the present disclosure. FIG. 35 illustrates the via hole H1, the via hole H11, and the via hole H12.

Figure 36:
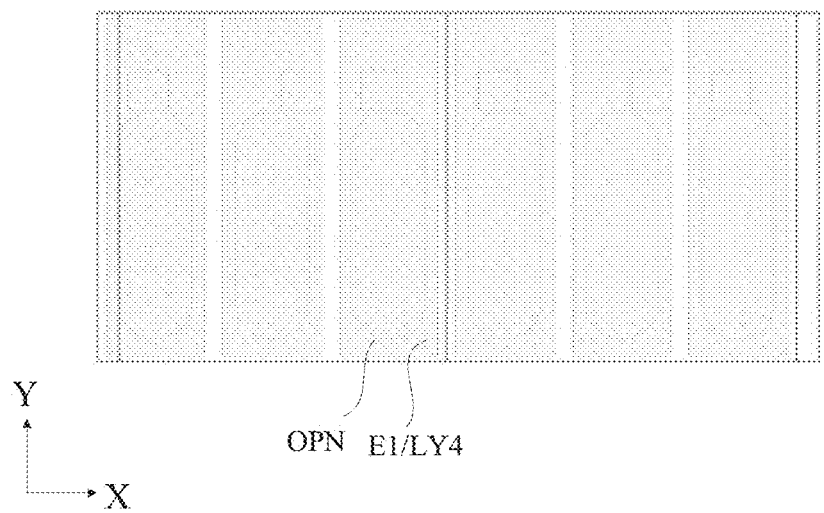
FIG. 36 is a stacked-layer diagram of a fourth conductive pattern layer and a pixel-defining layer of a display substrate provided by an embodiment of the present disclosure.

FIG. 36 is a stacked-layer diagram of the fourth conductive pattern layer LY4 and the pixel-defining layer PDL of a display substrate provided by an embodiment of the present disclosure.

Figure 37:
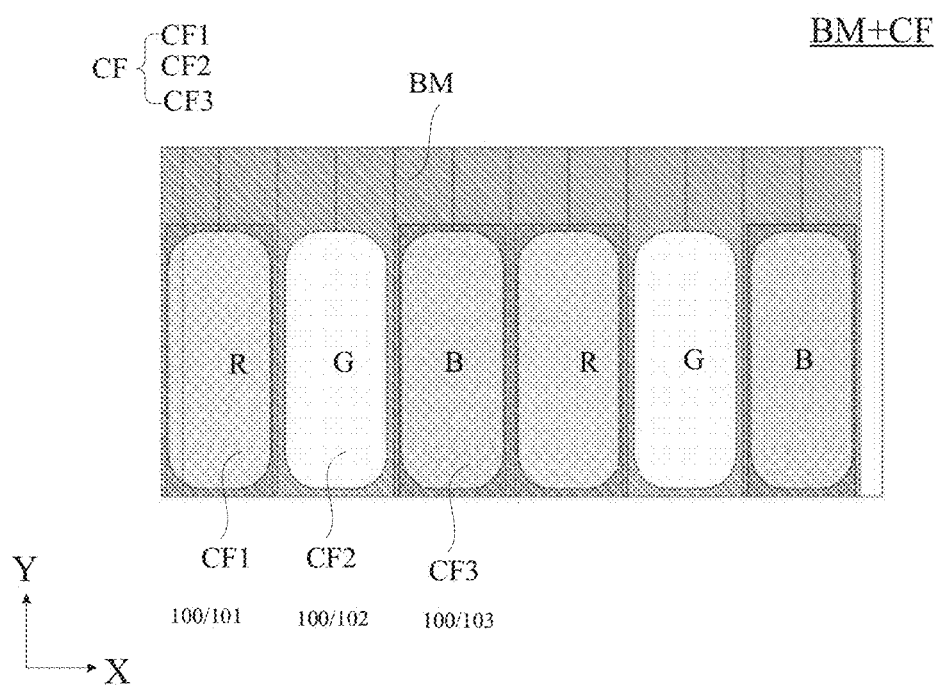
FIG. 37 is a stacked-layer diagram of a black matrix and a color filter layer of a display substrate provided by an embodiment of the present disclosure.

FIG. 37 is a stacked-layer diagram of a black matrix BM and a color filter layer CF of a display substrate provided by an embodiment of the present disclosure. FIG. 37 illustrates the first filter part CF1, the second filter part CF2, and the third filter part CF3. For example, the color filter layer CF is provided corresponding to the opening OPN. The first filter part CF1 is located in the first sub-pixel 101, the second filter part CF2 is located in the second sub-pixel 102, and the third filter part CF3 is located in the third sub-pixel 103. For example, the first filter part CF1 is configured to transmit the first color light, the second filter part CF2 is configured to transmit the second color light, and the third filter part CF3 is configured to transmit the third color light. For example, the first color light is red light, the second color light is green light, and the third color light is blue light. FIG. 37 illustrates six sub-pixels 100 in a row of sub-pixels.

In some embodiments, the first sub-pixel 101 may be referred to as a first color sub-pixel, the second sub-pixel 102 may be referred to as a second color sub-pixel, and the third sub-pixel 103 may be referred to as a third color sub-pixel.

For medium-sized display products, compared with external compensation, internal compensation bas advantages such as a simple driving system and a low cost, requires no expensive field programmable gate array (FPGA), application specific integrated circuit (ASIC), or a source driver for external compensation, and requires no bulky timing controller board (TCON board), and thus is more suitable for medium-sized products with a simple driving appearance.

Compared with an external compensation circuit, the pixel driving portion of an internal compensation pixel circuit is more complicated, and the layout of the sub-pixel will affect the compensation effect and has a crucial impact on the entire compensation design. Moreover, compared with an external compensation pixel circuit, an internal compensation pixel circuit requires more transistors to realize the compensation function. As a result, the layout space is more crowded, making it more difficult to realize a high-resolution design.

As illustrated in FIG. 25 to FIG. 28 and FIG. 31 to FIG. 33, the potential connection between the first electrode E1 of the light-emitting element 100b and the pixel circuit 100a depends on the via hole H1, and there is no planarization layer PLN at the position of the via hole H1. Generally, no opening OPN (i.e., light-emitting opening) of the pixel-defining layer PDL is provided at the position of the via hole H1. Thus, the position of the via hole H1 affects the opening design of the sub-pixel.

In general technology, the via hole H1 is generally designed at the position of the storage capacitor at about the middle of the sub-pixel. Such a design causes the overall opening of the sub-pixel to move down, that is, the orthographic projection of the via hole H1 covers the pixel circuit 100a of the sub-pixel in the next row. If the opening OPN still covers the sub-pixels of this row, the aperture ratio will be greatly reduced.

For the display substrate provided by the embodiments of the present disclosure, a great aperture ratio is obtained through a layout design and the impact of signal coupling between sub-pixels is avoided, thus improving display quality.

Figure 38:
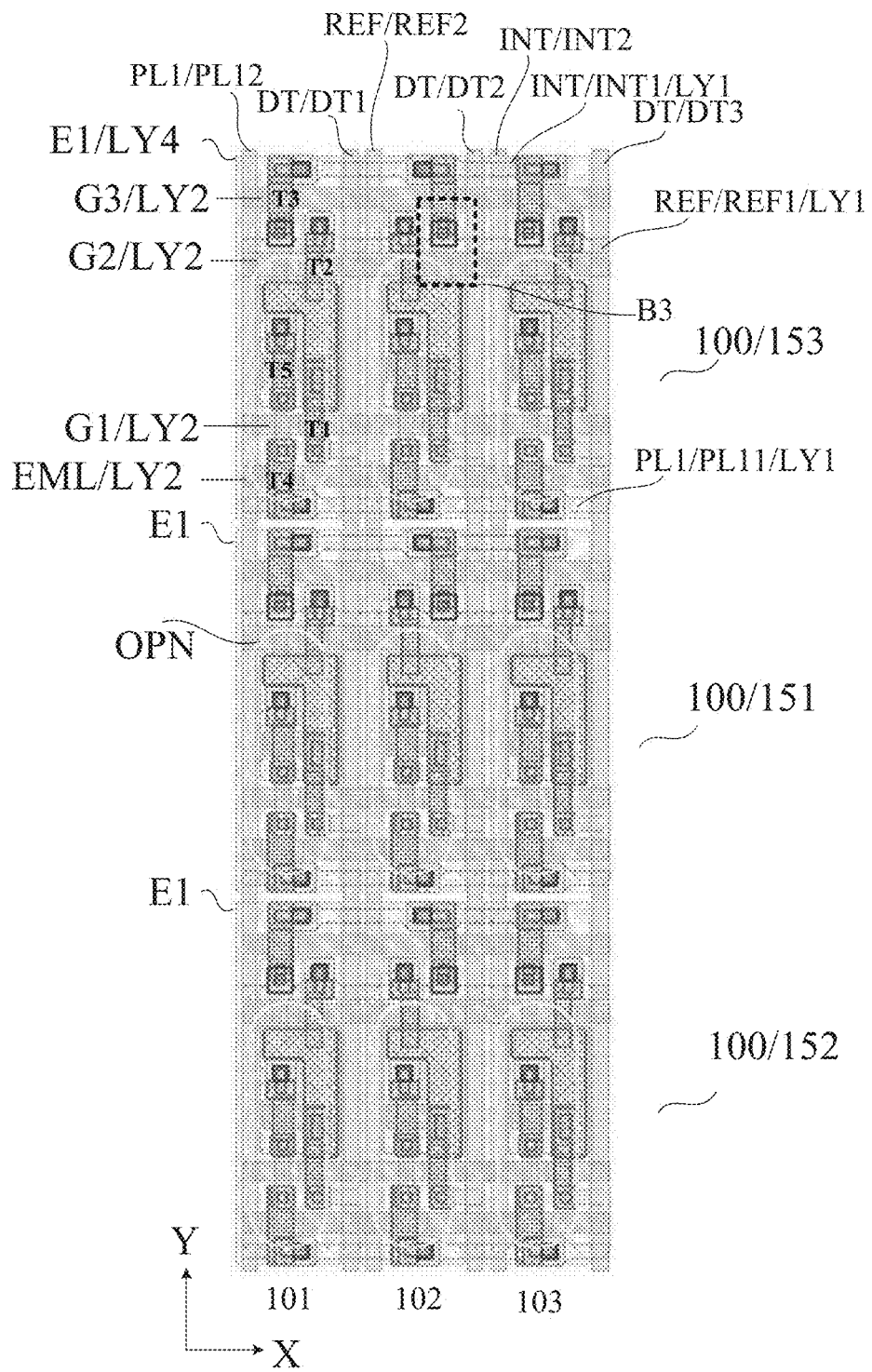
FIG. 38 is a layout diagram of a display substrate provided by an embodiment of the present disclosure.

FIG. 38 is a layout diagram of a display substrate provided by an embodiment of the present disclosure. As illustrated in FIG. 1, FIG. 3, and FIG. 10 to FIG. 38, the display substrate provided by an embodiment of the present disclosure includes a base substrate BS and a plurality of sub-pixels 100 located on the base substrate BS. Each of the sub-pixels 100 includes a pixel circuit 100a and a light-emitting element 100b. The light-emitting element 100b is electrically connected to the pixel circuit 100a. The pixel circuit 100a is configured to drive the light-emitting element 100b. The light-emitting element 100b includes a first electrode E1, a second electrode E2, and a light-emitting functional layer EL located between the first electrode E1 and the second electrode E2. The pixel circuit 100a includes a driving transistor T5, the first electrode E1 of the light-emitting element 100b is electrically connected to the first electrode of the driving transistor T5. The plurality of sub-pixels 100 includes a first sub-pixel 151 and a second sub-pixel 152. The first sub-pixel 151 and the second sub-pixel 152 are adjacent to each other, the orthographic projection of the first electrode E1 of the light-emitting element 100b of the first sub-pixel 151 on the substrate BS and the orthographic projection of the pixel circuit 100a of the second sub-pixel 152 on the base substrate BS do not overlap.

For example, for the internal compensation pixel circuit of 5T2C, during the display driving process, the node S is in a floating state for a period of time in the working state. The node S is easily affected by the alternating current (AC) signal when in the floating state, resulting in a written compensation voltage loss and affecting the compensation effect.

In the display substrate provided by the embodiments of the present disclosure, through the arrangement of the first electrode of the light-emitting element, the interference of other sub-pixels on the potential on the first electrode E1 of the light-emitting element 100b can be reduced, signal coupling between sub-pixels is avoided, the compensation effect of internal compensation is improved, and display quality is enhanced.

For example, as illustrated in FIG. 38, the orthographic projection of the first electrode E1 of the light-emitting element 100b on the base substrate BS only covers the orthographic projection of the pixel circuit 100a of its own sub-pixel 100 on the base substrate BS.

In the embodiments of the present disclosure, the first electrode E1 of the light-emitting element 100b of the sub-pixel only covers the pixel circuit 100a of its own sub-pixel and does not overlap the pixel circuits of other surrounding sub-pixels, thus avoiding the impact of signal coupling between sub-pixels. As illustrated in FIG. 18, FIG. 28, FIG. 33 and FIG. 38, each sub-pixel includes a first electrode E1 of the light-emitting element 100b. As can be seen from the figures, the projection relationship between the first electrode E1 of the light-emitting element 100b and the pixel circuit 100a therebelow is: the first electrode E1 of the light-emitting element 100b only covers the pixel circuit 100a of its own sub-pixel, and does not overlap other sub-pixels. The design of the first electrode E1 of the light-emitting element 100b can prevent the node S from overlapping the gate lines of the upper and lower rows of sub-pixels and prevent the formation of an overlapping capacitance therewith, so as to prevent coupling with the node S of the sub-pixel in the same row during the on and off processes of the upper and lower rows of gate lines and avoid a potential change of the node S, thereby compensating for the data loss.

For example, as illustrated in FIG. 38, the display substrate further includes a data line DT configured to provide the data signal Vdt to the pixel circuit 100a, and the first sub-pixel 151 and the second sub-pixel 152 are arranged along the extension direction of the data line DT. As illustrated in FIG. 38, the first sub-pixel 151 and the second sub-pixel 152 are arranged in the second direction Y.

For example, as illustrated in FIG. 38, the orthographic projection of the data line DT on the base substrate BS does not overlap the orthographic projection of the first electrode E1 of the light-emitting element 100b on the base substrate BS so as to avoid the impact of the AC signal on the data line DT on the first electrode E1 of the light-emitting element 100b and improve the display quality.

For example, as illustrated in FIG. 38, the plurality of sub-pixels 100 further include a third sub-pixel 153. The third sub-pixel 153 and the first sub-pixel 151 are adjacent to each other. The third sub-pixel 153, the first sub-pixel 151, and the second sub-pixel 152 are arranged along the extension direction of the data line DT. As illustrated in FIG. 38, the third sub-pixel 153, the first sub-pixel 151, and the second sub-pixel 152 are arranged in the second direction Y.

For example, as illustrated in FIG. 38, the orthographic projection of the first electrode E1 of the light-emitting element 100b of the first sub-pixel 151 on the base substrate BS and the orthographic projection of the pixel circuit 100a of the third sub-pixel 153 on the base substrate BS do not overlap. Therefore, the first electrode E1 of the light-emitting element 100b of each row of sub-pixels is not affected by the pixel circuits of the two adjacent rows of sub-pixels, thereby avoiding the impact of signal coupling between sub-pixels and improving display quality.

For example, as illustrated in FIG. 3, and FIG. 10 to FIG. 38, the pixel circuit 100a further includes a first capacitor C1. The first capacitor C1 has a first electrode plate C11 and a second electrode plate C12. The first electrode plate C11 of the first capacitor C1 is electrically connected to the gate electrode of the driving transistor T5. The second electrode plate C12 of the first capacitor C1 includes a first electrode plate part Cb. The first electrode plate part Cb is electrically connected to the first electrode of the driving transistor T5 and is connected to the first electrode E1 of the light-emitting element 100b. The first electrode E1 of the light-emitting element 100b is electrically connected to the first electrode plate part Cb of the first capacitor C1 in the pixel circuit 100a through the via hole (connection via hole) H1.

Figure 39:
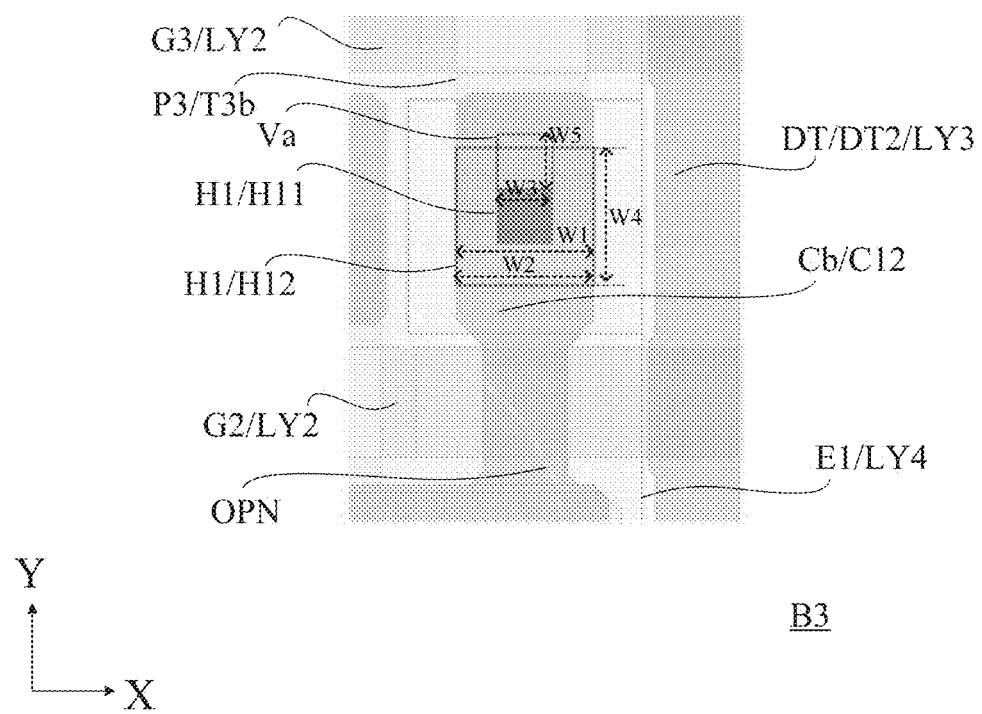
FIG. 39 is an enlarged view at the dotted box B3 in FIG. 28 or FIG. 38.
Figure 40:
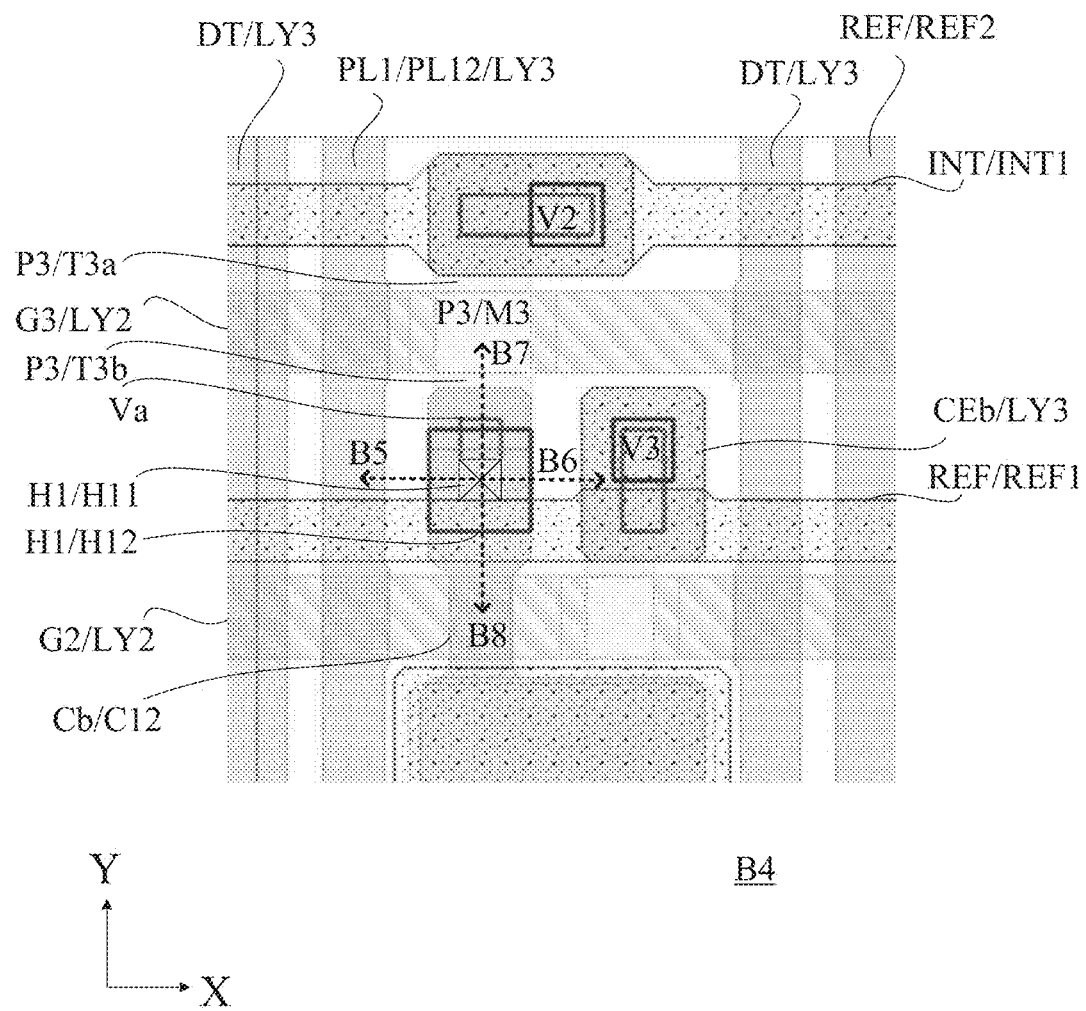
FIG. 40 is an enlarged view of the dotted box B4 in FIG. 26.
Figure 41:
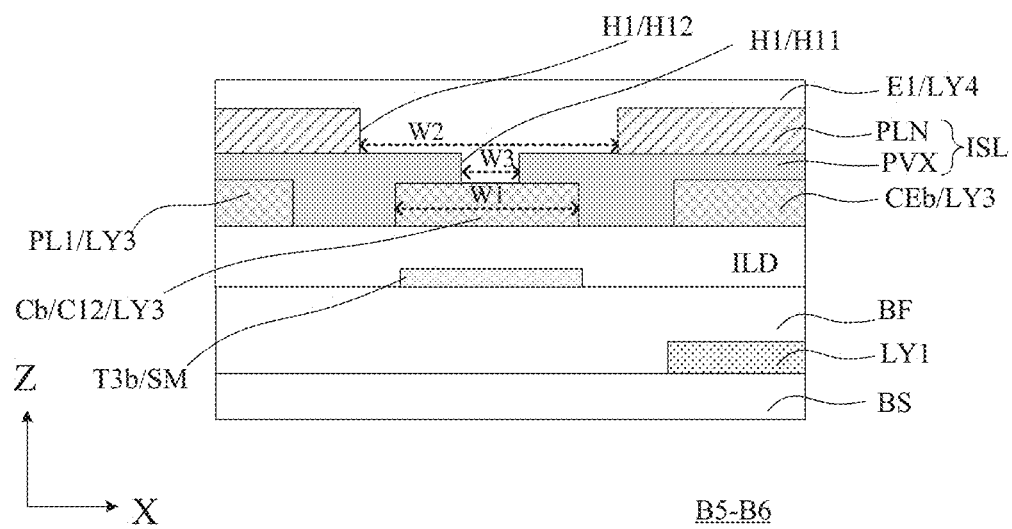
FIG. 41 is a cross-sectional view along the line B5-B6 of FIG. 40.
Figure 42:
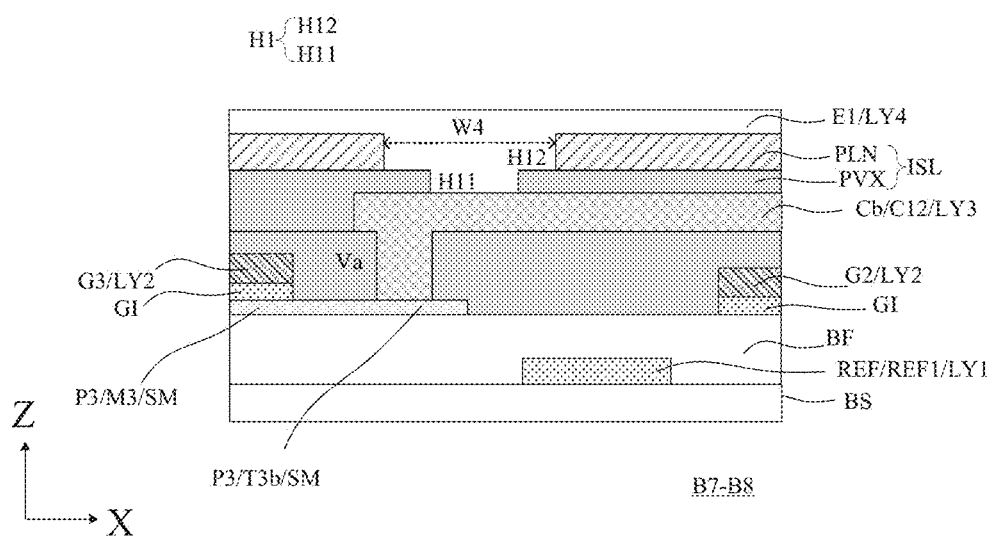
FIG. 42 is a cross-sectional view along the line B7-B8 of FIG. 40.
Figure 43:
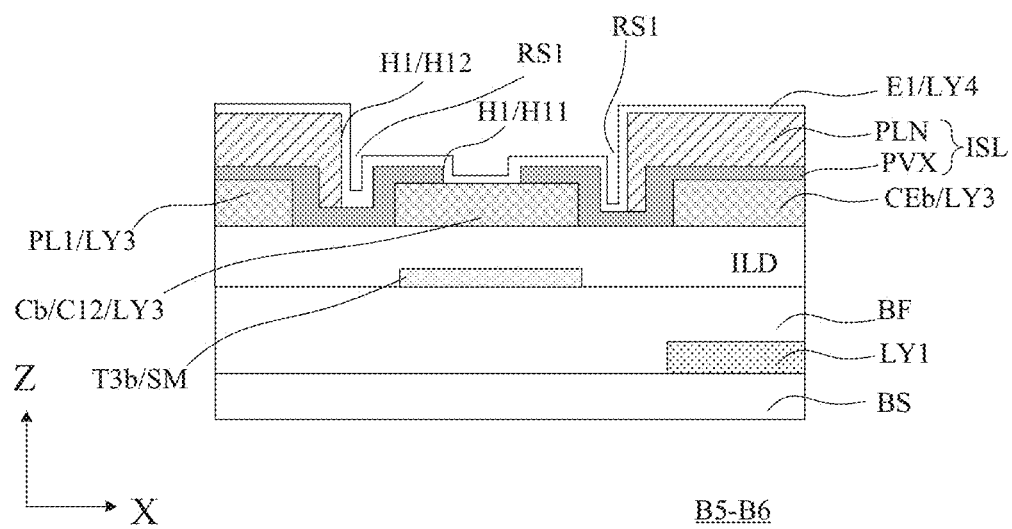
FIG. 43 is another cross-sectional view along the line B5-B6 of FIG. 40.
Figure 44:
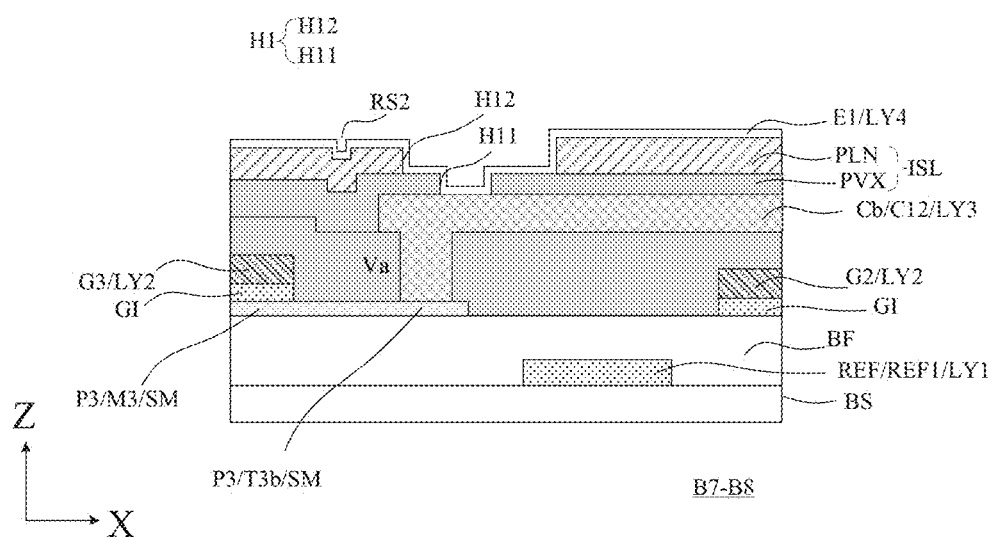
FIG. 44 is another cross-sectional view along the line B7-B8 of FIG. 40.
Figure 45:
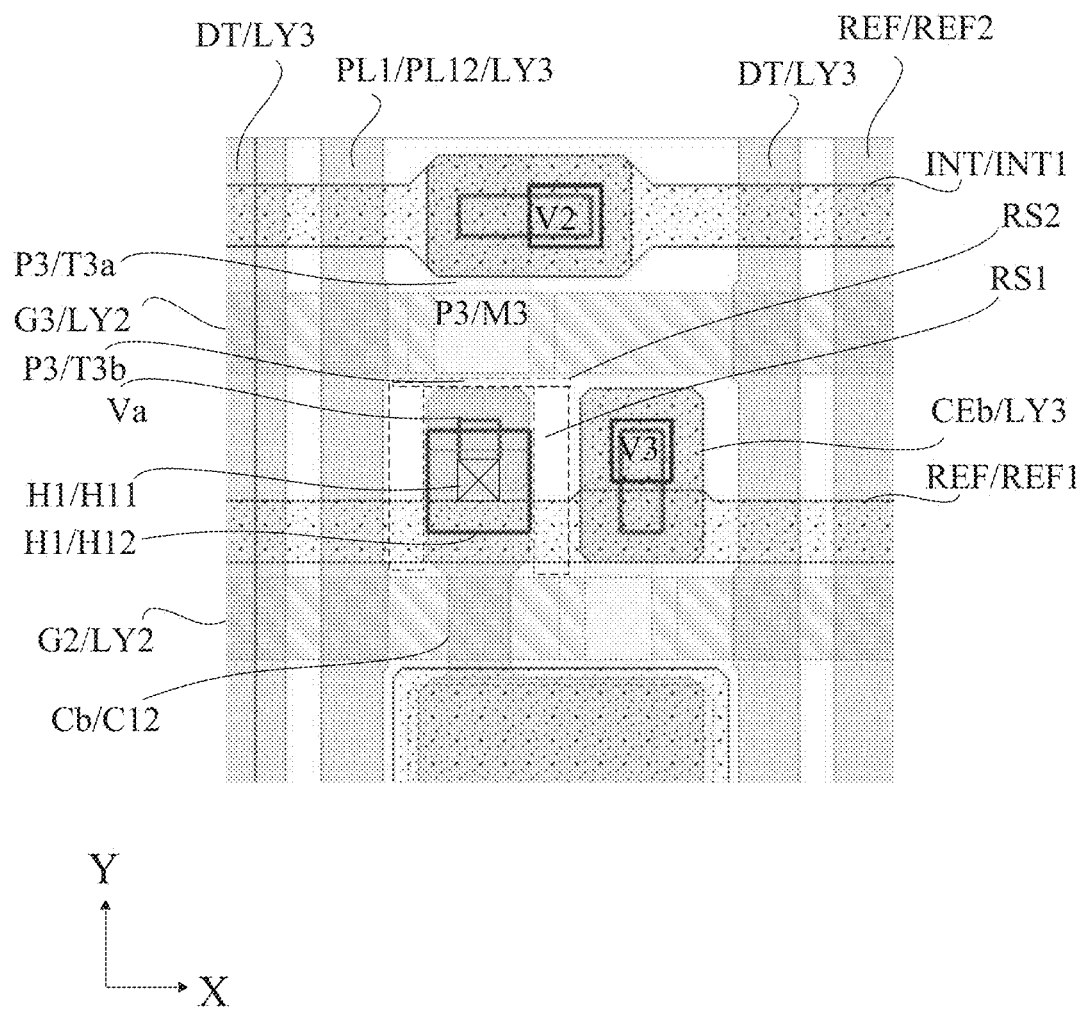
FIG. 45 is a partial view of a display substrate provided by an embodiment of the present disclosure.

FIG. 39 is an enlarged view of the dotted line box B3 in FIG. 28 or FIG. 38. FIG. 40 is an enlarged view of the dotted line box B4 in FIG. 26. FIG. 41 is a cross-sectional view along the line B5-B6 of FIG. 40. FIG. 42 is a cross-sectional view along the line B7-B8 of FIG. 40. FIG. 43 is another cross-sectional view along the line B5-B6 of FIG. 40. FIG. 45 is a partial view of a display substrate provided by an embodiment of the present disclosure. FIG. 44 is another cross-sectional view along the line B7-B8 of FIG. 40. FIG. 40 omits the first electrode E1 of the light-emitting element 100b, but illustrates the first electrode E1 in the corresponding cross-sectional view.

Figure 46:
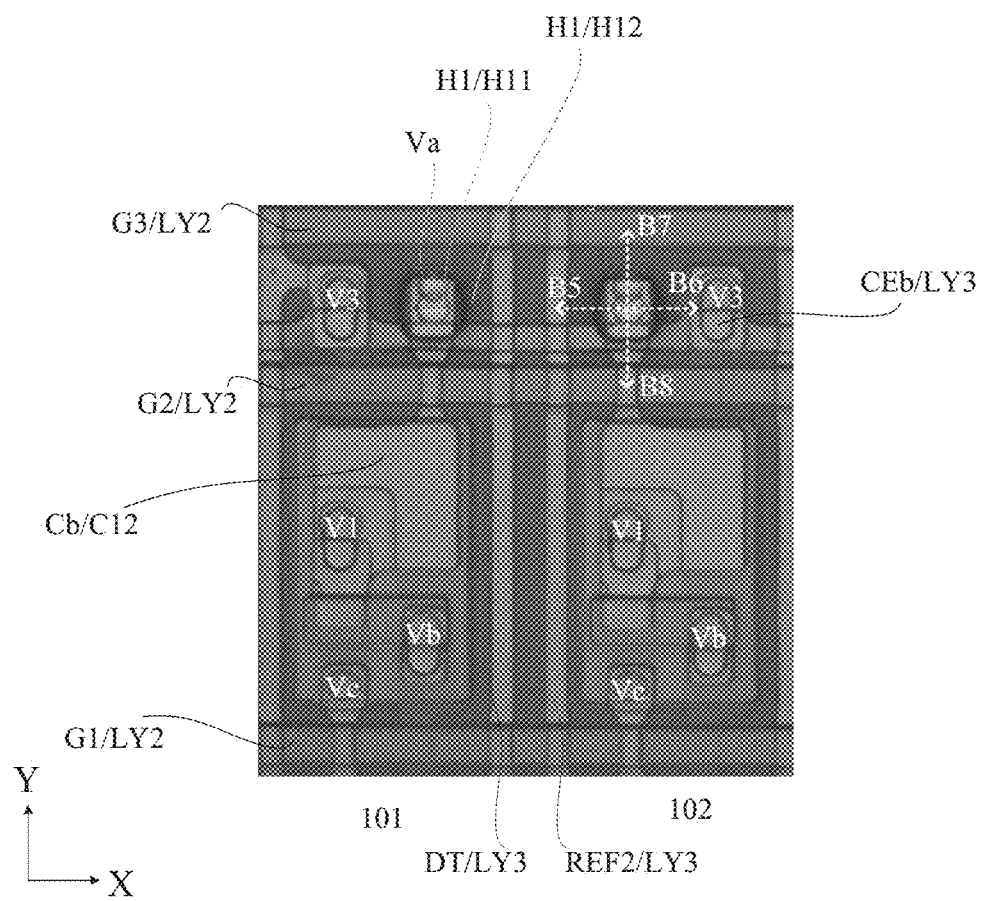
FIG. 46 is a microscope diagram of a display substrate provided by an embodiment of the present disclosure.
Figure 47:
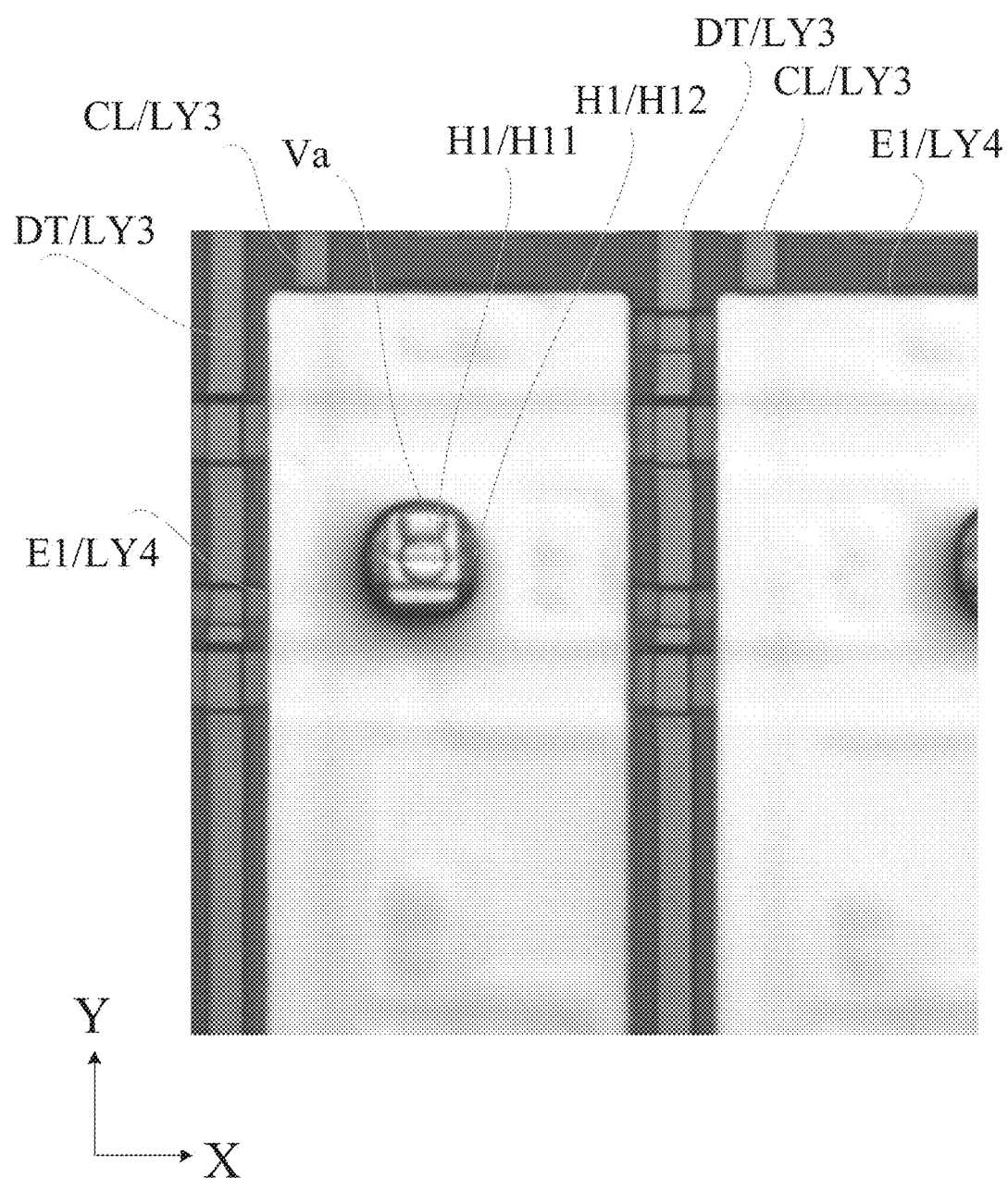
FIG. 47 is a microscope diagram of a display substrate provided by an embodiment of the present disclosure.
Figure 48:
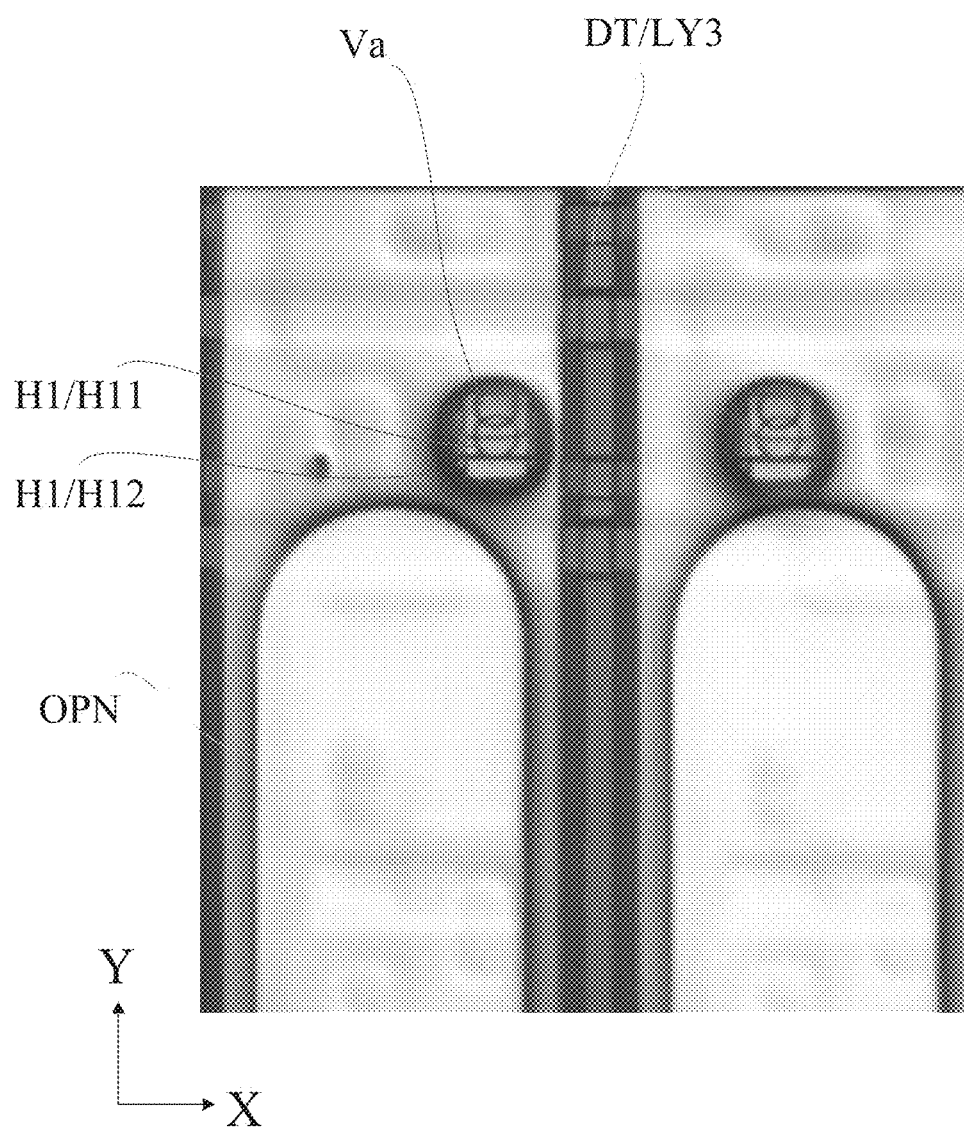
FIG. 48 is a microscope diagram of a display substrate provided by an embodiment of the present disclosure.

FIG. 46 is a microscope diagram of a display substrate provided by an embodiment of the present disclosure. FIG. 47 is a microscope diagram of a display substrate provided by an embodiment of the present disclosure. FIG. 48 is a microscope diagram of a display substrate provided by an embodiment of the present disclosure. FIG. 41 and FIG. 43 may also be cross-sectional views along the line B5-B6 of FIG. 46. FIG. 42 and FIG. 44 may also be cross-sectional views along the line B7-B8 of FIG. 46.

FIG. 46 does not illustrate the first electrode E1. FIG. 47 illustrates the first electrode E1. FIG. 48 illustrates the opening OPN of the pixel-defining layer.

For example, as illustrated in FIG. 10 to FIG. 48, the display substrate further includes a passivation layer PVX and a planarization layer PLN, and the via hole (connection via hole) H1 includes a via hole (first through hole) H11 located in the passivation layer PVX and a via hole (second through hole) H12 located in the planarization layer PLN, and the orthographic projection of the via hole (first through hole) H11 on the base substrate BS overlaps the orthographic projection of the via hole (second through hole) H12 on the base substrate BS.

For example, as illustrated in FIG. 41 to FIG. 48, the orthographic projection of the via hole (first through hole) H11 on the base substrate BS falls within the orthographic projection of the via hole (second through hole) H12 on the base substrate BS.

Regarding the via hole (connection via hole) H1, the via hole (first through hole) H11, and the via hole (second through hole) H12, reference may be made to what has been previously described, and no further detail will be given here.

For example, as illustrated in FIG. 11, FIG. 12, FIG. 26 to FIG. 28, FIG. 33, FIG. 38 to FIG. 40, FIG. 41, and FIG. 43, the driving transistor T5 includes a fifth active part P5, the gate electrode T5g of the driving transistor T5 extends in the first direction X, the fifth active part P5 of the driving transistor TS extends in the second direction Y, and the first direction X intersects with the second direction Y. As illustrated in FIG. 41, FIG. 43, and FIG. 46 to FIG. 48, in order to facilitate the realization of a high PPI layout design, the size W1 of the first electrode plate part Cb in the first direction X at the via hole (connection via hole) H1 is less than the size W2 of the via hole (second through hole) H12 in the first direction X.

The display substrate provided by the embodiments of the present disclosure provides a design scheme for the connection via hole (lap-contact hole) between the first electrode of the light-emitting element and the pixel circuit. Through the adjustment of the placement position and size design of the connection via hole (lap-contact bole), the first electrode of the light-emitting element of the sub-pixel is formed at the best position so as to obtain the best compensation effect.

In the display substrate provided by the embodiments of the present disclosure, the narrowing of the portion of the first electrode plate part Cb at the via hole (connection via hole) H1 facilitates the layout of various components in the third conductive pattern layer LY3 and helps realize a high PPI layout design.

As illustrated in FIG. 40, FIG. 41, FIG. 43, and FIG. 46 to FIG. 48, the size W1 of the first electrode plate part Cb in the first direction X at the via hole (connection via hole) H1 is greater than the size W3 of the via hole (first through hole) H11 in the first direction X so as to facilitate lap-contact of the first electrode plate part Cb and the first electrode E1. The orthographic projection of the via hole (first through hole) H11 on the base substrate completely falls within the orthographic projection of the first electrode plate part Cb on the base substrate.

FIG. 41 illustrates the size W1, the size W2, and the size W3. FIG. 42 illustrates the size W4. For the sake of clarity, size is not indicated in some figures.

The design scheme for the connection via hole (lap-contact hole) between the first electrode of the light-emitting element and the pixel circuit in the display substrate provided by the embodiments of the present disclosure can reduce the interference of other sub-pixels on the potential on the first electrode E1 of the light-emitting element 100b and improve the compensation effect of internal compensation.

For example, as illustrated in FIG. 39, FIG. 40, FIG. 42 and FIG. 44, the size of the first electrode plate part Cb in the second direction Y at the via hole (connection via hole) H1 is greater than the size W4 of the via hole (second through hole) H12 in the second direction Y.

For example, as illustrated in FIG. 24 to FIG. 28, FIG. 39, FIG. 40, FIG. 42 and FIG. 44, the display substrate further includes an initialization line INT, the pixel circuit 100a further includes a reset transistor T3, the reset transistor T3 is configured to reset the first electrode E1 of the light-emitting element 100b, the first electrode of the reset transistor T3 is connected to the initialization line INT, and the first electrode plate part Cb of the second electrode plate C12 of the first capacitor C1 is connected to the second electrode of the reset transistor T3 through the first via hole Va.

For example, as illustrated in FIG. 39, FIG. 40, FIG. 42 and FIG. 44, in order to facilitate connection of components, the size W4 of the via hole (second through hole) H12 in the second direction Y is greater than the size W5 (as illustrated in FIG. 39) of the first via hole Va in the second direction Y.

For example, as illustrated in FIG. 39 and FIG. 40, in order to facilitate layout design, the orthographic projection of the via hole (second through hole) H12 on the base substrate BS at least partially overlaps the orthographic projection of the first via hole Va on the base substrate BS.

For example, as illustrated in FIG. 39 and FIG. 40, in order to facilitate layout design, the orthographic projection of the first via hole Va on the base substrate BS overlaps the orthographic projection of the via hole (second through hole) H12 on the base substrate BS. For example, in some embodiments, the orthographic projection of the first via hole Va on the base substrate BS completely falls within the orthographic projection of the via hole (second through hole) H12 on the base substrate BS. That is, the orthographic projection of the via hole (second through hole) H12 on the base substrate BS covers the orthographic projection of the first via hole Va on the base substrate BS.

For example, as illustrated in FIG. 12, FIG. 15, and FIG. 24, the gate electrode T5g of the driving transistor T5 is connected to the first electrode plate C11 of the first capacitor C1, and the first electrode plate C11 of the first capacitor C1 is closer to the base substrate BS than the first electrode plate part Cb of the second electrode plate C12 of the first capacitor C1. The second conductive pattern layer LY2 is formed prior to the third conductive pattern layer LY3, that is, the second conductive pattern layer LY2 is closer to the base substrate than the third conductive pattern layer LY3.

For example, as illustrated in FIG. 10, FIG. 12 and FIG. 15, the second electrode plate C12 of the first capacitor C1 further includes a second electrode plate part Ca, and the second electrode plate part Ca is closer to the base substrate BS than the first electrode plate C11. As illustrated in FIG. 10 to FIG. 28, the first electrode plate part Cb of the second electrode plate C12 is connected to the second electrode plate part Ca and the first electrode of the driving transistor T5 through the same via hole (first composite via hole V1), respectively.

For example, as illustrated in FIG. 10, FIG. 12 and FIG. 15, the second electrode plate C12 of the first capacitor C1 further includes a second electrode plate part Ca, the second electrode plate part Ca is located on the side of the first electrode plate C12 of the first capacitor C1 close to the base substrate, and the first electrode plate part Cb is located on the side of the first electrode plate C11 of the first capacitor C1 away from the base substrate. As illustrated in FIG. 10 to FIG. 28, the first electrode plate part Ca of the second electrode plate C12 is connected to the second electrode plate part Ca and the first electrode T5a of the driving transistor T5 through the same composite via hole (first composite via hole V1), respectively.

For example, as illustrated in FIG. 43 and FIG. 45, the first electrode E1 of the light-emitting element 100b has first recesses RS1 at opposite sides in the first direction X at the via hole (connection via hole) H1, respectively.

For example, as illustrated in FIG. 44 and FIG. 45, the gate electrode of the reset transistor T3 is connected to the third gate line G3, and the portion of the first electrode E1 of the light-emitting element 100b between the first via hole Va and the third gate line G3 has a second recess RS2.

For example, as illustrated in FIG. 3, the pixel circuit 100a further includes a data writing transistor T1, a reset transistor T2, and a light-emitting control transistor T4, the data writing transistor T1 is configured to write the data signal Vdt into the gate electrode T5g of the driving transistor T5 in response to the first scan signal SCAN1, the reset transistor T2 is configured to reset the gate electrode T5g of the driving transistor T5, and the light-emitting control transistor T4 is configured to transmit the first power supply voltage ELVDD to the second electrode of the driving transistor T5 in response to the light-emitting control signal EM. Of course, the number of transistors and the number of storage capacitors in the pixel circuit 100a in the embodiments of the present disclosure can be determined as required, and are not limited to those illustrated in the figure.

In FIG. 46, the first via hole Va is approximately circular, and the via hole (first through hole) H11 and the via hole (second through hole) H12 are also approximately circular. The shape of each via hole is not limited in the embodiments of the present disclosure. The via hole can be in the shape of a rectangle, a circle, an ellipse, a rounded rectangle, or the like.

In the embodiments of the present disclosure, the via hole H1 is provided at the second electrode T3b of the reset transistor T3, and is adjacent to the first via hole Va (the connection via hole between the first electrode plate part Cb and the second electrode T3b of the reset transistor T3). As illustrated in FIG. 25 to FIG. 28, FIG. 31 to FIG. 33, and FIG. 38, the first electrode plate part Cb and the second electrode T3b of the reset transistor T3 are connected through the first via hole Va, the first via hole Va is used to connect the second electrode T3b located in the semiconductor layer SM and the first electrode plate part Cb located in the third conductive pattern layer LY3, the via hole H1 includes a via hole H11 and a via hole H12, and the via hole H11 and the via hole H12 form a nested hole, that is, the via hole H1 can be referred to as a nested hole. The via hole H1 is used to connect the first electrode plate part Cb located in the third conductive pattern layer LY3 and the first electrode E1 located in the fourth conductive pattern layer LY4. The via hole H11 runs through the passivation layer PVX, and the via hole H12 runs through the planarization layer PLN.

In a general design, the two conductive components connected by via holes need to ensure that after etching is completed, the sizes of the two conductive components are both greater than the sizes of the via holes, that is, the two conductive components wrap the via holes. When the pixel resolution is high, the maximum size of the pattern is often limited. As illustrated in FIG. 25 to FIG. 28, FIG. 31 to FIG. 33, and FIG. 38, at the node S, in the third conductive pattern layer LY3, the first electrode plate part Cb is limited by the conductive elements (for example, the first power supply connection line PL12 and the data line DT) on the left and right sides of the first electrode plate part Cb, and the size thereof cannot be too large. Therefore, in the embodiments of the present disclosure, the via hole H1 is designed so that in the completed display substrate, at the via hole H1, the size of the first electrode plate part Cb in the first direction X is less than the size of the via hole H12 in the first direction X, and the size of the first electrode plate part Cb in the second direction Y is greater than the size of the via hole H12 in the second direction Y. For example, after manufacturing, the first via hole Va will also be wrapped in the via hole H12, resulting in a high overall space utilization and meeting the design requirements of high-resolution or complex pixel circuits.

After the actual manufacturing, the microscope diagrams of the via hole H1 are illustrated in FIG. 46 to FIG. 48. The first electrode E1 is manufactured after the first electrode plate part Cb and the via hole H1 are manufactured. As illustrated in FIG. 43 and FIG. 45, it can be seen that the first electrode E1 has small recesses (grooves, first recesses RS1) on the left and right sides of the via hole H1. As illustrated in FIG. 43, the recesses are formed because there is no material of third conductive pattern layer LY3 and no material of planarization layer PLN in this area. At the same time, there is also a recess (second recess RS2, a groove) formed by the first via bole Va on the upper side of the via hole H1. Therefore, the first electrode E1, after many times of climbing at these three point positions, may have a certain impact on the lap-contact effect. However, the portion of the first electrode E1 located on the lower side of the via hole H1 is of normal lap-contact. The first electrode E1, climbing through the via hole H1, can ensure the connection between the first electrode E1 and the pixel circuit. Through the above design, the potential of the first electrode E1 is connected normally, space is greatly saved, and the design of a high-resolution internal compensation pixel circuit is made possible.

Practical applications are not limited to the above lap-contact methods, and unilateral lap-contact or multilateral lap-contact can be selected according to actual pixel conditions.

For example, the material used to form the active layer may include an oxide semiconductor or the like. For example, the oxide semiconductor includes a metal oxide semiconductor. For example, the metal oxide semiconductor includes indium gallium zinc oxide (IGZO). No limitation is made in this regard in the embodiments of the present disclosure. It should be noted that the first electrode and the second electrode on both sides of the channel may be regions doped with n-type impurities or p-type impurities, and no limitation is made thereto in the embodiments of the present disclosure.

For example, the base substrate BS, the buffer layer BL, the gate electrode insulating layer GI, the interlayer insulating layer ILD, the passivation layer PVX, the planarization layer PLN, and the pixel-defining layer PDL are all made of insulating materials. For example, the base substrate BS includes flexible materials such as polyimides, but is not limited thereto. At least one of the buffer layer BF, the gate electrode insulating layer GI, the interlayer insulating layer ILD, and the passivation layer PVX is made of an inorganic insulating material or an organic insulating material. For example, inorganic insulating materials include silicon oxide, silicon nitride, silicon oxynitride, etc., and organic insulating materials include resin, but are not limited thereto. For example, the pixel-defining layer PDL and the planarization layer PLN can be made of organic materials, for example, the organic materials include resin, but are not limited thereto.

For example, the first conductive pattern layer LY1, the second conductive pattern layer LY2, and the third conductive pattern layer LY3 are all made of metal materials, and the specific materials can be determined as required. For example, the material of the first conductive pattern layer LY1 or the second conductive pattern layer LY2 includes molybdenum (Mo), but is not limited thereto. The material of the third conductive pattern layer LY3 includes titanium (Ti) and aluminum (Al), and can be of a three-layer (Ti/Al/Ti) stacked structure, but is not limited thereto.

For example, the material of the first electrode E1 of the light-emitting element includes silver (Ag) and indium tin oxide (ITO). For example, the first electrode E1 of the light-emitting element has a three-layer (ITO/Ag/ITO) stacked structure, but is not limited thereto.

For example, the second electrode E2 of the light-emitting element may be a low work function metal, and at least one of magnesium and silver may be used, but is not limited thereto.

In some embodiments, the reset transistor T2 may be referred to as the first reset transistor T2 and the reset transistor T3 may be referred to as the second reset transistor T3, but is not limited thereto. In other embodiments, the reset transistor T2 may be referred to as the second reset transistor T2, and the reset transistor T3 may be referred to as the first reset transistor T3, but is not limited thereto.

Of course, the first gate line G1, the second gate line G2, and the third gate line G3 may also be referred to as the gate line G1, the gate line G2, and the gate line G3 respectively. That is, the ordinal numeral before each component is only for the convenience of distinguishing different components, and the ordinal numeral before each component can also be adjusted as required. For other situations, reference can be made thereto, and no further detail will be given here.

For example, the display substrate provided by the embodiments of the present disclosure may form a display device. For example, the display device includes any product or component with a display function such as a television, a digital camera, a mobile phone, a watch, a tablet computer, a laptop or a navigator including the above-mentioned display substrate.

In the embodiments of the present disclosure, components located in the same layer may be formed from the same film layer through the same patterning process. For example, components located in the same layer may be located on a surface of the same component away from the base substrate.

It should be noted that, for the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching step, or may include other processes for forming predetermined patterns such as printing and ink-jetting. The photolithography process refers to the process including film formation, exposure, development, etc., by using photoresist, mask plate, exposure machine, etc. to form patterns. The corresponding patterning process can be selected according to the structure formed in the embodiment of the present disclosure.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A display substrate, comprising a base substrate and a plurality of sub-pixels located on the base substrate,
   wherein the sub-pixel comprises a pixel circuit and a light-emitting element, the light-emitting element is electrically connected to the pixel circuit, the pixel circuit is configured to drive the light-emitting element, and the light-emitting element comprises a first electrode, a second electrode, and a light-emitting functional layer located between the first electrode and the second electrode;
   the pixel circuit comprises a driving transistor, and the first electrode of the light-emitting element is electrically connected to a first electrode of the driving transistor;
   the plurality of sub-pixels comprise a first sub-pixel and a second sub-pixel, the first sub-pixel is adjacent to the second sub-pixel, and an orthographic projection of the first electrode of the light-emitting element of the first sub-pixel on the base substrate does not overlap an orthographic projection of the pixel circuit of the second sub-pixel on the base substrate.

2. The display substrate according to claim 1, wherein the orthographic projection of the first electrode of the light-emitting element on the base substrate only covers an orthographic projection of the pixel circuit of its own sub-pixel on the base substrate.

3. The display substrate according to claim 1, further comprising a data line, wherein the data line is configured to provide a data signal to the pixel circuit, and the first sub-pixel and the second sub-pixel are arranged along an extending direction of the data line.

4. The display substrate according to claim 3, wherein an orthographic projection of the data line on the base substrate does not overlap the orthographic projection of the first electrode of the light-emitting element on the base substrate.

5. The display substrate according to claim 3, wherein the plurality of sub-pixels further comprise a third sub-pixel, the third sub-pixel is adjacent to the first sub-pixel, and the third sub-pixel, the first sub-pixel, and the second sub-pixel are arranged along the extending direction of the data line,
   the orthographic projection of the first electrode of the light-emitting element of the first sub-pixel on the base substrate does not overlap an orthographic projection of the pixel circuit of the third sub-pixel on the base substrate.

6. The display substrate according to claim 1, wherein the pixel circuit further comprises a first capacitor, the first capacitor has a first electrode plate and a second electrode plate, the first electrode plate of the first capacitor is electrically connected to a gate electrode of the driving transistor, the second electrode plate of the first capacitor comprises a first electrode plate part, the first electrode plate part is electrically connected to the first electrode of the driving transistor and connected to the first electrode of the light-emitting element, and the first electrode of the light-emitting element is electrically connected to the first electrode plate part of the first capacitor in the pixel circuit through a connection via hole.

7. The display substrate according to claim 6, further comprising a passivation layer and a planarization layer, wherein the connection via hole comprises a first through hole located in the passivation layer and a second through hole located in the planarization layer, and an orthographic projection of the first through hole on the base substrate overlaps an orthographic projection of the second through hole on the base substrate.

8. The display substrate according to claim 7, wherein the orthographic projection of the first through hole on the base substrate falls within the orthographic projection of the second through hole on the base substrate.

9. The display substrate according to claim 6, wherein the driving transistor comprises an active part, the gate electrode of the driving transistor extends in a first direction, the active part of the driving transistor extends in a second direction, the first direction intersects with the second direction, and a size of the first electrode plate part in the first direction at the connection via hole is less than a size of the second through hole in the first direction.

10. The display substrate according to claim 9, wherein a size of the first electrode plate part in the second direction at the connection via hole is greater than a size of the second through hole in the second direction.

11. The display substrate according to claim 9, further comprising an initialization line, wherein the pixel circuit further comprises a first reset transistor, the first reset transistor is configured to reset the first electrode of the light-emitting element, a first electrode of the first reset transistor is connected to the initialization line, and the first electrode plate part of the first capacitor is connected to a second electrode of the first reset transistor through a first via hole.

12. The display substrate according to claim 11, wherein a size of the second through hole in the second direction is greater than a size of the first via hole in the second direction.

13. The display substrate according to claim 11, wherein the orthographic projection of the second through hole on the base substrate at least partially overlaps an orthographic projection of the first via hole on the base substrate.

14. The display substrate according to claim 11, wherein the orthographic projection of the second through hole on the base substrate covers the orthographic projection of the first via hole on the base substrate.

15. The display substrate according to claim 6, wherein the second electrode plate of the first capacitor further comprises a second electrode plate part, the second electrode plate part is located on a side of the first electrode plate of the first capacitor close to the base substrate, the first electrode plate part is located on a side of the first electrode plate of the first capacitor away from the base substrate, the first electrode plate part of the second electrode plate is connected to the second electrode plate part and the first electrode of the driving transistor through the same composite via hole, respectively.

16. The display substrate according to claim 6, wherein the first electrode of the light-emitting element has first recesses at two opposite sides in the first direction at the connection via hole, respectively.

17. The display substrate according to claim 11, wherein a gate electrode of the first reset transistor is connected to a gate line, and a portion of the first electrode of the light-emitting element between the first via hole and the gate line has a second recess.

18. The display substrate according to claim 1, wherein the pixel circuit further comprises a data writing transistor, a second reset transistor, and a light-emitting control transistor, the data writing transistor is configured to write a data signal into a gate electrode of the driving transistor in response to a first scan signal, the second reset transistor is configured to reset the gate electrode of the driving transistor, and the light-emitting control transistor is configured to transmit a first power supply voltage to a second electrode of the driving transistor in response to a light-emitting control signal.

19. The display substrate according to claim 1, further comprising: an initialization line, a reference voltage line, a first power supply line, and a pixel-defining layer, wherein the initialization line is configured to provide an initialization voltage to the sub-pixel, the reference voltage line is configured to provide a reference voltage to the sub-pixel, and the first power supply line is configured to provide a first power supply voltage to the sub-pixel, the initialization line comprises an initialization signal line and an initialization connection line, the reference voltage line comprises a reference voltage signal line and a reference voltage connection line, and the first power supply line comprises a first power supply signal line and a first power supply connection line, the initialization connection line is connected to the initialization signal line, the reference voltage connection line is connected to the reference voltage signal line, and the first power supply connection line is connected to the first power supply signal line;

the first power supply connection line, the reference voltage connection line, and the initialization connection line are arranged in a first direction, and each of the initialization connection line, the reference voltage connection line, and the first power supply connection line extends in a second direction;

the pixel-defining layer has a plurality of openings, each of the plurality of openings is configured to expose at least a portion of the first electrode of the light- emitting element, the plurality of openings comprise a first opening, a second opening, and a third opening, wherein an orthographic projection of the first opening on the base substrate overlaps an orthographic projection of the first power supply connection line on the base substrate, an orthographic projection of the second opening on the base substrate overlaps an orthographic projection of the reference voltage connection line on the base substrate, and an orthographic projection of the third opening on the base substrate overlaps an orthographic projection of the initialization connection line on the base substrate; and an area of the first opening is greater than an area of the third opening, the area of the third opening is greater than an area of the second opening, a width of the first power supply connection line is greater than a width of the initialization connection line, and the width of the initialization connection line is greater than a width of the reference voltage connection line.

20. A display device, comprising the display substrate according to claim 1.

* * * * *